(12) United States Patent
Kato et al.

(10) Patent No.: US 8,808,456 B2
(45) Date of Patent: Aug. 19, 2014

(54) FILM DEPOSITION APPARATUS AND SUBSTRATE PROCESS APPARATUS

(75) Inventors: Hitoshi Kato, Oshu (JP); Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 1294 days.

(21) Appl. No.: 12/539,642

(22) Filed: Aug. 12, 2009

(65) Prior Publication Data

US 2010/0050942 A1 Mar. 4, 2010

(30) Foreign Application Priority Data

Aug. 29, 2008 (JP) ................................. 2008-222738
Aug. 29, 2008 (JP) ................................. 2008-222747

(51) Int. Cl.
| C23C 16/455 | (2006.01) |
| H01L 21/677 | (2006.01) |
| C23C 16/40 | (2006.01) |
| H01L 21/67 | (2006.01) |

(52) U.S. Cl.
CPC ........ *C23C 16/401* (2013.01); *H01L 21/67703* (2013.01); *H01L 21/67161* (2013.01); *C23C 16/45502* (2013.01); *C23C 16/45508* (2013.01); *C23C 16/45551* (2013.01)
USPC ....................................................... 118/716

(58) Field of Classification Search
USPC ........................................................ 118/719
See application file for complete search history.

(56) References Cited

U.S. PATENT DOCUMENTS

| 5,338,362 A * | 8/1994 | Imahashi ...................... 118/719 |
| 5,445,699 A * | 8/1995 | Kamikawa et al. ......... 156/345.24 |
| 6,200,389 B1 * | 3/2001 | Miller et al. ................... 118/729 |
| 6,263,869 B1 * | 7/2001 | Abernethy ..................... 126/211 |
| 6,634,314 B2 | 10/2003 | Hwang et al. |
| 6,902,960 B2 * | 6/2005 | Joshi et al. ..................... 438/149 |
| 7,153,542 B2 | 12/2006 | Nguyen et al. |
| 7,186,315 B2 * | 3/2007 | Himori et al. ............. 156/345.47 |
| 7,537,662 B2 * | 5/2009 | Soininen et al. .............. 118/715 |
| 7,682,482 B2 * | 3/2010 | Yoshida et al. ........... 156/345.41 |
| 7,922,864 B2 * | 4/2011 | Harroun .................... 156/345.34 |
| 8,187,679 B2 * | 5/2012 | Dickey et al. ................. 427/569 |
| 2003/0194493 A1 * | 10/2003 | Chang et al. ................ 427/248.1 |
| 2004/0052972 A1 * | 3/2004 | Schmitt ......................... 427/569 |
| 2005/0084610 A1 * | 4/2005 | Selitser ....................... 427/248.1 |
| 2006/0177579 A1 * | 8/2006 | Shin et al. ................... 427/248.1 |
| 2006/0249077 A1 * | 11/2006 | Kim et al. ............... 118/723 MP |
| 2007/0218701 A1 | 9/2007 | Shimizu et al. |
| 2007/0218702 A1 | 9/2007 | Shimizu et al. |
| 2008/0096369 A1 | 4/2008 | Strzyzewski et al. |
| 2008/0241384 A1 * | 10/2008 | Jeong et al. .............. 427/255.29 |

FOREIGN PATENT DOCUMENTS

| DE | 10141084 A1 * | 11/2002 |
| JP | 04-287912 | 10/1992 |
| JP | 3144664 | 3/2001 |
| JP | 2001-254181 | 9/2001 |
| JP | 2007-247066 | 9/2007 |
| JP | 2008-066159 | 3/2008 |
| JP | 2008-509547 | 3/2008 |

* cited by examiner

*Primary Examiner* — Karla Moore
(74) *Attorney, Agent, or Firm* — IPUSA, PLLC

(57) ABSTRACT

A disclosed film deposition apparatus has a separation gas supplying nozzle between reaction gas nozzles arranged away from each other in a rotation direction of a turntable on which a substrate is placed, and a ceiling member providing a lower ceiling surface on both sides of the separation gas supplying nozzle. In this film deposition apparatus, the separation gas supplying nozzle and the reaction gas nozzles are removably arranged along a circumferential direction of a chamber, and the ceiling member is removably attached on a ceiling plate of the chamber.

25 Claims, 49 Drawing Sheets

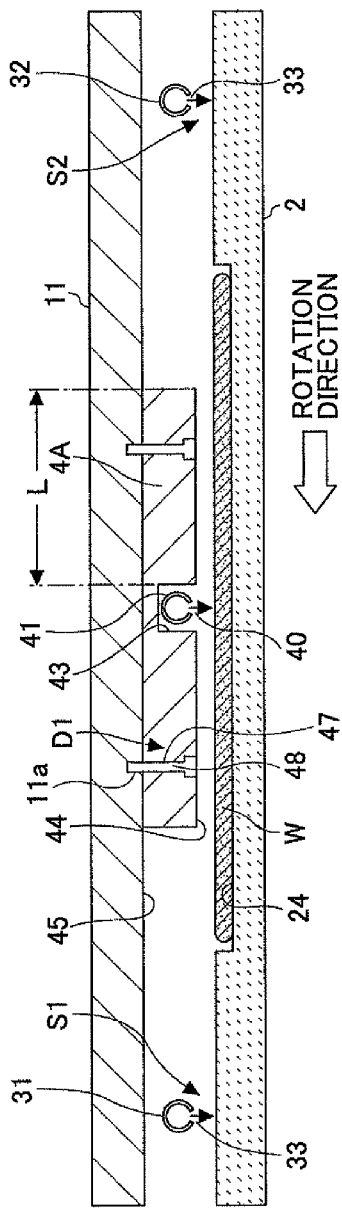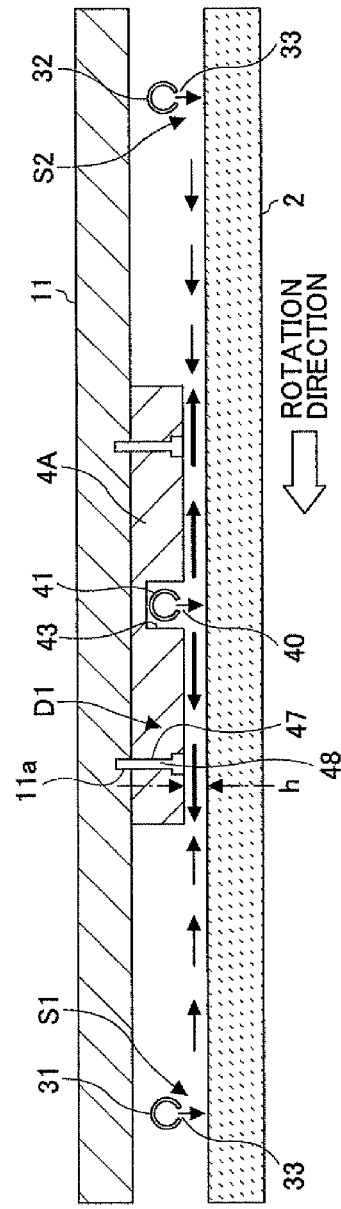

FILM DEPOSITION APPARATUS AND SUBSTRATE PROCESS APPARATUS

CROSS-REFERENCE TO RELATED APPLICATIONS

The present application is based on Japanese Patent Applications No. 2008-222738 and 2008-222747, filed with the Japanese Patent Office on Aug. 29, 2008, the entire contents of which are hereby incorporated herein by reference.

BACKGROUND OF THE INVENTION

1. Field of the Invention

The present invention relates to a film deposition apparatus and a substrate process apparatus for depositing a film on a substrate by carrying out plural cycles of supplying in turn at least two source gases to the substrate in order to form plural layers of a reaction product.

2. Description of the Related Art

As a film deposition technique in a semiconductor fabrication process, there has been known a so-called Atomic Layer Deposition (ALD) or Molecular Layer Deposition (MLD), in which a first reaction gas is adsorbed on a surface of a semiconductor wafer (referred to as a wafer hereinafter) and the like under vacuum and then a second reaction gas is adsorbed on the surface of the wafer in order to form one or more atomic or molecular layers through reaction of the first and the second reaction gases on the surface of the wafer, and such an alternating adsorption of the gases is repeated plural times, thereby depositing a film on the wafer. This technique is advantageous in that the film thickness can be controlled at higher accuracy by the number of times of alternately supplying the reaction gases, and in that the deposited film can have excellent uniformity over the wafer. Therefore, this deposition method is thought to be promising as a film deposition technique that can address further miniaturization of semiconductor devices.

Such a film deposition method may be preferably used, for example, for depositing a dielectric material to be used as a gate insulator. When silicon dioxide ($SiO_2$) is deposited as the gate insulator, a bis (tertiary-butylamino) silane (BTBAS) gas or the like is used as a first reaction gas (source gas) and ozone gas or the like is used as a second gas (oxidation gas), for example.

In order to carry out such a deposition method, a single-wafer deposition apparatus having a vacuum chamber and a shower head at a top center portion inside the vacuum chamber and a deposition method using such an apparatus has been under consideration. When such a deposition chamber is used, it takes a long time to purge the reaction gases with a purge gas, resulting in an extremely long process time because the number of cycles may reach several hundred. Therefore, a deposition method and an apparatus that enable high throughput are desired.

Under these circumstances, the inventors of the present invention have investigated an apparatus in which plural wafers are placed on a turntable in a vacuum chamber along a rotation direction of the turntable and a film deposition is carried out while the turntable is being rotated, in order to improve throughput. Regarding such an apparatus, the following configurations have been proposed.

Patent Document 1 discloses a deposition apparatus whose process chamber has a shape of a flattened cylinder. The process chamber is divided into two half circle areas. Each area has an evacuation port provided to surround the area at the top portion of the corresponding area. In addition, the process chamber has a gas inlet port that introduces separation gas between the two areas along a diameter of the process chamber. With these configurations, while different reaction gases are supplied into the corresponding areas and evacuated from above by the corresponding evacuation ports, a turntable is rotated so that the wafers placed on the turntable can alternately pass through the two areas.

In this deposition apparatus, because the reaction gases and the separation gas are supplied in a downward direction and evacuated from the evacuation ports in an upward direction, particles in the chamber are blown upward by the gas flowing in the upward direction and fall onto the wafers, thereby contaminating the wafers.

Patent Document 2 discloses a process chamber having a wafer support member (rotation table) that holds plural wafers and that is horizontally rotatable, first and second gas ejection nozzles that are located at equal angular intervals along the rotation direction of the wafer support member and oppose the wafer support member, and purge nozzles located between the first and the second gas ejection nozzles. In addition, a vacuum evacuation apparatus is connected to a portion between the outer edge of the wafer support member and the inner wall of the process chamber. According to a process chamber so configured, the purge gas nozzles discharge purge gases to create a gas curtain, thereby impeding the first reaction gas and the second reaction gas from being mixed.

However, the gas curtain cannot completely prevent reaction gases from being mixed with each other but may allow one of the reaction gases to flow through the gas curtain to be mixed with the other reaction gas partly because the gases flow along the rotation direction due to the rotation of the wafer support member. In addition, the first (second) reaction gas discharged from the first (second) gas outlet nozzle may flow through the center portion of the wafer support member to meet the second (first) gas, because centrifugal force is not strongly applied to the gases in a vicinity of the center of the rotating wafer support member. Once the reaction gases are mixed in the chamber, an MLD (or ALD) mode film deposition can no longer be carried out as expected.

Patent Document 3 discloses a process chamber that is divided into plural process areas along the circumferential direction by plural partitions. Below the partitions, a circular rotatable susceptor on which plural wafers are placed is provided leaving a slight gap in relation to the partitions. In addition, at least one of the process areas serves as an evacuation chamber. In such a process chamber, process gas introduced into one of the process areas may diffuse into the adjacent process area through the gap below the partition, and be mixed with another process gas introduced into the adjacent process area. Moreover, the process gases may be mixed in the evacuation chamber, so that the wafer is exposed to the two process gases at the same time. When this happens, ALD (or MLD) mode deposition cannot be carried out in a proper manner in this process chamber.

Moreover, Patent Document 4 discloses a process chamber having a circular gas supplying plate divided into eight sector areas, four gas inlet ports for $AsH_3$ gas, $H_2$ gas, trimethyl gallium (TMG) gas, and $H_2$ gas, respectively, the gas inlet ports being arranged at angular intervals of 90 degrees, evacuation ports that evacuate the process chamber and are located between the adjacent gas inlet ports, and a susceptor that holds plural wafers and is provided in order to oppose the gas supplying plate. However, Patent Document 4 does not provide any realistic measures to prevent two source gases ($AsH_3$, TMG) from being mixed. Because of the lack of such measures, the two source gases may be mixed around the center of the susceptor and through the $H_2$ gas inlet ports. Moreover, because the evacuation ports are located between the adjacent two gas inlet ports to evacuate the gases upward, particles are blown upward from the susceptor surface, which leads to wafer contamination.

Patent Document 5 discloses a process chamber having a circular plate that is divided into four quarters by partition walls and has four susceptors respectively provided in the four quarters, four injector pipes connected into a cross shape, and two evacuation ports located near the corresponding susceptors. In this process chamber, four wafers are mounted in the corresponding four susceptors, and the four injector pipes rotate around the center of the cross shape above the circular plate while ejecting a source gas, a purge gas, a reaction gas, and another purge gas, respectively. In such a process chamber, after one of the injector pipes passes over one of the quarters, this quarter cannot be purged by the purge gas in a short period of time. In addition, the reaction gas in one of the quarters can easily flow into an adjacent quarter. Therefore, it is difficult to perform an MLD (or ALD) mode film deposition.

Furthermore, Patent Document 6 (Patent Documents 7, 8) discloses a film deposition apparatus preferably used for an Atomic Layer CVD method that causes plural gases to be alternately adsorbed on a target (a wafer). In the apparatus, a susceptor that holds the wafer is rotated, while source gases and purge gases are supplied to the susceptor from above. Paragraphs 0023 through 0025 of the document describe partition walls that extend in a radial direction from a center of a chamber, and gas ejection holes that are formed in a bottom of the partition walls in order to supply the source gases or the purge gas to the susceptor, so that an inert gas as the purge gas ejected from the gas ejection holes produces a gas curtain. Regarding evacuation of the gases, paragraph 0058 of the document describes that the source gases are evacuated through an evacuation channel 30a, and the purge gases are evacuated through an evacuation channel 30b. With such a configuration, the source gases can flow into a purge gas compartment from source gas compartments located in both sides of the purge gas compartment and be mixed with each other in the purge gas compartment. As a result, a reaction product is generated in the purge gas compartment, which may cause particles to fall onto the wafer.

In the above configurations where plural wafers are placed on the turntable and the film deposition is carried out while rotating the turntable, there may be a problem in that it is difficult to control an adsorption time of the reaction gases and/or an oxidation time of the oxidation gas, while a relatively high throughput is kept. An appropriate adsorption time may vary depending on the reaction gases because some reaction gases are easily adsorbed and the others are not easily adsorbed on the wafer surface. In addition, an appropriate oxidation may vary depending on the oxidation gases because of variations in the oxidizing power. Moreover, the appropriate adsorption time and/or the oxidation time are different because of process conditions even when the same reaction gas (or oxidation gas) is used. Furthermore, not only two reaction gases but also three reaction gases may be used in some process of the ALD or MLD mode film deposition.

Under such circumstances, it may be convenient for the user of the ALD (MLD) film deposition apparatus to arbitrarily configure one apparatus in various ways depending on the reaction gases to be used, or in order to control the adsorption time of the reaction gases and/or oxidation gases. Therefore, an ALD (MLD) film deposition apparatus is desired that can offer a higher degree of freedom in designing in order to modify the apparatus depending on the processes. Unfortunately, the related art apparatus proposed in Patent Documents 1 through 5 can offer only a limited degree of freedom in changing the number of the reaction gases to be supplied into the chamber and controlling the adsorption time of the reaction gases, which in turn limits types of processes to be carried out in the apparatus.

Patent Document 1: U.S. Pat. No. 7,153,542 (FIGS. 6A, 6B)
Patent Document 2: Japanese Patent Application Laid-Open Publication No. 2001-254181 (FIGS. 1, 2)
Patent Document 3: Japanese Patent Publication No. 3,144,664 (FIGS. 1, 2, claim 1)
Patent Document 4: Japanese Patent Application Laid-Open Publication No. H4-287912
Patent Document 5: U.S. Pat. No. 6,634,314
Patent Document 6: Japanese Patent Application Laid-Open Publication No. 2007-247066 (paragraphs 0023 through 0025, 0058, FIGS. 12 and 13)
Patent Document 7: U.S. Patent Publication No. 2007-218701
Patent Document 8: U.S. Patent Publication No. 2007-218702

SUMMARY OF THE INVENTION

The present invention has been made in view of the above, and provides a film deposition apparatus and a substrate process apparatus that enable film deposition with high production throughput when carrying out plural cycles of supplying in turn plural source gases to the substrate in order to form plural layers of a reaction product and thus deposit a film on the substrate, because the plural substrates are arranged in a rotation direction of a turntable and alternately exposed to the source gases by rotating the turntable.

A first aspect of the present invention provides a film deposition apparatus for depositing a film on a substrate by carrying out plural times of cycles of supplying in turn at least two kinds of reaction gases that react with each other to the substrate to produce a layer of a reaction product in a chamber. The film deposition apparatus comprising:

a turntable provided rotatable on a vertical axis in the chamber and including plural substrate receiving areas in which the plural substrates are placed along a rotation direction of the turntable;

at least two reaction gas supplying portions configured to supply corresponding reaction gases to a surface having the substrate receiving areas in the turntable and arranged away from each other in the rotation direction of the turntable in the chamber;

a separation gas supplying portion provided in the chamber in order to supply a first separation gas to an area through which the substrates pass between a first process area where one of the reaction gases is supplied and a second process area where another one of the reaction gases is supplied, thereby creating a separation area that separates atmospheres of the first process areas and the second process areas;

a ceiling member removably provided between the turntable and a ceiling plate of the chamber in order to create over the turntable a thin space through which the first separation gas flows toward the first process area and/or the second process area from the separation gas supplying portion, the ceiling member being selectable in accordance with a process to be carried out in the film deposition apparatus from the plural of the ceiling members having different shapes;

a center area located in substantially a center portion in the chamber and including a gas ejection opening for ejecting a second separation gas to the surface having the wafer receiving areas in the turntable, thereby separating the atmospheres of the first and the second process areas; and an evacuation port that evacuates the reaction gases along with the first separation gas that spreads on both sides of the separation area and the second separation gas ejected from the center area.

A second aspect of the present invention provides a film deposition apparatus for depositing a film on a substrate by carrying out plural cycles of supplying in turn at least two kinds of reaction gases that react with each other to the substrate to produce a layer of a reaction product in a chamber. The film deposition apparatus comprising:

a turntable provided rotatable on a vertical axis in the chamber and including plural substrate receiving areas in which the plural substrates are placed along a rotation direction of the turntable;

at least two reaction gas supplying portions removably provided to the chamber in order to supply corresponding reaction gases to a surface having the substrate receiving areas in the turntable;

plural reaction gas mounting portions provided along a circumferential direction in the chamber so that the at least two reaction gas nozzles may be mounted to at least two selected ones of the plural reaction gas mounting portions in accordance with a process to be carried out in the film deposition apparatus;

a separation gas supplying portion provided in the chamber in order to supply a first separation gas to an area through which the substrates pass between a first process area where one of the reaction gases is supplied and a second process area where another one of the reaction gases is supplied, thereby creating a separation area that separates atmospheres of the first process areas and the second process areas;

a ceiling member provided in order to oppose the turntable on both sides of the separation gas supplying portion relative to the rotation direction of the turntable, thereby creating over the turntable a thin space through which the first separation gas flows toward the first process area and/or the second process area from the separation gas supplying portion, a center area located in substantially a center portion in the chamber in order to separate the atmospheres of the first and the second process areas and including a gas ejection opening for ejecting a second separation gas to the surface having the substrate receiving areas in the turntable; and an evacuation port that evacuates the reaction gases along with the first separation gas that spreads on both sides of the separation area and the second separation gas ejected from the center area, wherein the reaction gas nozzles are attached to the chamber via the selected reaction gas nozzle mounting portions so that the separation gas supplying portions are located upstream and downstream relative to the rotation direction of the turntable with respect to the reaction gas nozzles.

A third aspect of the present invention provides a film deposition apparatus for depositing a film on a substrate by carrying out plural cycles of supplying in turn at least two kinds of reaction gases that react with each other to the substrate to produce a layer of a reaction product in a chamber. The film deposition apparatus comprising:

a turntable provided rotatable on a vertical axis in the chamber and including plural substrate receiving areas in which the plural substrates are placed along a rotation direction of the turntable;

a first reaction gas supplying portion configured to supply a first reaction gas to a surface of the turntable, the surface having the substrate receiving area;

a second reaction gas supplying portion configured to supply a second reaction gas to the surface, the second reaction gas supplying portion being arranged away from the first reaction gas supplying portion along a circumferential direction of the turntable;

a separation area located between a first process area where the first reaction gas is supplied and a second process area where the second reaction gas is supplied along the rotation direction of the turntable in order to separate atmospheres of the first process areas and the second process areas;

a center area located in substantially a center portion in the chamber and including a gas ejection opening for ejecting a first separation gas to the surface having the wafer receiving areas in the turntable, thereby separating the atmospheres of the first and the second process areas; and a first evacuation port for substantially exclusively evacuating the first reaction gas along with the first separation gas ejected from the center area and the second separation gas spreading on both sides of the separation area;

a second evacuation port for substantially exclusively evacuating the second reaction gas along with the first separation gas ejected from the center area and the second separation gas spreading on both sides of the separation area;

wherein the separation area includes:

a separation gas supplying portion configured to supply the second separation gas, a ceiling surface that is located on both sides of the separation gas supplying portion and creates over the turntable a thin space through which the first separation gas flows toward the first process area and/or the second process area from the separation gas supplying portion, and a protrusion wall portion that is replaceably provided to the chamber so that the protrusion wall portion protrudes from an inner circumferential surface of the chamber in order to impede the first and/or the second reaction gases from entering between an outer circumferential edge of the turntable and the inner circumferential surface of the chamber, wherein at least one of a length along a circumferential direction of the protrusion wall portion and a position where the protrusion wall portion is arranged is determined in accordance with a process to be carried out in the film deposition apparatus.

BRIEF DESCRIPTION OF THE DRAWINGS

FIG. 4A is a developed cross-sectional view showing a separation area and process areas in the film deposition apparatus of FIG. 1;

FIG. 4B is another developed cross-sectional view showing a separation area and process areas in the film deposition apparatus of FIG. 1;

DETAILED DESCRIPTION OF THE PREFERRED EMBODIMENT

Figure 1:
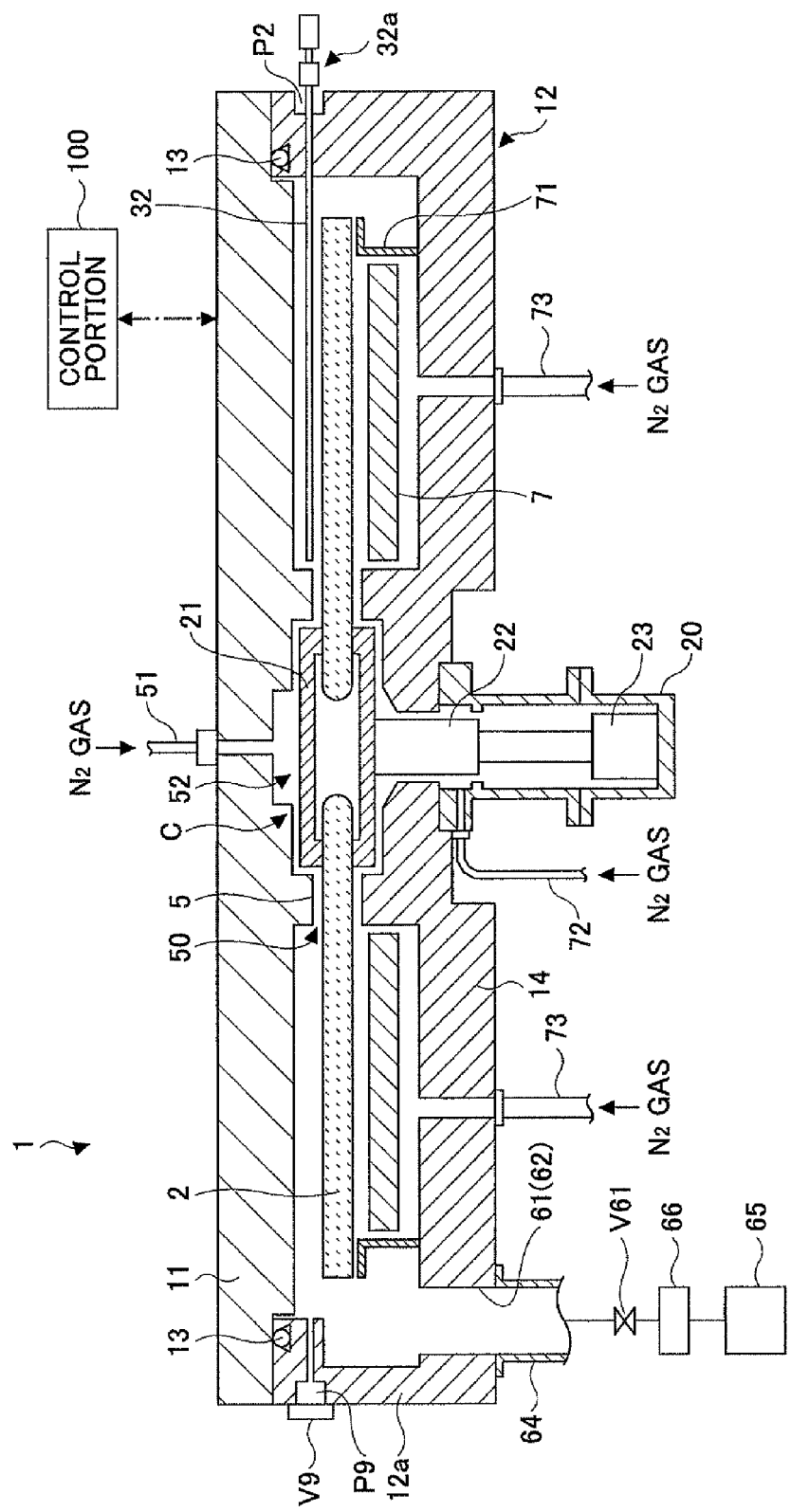
FIG. 1 is a cut-away diagram taken along I-I' line in FIG. 3, showing a film deposition apparatus according to a first embodiment of the present invention.

According to an embodiment of the present invention, when carrying out plural cycles of supplying in turn plural source gases to the substrate in order to form plural layers of a reaction product, thereby depositing a film, film deposition can be carried out with high production throughput because the plural substrates are arranged in a rotation direction of a turntable and alternately exposed to the source gases by rotating the turntable.

In addition, because a reaction gas nozzle and a ceiling member can be removably attached to a vacuum chamber, a ceiling member having a shape appropriately selected in accordance with a process to be carried out can be used, and the reaction gas nozzle can be attached in an appropriate position in accordance with a process to be carried out. With this, a shape of a process area and thus a gas adsorption time of the reaction gases can be controlled in the same vacuum chamber. Moreover, because not only the reaction gas nozzle and the ceiling member but also a separation gas nozzle is replaceable, the vacuum chamber can be easily modified in response to an increase in the number of the reaction gases. In such a manner, various processes can be carried out in order to deposit various films under various process conditions, thereby improving a degree of freedom to modify the same vacuum chamber.

Non-limiting, exemplary embodiments of the present invention will now be described with reference to the accompanying drawings. In the drawings, the same or corresponding reference marks are given to the same or corresponding members or components. It is noted that the drawings are illustrative of the invention, and there is no intention to indicate scale or relative proportions among the members or components. Therefore, the specific size should be determined by a person having ordinary skill in the art in view of the following non-limiting embodiments.

First Embodiment

Figure 3:
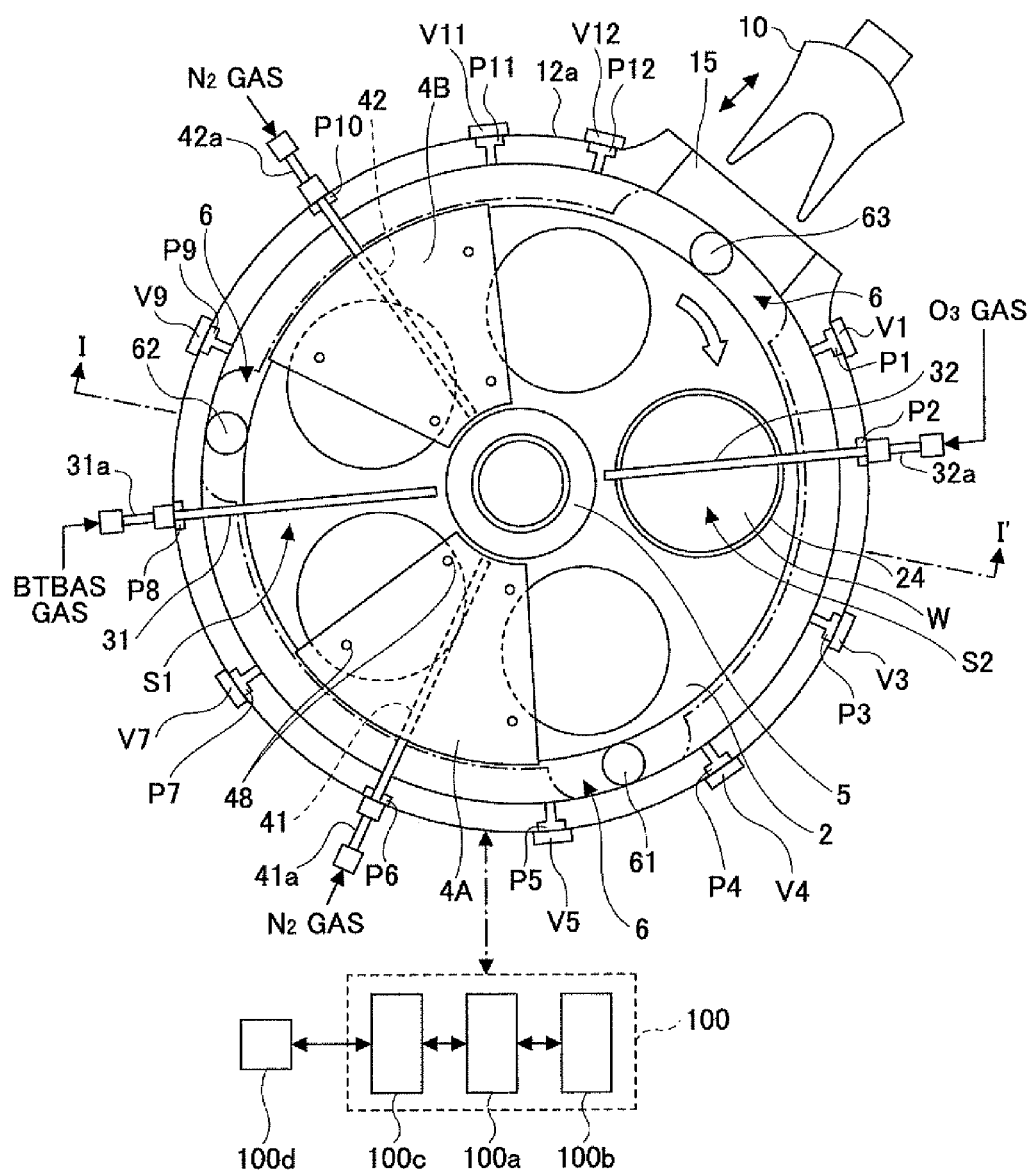
FIG. 3 is a plan view of the film deposition apparatus of FIG. 1.

As shown in FIG. 1 (a cut-away diagram taken along I-I' line in FIG. 3) through FIG. 3, a film deposition apparatus according to an embodiment of the present invention includes a vacuum chamber 1 having substantially a shape of a flattened cylinder, and a turntable 2 that is located inside the vacuum chamber 1 and has a rotation center at a center of the vacuum chamber 1. The vacuum chamber 1 is composed of a ceiling plate 11 and a chamber body 12 and, the ceiling body 11 can be separated from a chamber body 12. The ceiling plate 11 is pressed onto the chamber body 12 via a ceiling member such as an O ring 13 when the inside of the vacuum chamber is maintained at a reduced pressure, according to which the vacuum chamber 1 is assuredly hermetically sealed. On the other hand, the ceiling plate 11 can be raised by a driving mechanism (not shown) when the ceiling plate 11 has to be removed from the chamber body 12. The ceiling plate 11 and the chamber body 12 may be made of aluminum, for example.

The turntable 2 is fixed onto a cylindrically shaped core portion 21 at substantially the center of the vacuum chamber 1. The core portion 21 is fixed on a top end of a rotational shaft 22 that extends in a vertical direction. The rotational shaft 22 penetrates a bottom portion 14 of the chamber body 12 and is fixed at the lower end to a driving mechanism 23 that can rotate the rotational shaft 22 clockwise, in this embodiment. The rotational shaft 22 and the driving mechanism 23 are housed in a case body 20 having a cylinder with a bottom. The case body 20 has a flanged pipe portion 20a at the top and is hermetically fixed to a bottom surface of the bottom portion 14 via the flanged pipe portion 20a.

Figure 2:
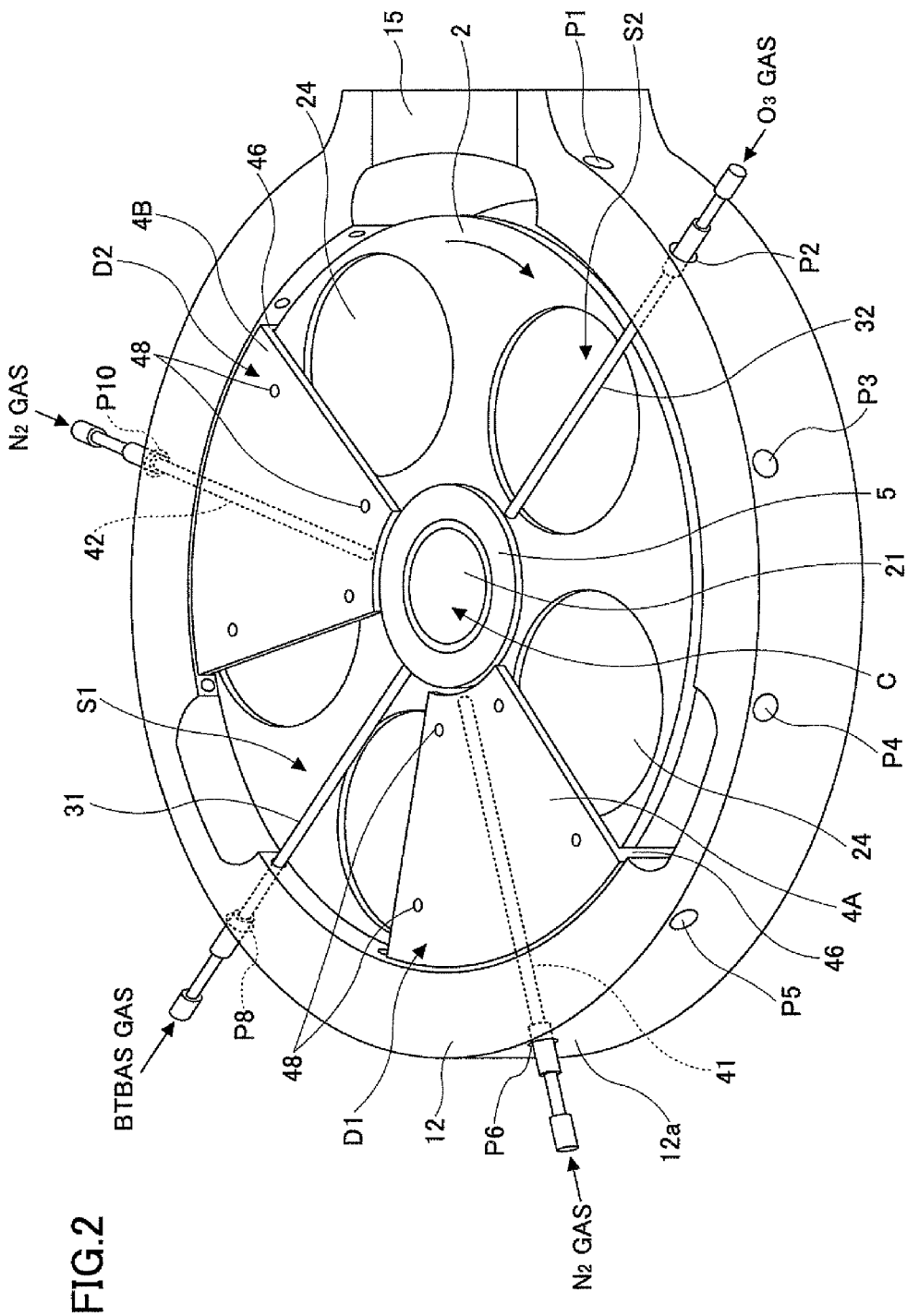
FIG. 2 is a perspective view of the film deposition apparatus of FIG. 1.

As shown in FIGS. 2 and 3, plural (for example, five) circular concave portions 24, which are substrate receiving area in which corresponding wafers W are placed, are formed along the rotation direction (circumferential direction) in a upper surface of the turntable 2. For simplicity of illustration, only one wafer W is illustrated in FIG. 3. FIGS. 4A and 4B are a projected cross-sectional diagram taken along a circle concentric to the turntable 2. As shown, the concave portion 24 has a diameter slightly larger than the diameter of the wafer W, for example, by about 4 mm and a depth substantially equal to a thickness of the wafer W. When the wafer W is placed in the concave portion 24, elevation differences between surfaces of the wafer W and an area of the turntable 2, the area excluding the concave portions 24, becomes substantially zero. If there is a relatively large step between the area and the wafer W, gas flow turbulence is caused by the step, which may affect thickness uniformity across the wafer W. Therefore, it is preferable to make the elevation difference substantially zero in order to improve an across-wafer uniformity of a film thickness. While "to make the elevation difference substantially zero" may mean here that a height difference is less than or equal to about 5 mm, the difference has to be as close to zero as possible to the extent allowed by machining accuracy. In the bottom of the concave portion 24, there are formed three through holes (not shown) through which three corresponding elevation pins (see FIG. 8) are raised/lowered. The elevation pins support a back surface of the wafer W and raise/lower the wafer W.

The concave portions 24 are wafer W receiving areas provided to position the wafers W and prevent the wafers W from being thrown out by centrifugal force caused by rotation of the turntable 2. However, the wafer W receiving areas are not limited to the concave portions 24, but may be performed by guide members located at predetermined angular intervals on the turntable 2 to hold the edges of the wafers W. For example, the wafer W receiving areas may be performed by electrostatic chucks.

Figure 5:
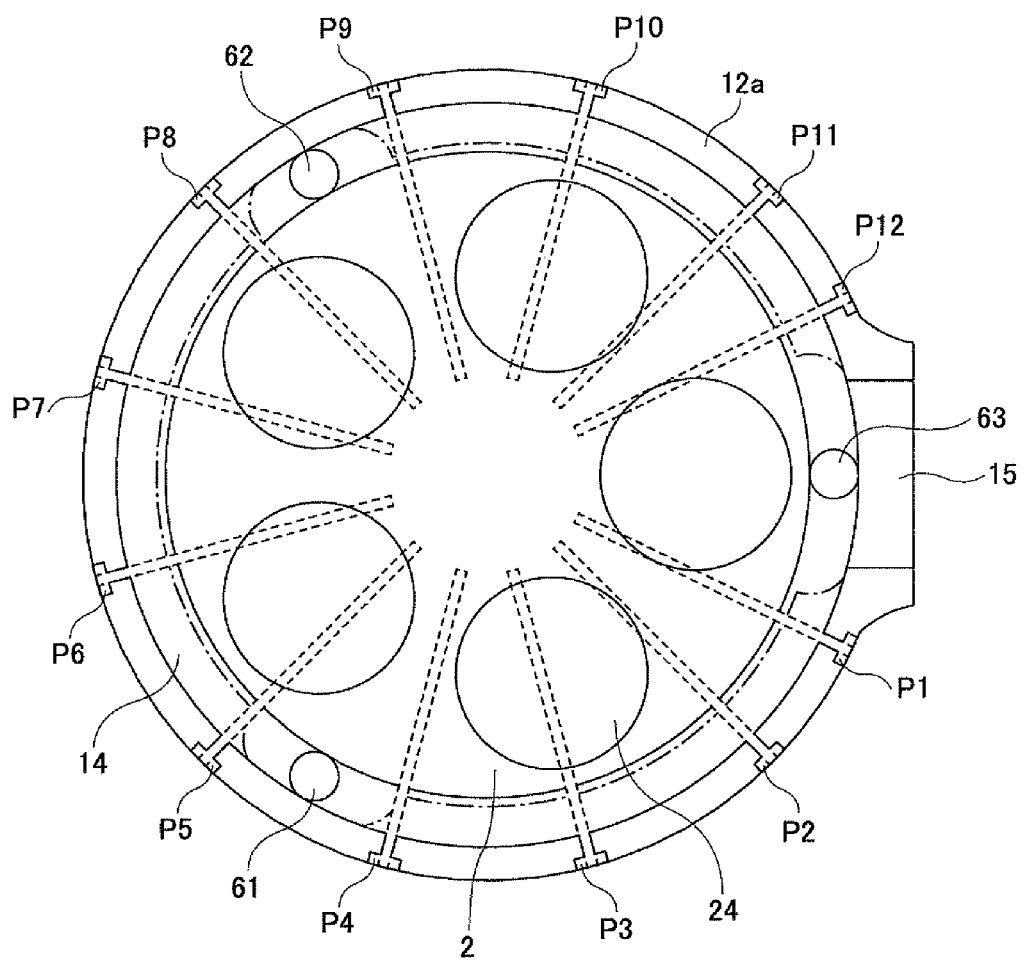
FIG. 5 is a plan view of the film deposition apparatus of FIG. 1.

Referring to FIGS. 2 and 3, the vacuum chamber 1 includes a first reaction gas nozzle 31, a second reaction gas nozzle 32, and separation gas nozzles 41, 42 above the turntable 2, all of which extend in radial directions and at predetermined angular intervals at a circumferential direction of the vacuum chamber 1 (rotation direction of the turntable 2). With this configuration, the concave portions 24 can move through and below the nozzles 31, 32, 41, and 42, when the turntable 2 is rotated. The reaction gas nozzles 31, 32 and the separation gas nozzles 41, 42 are removably attached in a side wall of the vacuum chamber 1. As shown in FIGS. 2, 3, and 5, plural mounting holes P1 are formed at predetermined angular intervals along the circumferential direction in a circumferential wall 12a of the chamber body 12. The mounting holes P1 through P12 serve as reaction gas nozzle mounting portions and separation gas nozzle mounting portions through which the reaction gas nozzles 31, 32 and the separation gas nozzles 41, 42 are inserted into the vacuum chamber 1. Namely, the reaction gas nozzles 31, 32 and the separation gas nozzles 41, 42 are attached to the chamber body 12 so that the nozzles 31, 32, 41, 42 penetrate the circumferential wall 12a through the corresponding mounting holes P1 through P12. In this embodiment, the mounting holes P1 through P12 are used in common as the reaction gas nozzle mounting portions and the separation gas nozzle mounting portions.

The reaction gas nozzles 31, 32 and the separation gas nozzles 41, 42 penetrate the corresponding mounting holes selected from the mounting holes P1 through P12 in accordance with a process to be carried out, so that distal ends of the nozzles 31, 32, 41, 42 are positioned near the center portion of the vacuum chamber 1 and gas inlet ports, which are base ends of the nozzles 31, 32, 41, 42, are located outside of the circumferential wall 12a of the chamber body 12. In the illustrated examples, the first reaction gas nozzle 31 is attached to the vacuum chamber 1 via the mounting hole P8; the second gas nozzle 32 is attached to the vacuum chamber 1 via the mounting hole P2; the first separation gas nozzle 41 is attached to the vacuum chamber 1 via the mounting hole P6; and the second separation gas nozzle 42 is attached to the vacuum chamber 1 via the mounting hole P10. While the gas nozzles 31, 32, 41, 42 are hermetically attached to the vacuum chamber 1 via the corresponding mounting holes P8, P2, P6, P10, the other mounting holes P1, P3, P5, P7, P9, P11, P12 are closed with corresponding valves V1, V3, V5, V7, V9, V11, V12, so that the vacuum chamber 1 may be kept hermetically sealed.

The first reaction gas nozzle 31 and the second reaction gas nozzle 32 are connected to a gas supplying source (not shown) of bis (tertiary-butylamino) silane (BTBAS), which is a first source gas, and a gas supplying source (not shown) of $O_3$ (ozone) gas, which is a second source gas, respectively. The separation gas nozzles 41, 42 are connected to a gas supplying source 43 (not shown) of $N_2$ (nitrogen) gas, which is a separation gas. In the illustrated example, the second reaction gas nozzle 32, the separation gas nozzle 41, the first reaction gas nozzle 31, and the separation gas nozzle 42 are arranged clockwise in this order.

As shown in FIGS. 4A and 4B, the reaction gas nozzles 31, 32 have plural ejection holes 33 to eject the corresponding source gases downward, and the plural ejection holes 33 are arranged at predetermined intervals in longitudinal directions of the reaction gas nozzles 31, 32. The separation gas nozzles 41, 42 have plural ejection holes 40 to eject the separation gases downward, and the plural ejection holes 40 are arranged at predetermined intervals in longitudinal directions of the separation gas nozzles 41, 42. An area below the reaction gas nozzle 31 is a first process area P1 in which the BTBAS gas is adsorbed on the wafer W, and an area below the reaction gas nozzle 32 is a second process area P2 in which the $O_3$ gas is adsorbed on the wafer W.

On the other hand, the separation gas nozzles 41, 42 form separation areas D (D1, D2) that separate the first process area P1 and the second process area P2. As shown in FIGS. 2 through 4, the ceiling plate 11 of the vacuum chamber 1 is provided at areas corresponding to the separation areas D with removably-provided ceiling members 4 (4A, 4B). Specifically, a first ceiling member 4A is provided in a first the separation area D1 including the first separation gas nozzle 41, and a second ceiling member 4B is provided in a second separation area D2 including the second separation gas nozzle 42. A size of the ceiling members 4 (4A, 4B) and the height h (see FIG. 4B) of the lower surface (a first ceiling surface 44) of the ceiling member 4 (4A, 4B) from the turntable 2 may be determined in accordance with process conditions such as the reaction gases to be used, the separation gas to be used, a flow rate of the reaction gases, a process temperature, a process pressure, and the rotation speed of the turntable 2 and the like, through experimentation.

The ceiling member 4 in this embodiment has a top view shape of a sector whose apex lies at substantially the center of the chamber 1 and whose arced periphery lies near and along the inner circumferential surface of the chamber body 12. In addition, the ceiling member 4 has a groove portion 43 that extends in the radial direction, and the separation gas nozzle 41 (42) is housed in the groove portion 43. While the groove portion 43 is formed so that the groove portion 43 substantially bisects the ceiling member 4 in this embodiment, the groove portion 43 may be formed so that an upstream side of the ceiling member 4 relative to the rotation direction of the turntable 2 is wider, in other embodiments.

With the above configuration, flat low ceiling surfaces 44 (first ceiling surfaces), which are the lower surface of the ceiling member 4, are formed on both sides of the ceiling member 4, and higher ceiling surfaces 45 (second ceiling surfaces) higher than the lower ceiling surfaces 44 are formed in outer sides of the lower ceiling surfaces 44 along the circumferential directions. The ceiling members 4A, 4B form a separation space, which is a thin space, in order to impede the first reaction gas and the second reaction gas from entering the thin space between the ceiling members 4A, 4B and the turntable 2 and from being mixed.

In addition, the separation gas nozzle 41 ejects the separation gas to impede the $O_3$ gas and the BTBAS gas from entering between the ceiling member 4A and the turntable 2 from the upstream side and the downstream side of the rotation direction, respectively. "The gases being impeded from entering" means that the $N_2$ gas as the separation gas ejected from the separation gas nozzle 41 spreads between the first ceiling surfaces 44 and the upper surface of the turntable 2 and flows out to spaces below the second ceiling surfaces 45, which are adjacent to the corresponding first ceiling surfaces 44 in the illustrated example, so that the reaction gases cannot enter the separation space from the space below the second ceiling surfaces 45. "The gases cannot enter the separation space" means not only that the gas are completely prevented from entering the separation space, but also that the gases cannot proceed farther toward the separation gas nozzle 41 and thus be mixed with each other even when a fraction of the reaction gases enter the separation space. Namely, as long as such effect is demonstrated, the separation area D is to separate atmospheres of the first process area P1 and the second process area P2. A degree of "thin" of the thin space may be determined so that the effect of "the gases cannot enter the separation space" is demonstrated by a pressure difference caused between the thin space (the space below the ceiling member 4) and the adjacent areas (the areas below the second ceiling surfaces 45), and the specific height h of the thin space may be different depending on an area of the ceiling member 4 (the lower ceiling surfaces 44). The BTBAS gas or the $O_3$ gas adsorbed on the wafer W can pass through and below the ceiling member 4. Therefore, the gases in "the gases being impeded from entering" mean the gases in a gaseous phase.

On the other hand, a ring-shaped protrusion portion 5 is provided on the lower surface of the ceiling plate 11 so that the inner circumference surface of the protrusion portion 5 leaves a small ring-shaped gap with respect to the outer circumference surface of the core portion 21. The protrusion portion 5 opposes the turntable 2 in an outer area of the core portion 21. In addition, a lower surface of the protrusion portion 5 and a lower surface of the ceiling member 4 form one plane surface. In other words, a height of the lower surface of the protrusion portion 5 from the turntable 2 is the same as a height h of the lower surface of the ceiling member 4 (first ceiling surfaces). The ceiling member 4 is formed not integrally with but separately from the protrusion portion 5 in other embodiments. FIGS. 2 and 3 show the inner configuration of the vacuum chamber 1 whose ceiling plate 11 is removed while the protrusion portions 5 remain inside the vacuum chamber 1.

Figure 6:
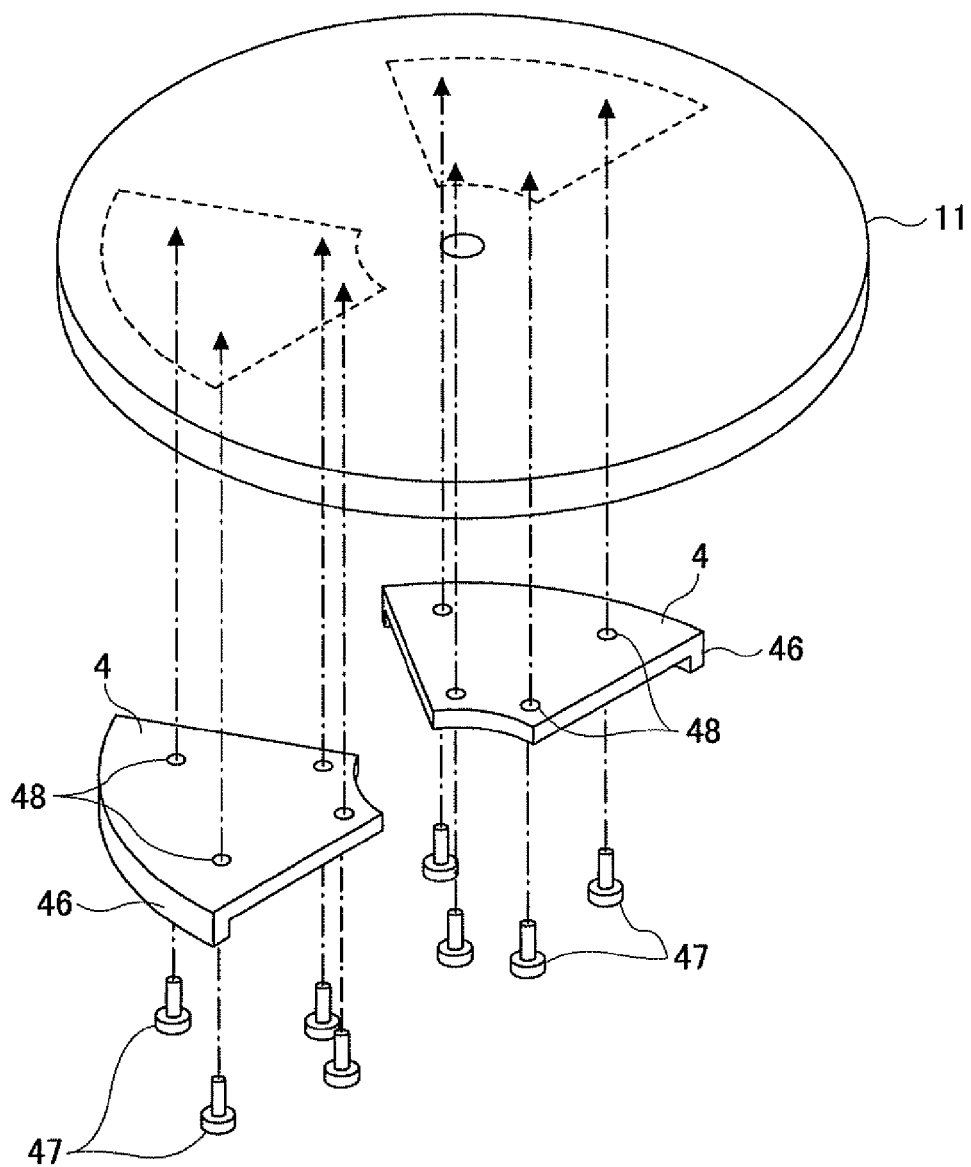
FIG. 6 is a partial perspective view showing the film deposition apparatus of FIG. 1.
Figure 7:
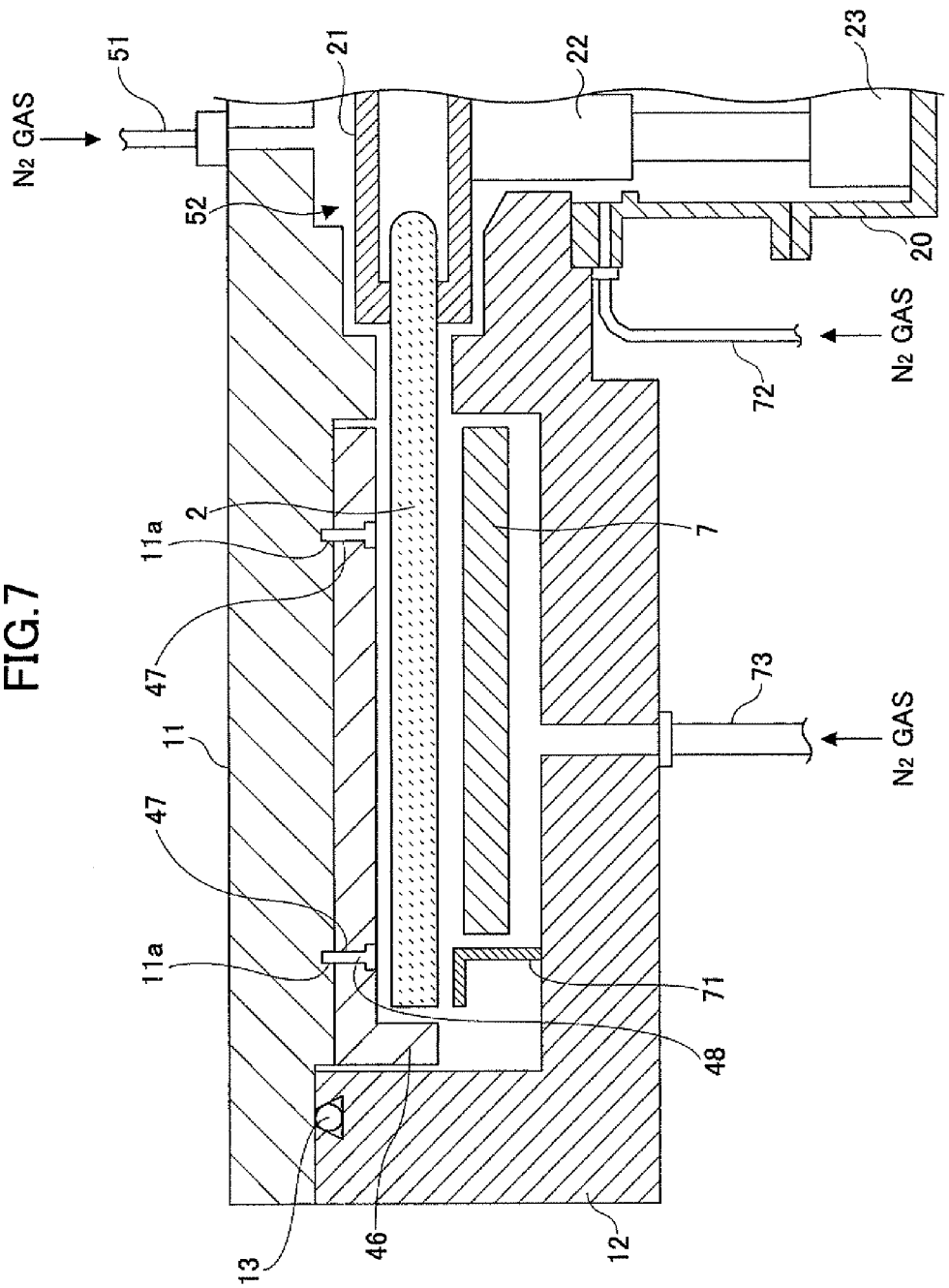
FIG. 7 is a partial cut-away diagram showing the film deposition apparatus of FIG. 1.

As described above, the vacuum chamber 1 is provided with the first ceiling surfaces 44 and the second ceiling surfaces 45 higher than the first ceiling surfaces 44, which are alternately arranged in the circumferential direction. FIG. 7 shows a cross section of a portion of the vacuum chamber 1 where the lower ceiling surface 44 is formed. As shown in FIGS. 2, 6 and 7, the ceiling member 4 has a bent portion 46 that bends in an L-shape at the outer circumferential edge of the ceiling member 4. Because the ceiling member 4 is attached on the ceiling plate 11 and the ceiling plate 11 can be removed from the chamber body 12, there is a small gap between the outer circumferential surface of the bent portion 46 and the inner circumferential surface of chamber body 12. The bent portion 46 impedes the reaction gases from entering from both sides of the bent portion 46 and from being mixed with each other, in the same manner as the ceiling member 4. The gaps between the bent portion 46 and the turntable 2 and between the bent portion 46 and the chamber body 12 may be the same as the height h of the ceiling surface 44 from the turntable 2. In the illustrated example, an inner side wall facing the outer circumferential surface of the turntable 2 serves as the inner circumferential surface of the vacuum chamber 1.

The ceiling member 4 has the sector shape portion and the bent portion 46 integrally coupled to the sector shape portion, as described above, and is made of, for example, aluminum (Al). In addition, the ceiling member 4 is removably attached on the lower surface of the ceiling plate 11 by screws 47, as shown in FIGS. 4 and 6. Specifically, plural screw holes 48 are formed in order to vertically penetrate through the sector shape portion of the ceiling member 4, and threaded bores 11a corresponding to the screw holes 48 are formed in the lower surface side of the ceiling plate 11.

In this embodiment, the separation gas nozzles 41, 42 are attached in the corresponding mounting holes selected from the mounting holes P1 through P12 in the circumferential wall of the chamber body 12, and thus the ceiling members 4 (4A, 4B) are attached in positions corresponding to the separation gas nozzles 41, 42 so that the separation gas nozzles 41, 42 are housed in the corresponding groove portions 43. In order to allow the ceiling members 4 (4A, 4B) to be differently positioned in accordance with the separation gas nozzles 41, 42, the threaded holes 48 are formed in positions where the ceiling members 4 are expected to be attached.

There are three evacuation ports 61, 62, 63 are provided at equal angular intervals along the circumferential direction in the bottom portion 14 of the chamber body 12, as shown in FIGS. 1 and 3. Areas where the evacuation ports 61, 62, 63 are provided are referred to as evacuation areas 6 below. In the evacuation areas 6, the inner circumferential surface of the chamber body 12 is dented outward from a height corresponding to the outer circumferential surface of the turntable 2 down through the bottom portion 14 of the chamber body 12. In areas other than the evacuation areas 6, the inner circumferential surface of the chamber body 12 is close to and stands upright along the outer circumferential surface of the bent portion 46, as shown in FIGS. 1 and 7. In FIG. 3, the inner circumferential surface of the chamber body 12 is illustrated with a dashed line.

The evacuation ports 61, 62, 63 are connected to a vacuum pump 65 provided in common as an evacuation port via corresponding evacuation pipes 63 that can be opened/closed by corresponding on-off valves V61 through V63 (only the valve V61 is shown for simplicity purposes). By selectively opening the on-off valves V61, V62, V63, the evacuation ports to be used can be selected. Reference numeral "66" in FIG. 1 is a pressure control unit provided in a predetermined position of the evacuation pipe 63. Plural pressure control units 66 may be provided to the corresponding evacuation ports 61, 62, 63. Alternatively, one pressure control unit 66 may be used in common for the three evacuation ports 61, 62, 63. In addition, four or more evacuation ports may be provided.

While the evacuation ports 61, 62, 63 are located below the turntable 2 to evacuate the vacuum chamber 1 through an area between the inner circumferential surface of the chamber body 12 and the outer circumferential surface of the turntable 2 in the illustrated example, the evacuation ports may be located in the circumferential side wall of the chamber body 12. In addition, when the evacuation ports 61, 62, 63 are provided in the circumferential side wall of the chamber body 12, the evacuation ports 61, 62, 63 may be located higher than the turntable 2. In this case, the gases flow along the upper surface of the turntable 2 into the evacuation ports 61, 62, 63 located higher than the turntable 2. Therefore, it is advantageous in that particles in the vacuum chamber 1 are not blown upward by the gases, compared to when the evacuation ports are provided, for example, in the ceiling plate 11.

Figure 8:
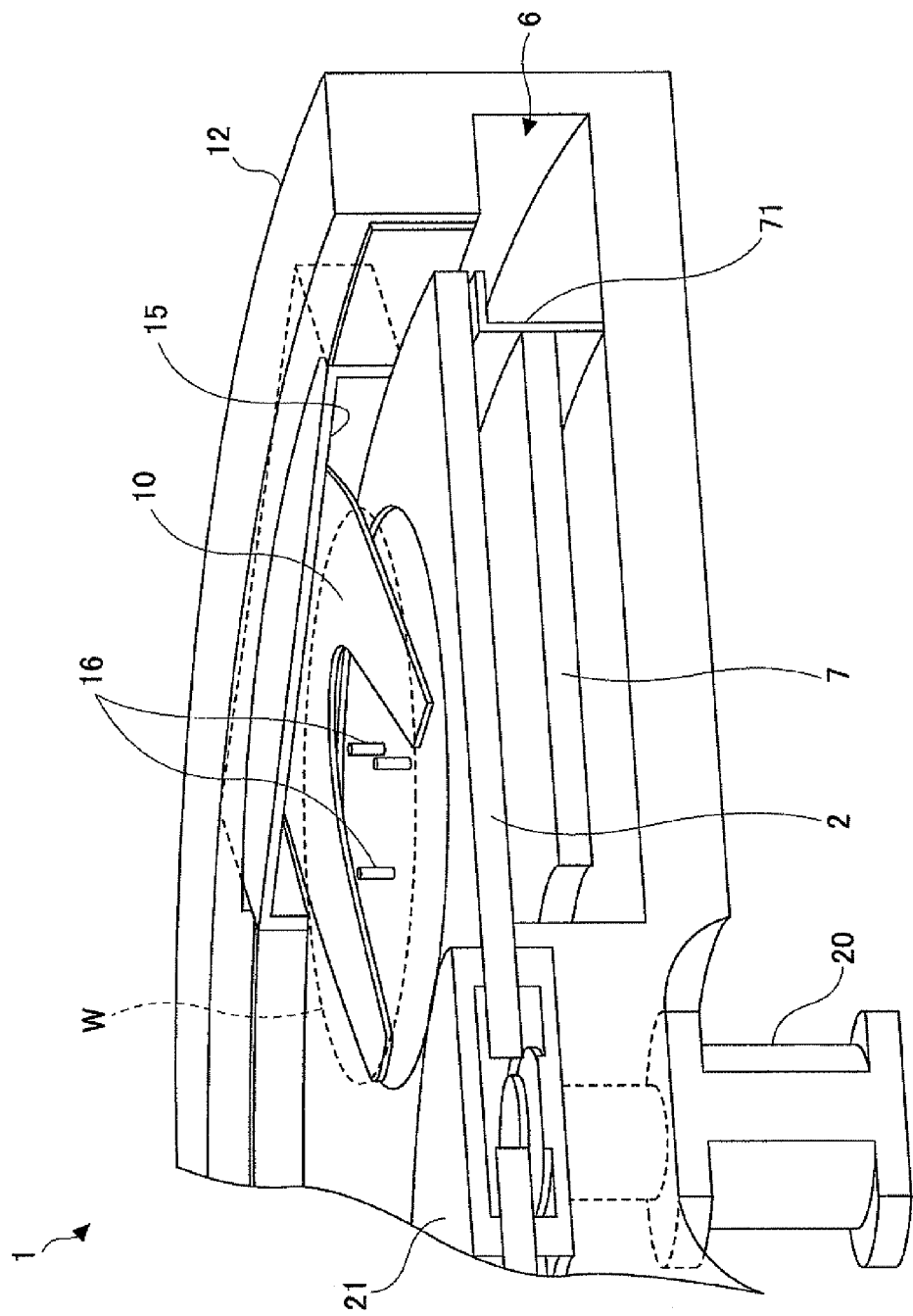
FIG. 8 is a partial perspective view showing the film deposition apparatus of FIG. 1.

Referring to FIGS. 1 and 8, a heater unit 7 is provided between the turntable 2 and the bottom portion 14 of the chamber body 12 in order to heat the turntable 2 and thus the wafer W on the turntable 2, up to a temperature set by a process recipe, for example, about 350° C. Below the circumferential portion of the turntable 2, a cover member 71 is provided surrounding the heater unit 7 in order to separate an atmosphere in a heater unit housing space where the heater unit 7 is housed and an atmosphere outside of the heater unit housing space. The cover member 71 has a flange portion 71a at the top. The flange portion 71a is arranged so that a slight gap is maintained between the back surface of the turntable 2 and the flange portion 71a in order to prevent gas from flowing inside the cover member 71.

As shown in FIG. 1, part of the bottom portion 14, the part being closer to the rotation center of the turntable 2 than the heater unit housing space, comes close to a core portion 21 and an area around the center portion of the turntable 2, thereby leaving a narrow space. In addition, there is a small gap between the rotational shaft 22 and an inner surface of the through hole through which the rotational shaft 22 penetrates. The narrow space is in pressure communication with the inside of the case body 20 through the small gap. A purge gas pipe 72 is connected to be open to the narrow space, thereby supplying a purge gas, for example, $N_2$ gas. Moreover, plural purge gas supplying pipes 73 are connected to the bottom portion 14 of the chamber body 12 below the heater unit 7 along the circumferential direction in order to purge the heater unit housing space with, for example, $N_2$ gas. The advantages demonstrated by the purge gas supplying pipes 72, 73 are described later.

Referring to FIG. 7, a separation gas supplying pipe 51 is connected to the top center portion of the ceiling plate 11 of the chamber 1, so that $N_2$ gas is supplied as a separation gas to a space 52 between the ceiling plate 11 and the core portion 21. The separation gas supplied to the space 52 flows through a thin gap 50 between the protrusion portion 5 and the turntable 2 and then along the upper surface of the turntable 2, and reaches the evacuation area 6. Because the space 52 and the gap 50 are filled with the $N_2$ gas, the reaction gases (BTBAS, $O_3$) cannot be mixed through the center portion of the turntable 2. In other words, the film deposition apparatus according to this embodiment is provided with a center area C that is defined by the center portion of the turntable 2 and the chamber 1 in order to separate the atmospheres of the first process area P1 and the second process area P2 and is configured to have an ejection opening that ejects the separation gas toward the upper surface of the turntable 2. The ejection opening corresponds to the gap 50 between the protrusion portion 5 and the turntable 2, in the illustrated example.

In addition, a transfer opening 15 through which the wafer W is transferred into or out from the vacuum chamber 1 by a transfer arm 10 is formed in a side wall of the chamber body 12 as shown in FIGS. 2, 3 and 8. The transfer opening 15 is opened or closed by a gate valve (not shown). When the concave portion 24 (substrate receiving area) of the turntable 2 is in alignment with the transfer opening 15 and the gate valve is opened, the wafer W is transferred into the vacuum chamber 1 by the transfer arm 10 and placed in the concave portion 24. In order to lower/raise the wafer W onto/from the concave portion 24, there are provided elevation pins 16 (FIG. 8) that are raised or lowered through corresponding through holes formed in the concave portion 24 of the turntable 2 by an elevation mechanism (not shown).

The film deposition apparatus according to this embodiment is provided with a controller 100 (FIG. 3) in order to control all operations (including operations in the other embodiments explained later) of the deposition apparatus. The control portion 100 includes a process controller 100a formed of, for example, a computer, a user interface portion 100b, and a memory device 100c. The memory device 100c stores a program for operating the apparatus. The program includes a group of steps for executing an operation of the apparatus described later, and may be installed to the memory device 100c from a storing medium 100d such as a hard disk, a compact disk, a magneto-optical disk, a memory card, a flexible disk, and the like.

As described above, the first and the second reaction gas nozzles 31, 32 are attached to the vacuum chamber 1 via the mounting holes P8, P2, respectively; and the first and the second separation gas nozzles 41, 42 are attached to the vacuum chamber 1 via the mounting holes P6, P10, respectively. The ceiling member 4A provided for the first separation gas nozzle 41 and the ceiling member 4B provided for the second separation gas nozzle 42 have the same shape. In the illustrated example, a wafer having a diameter of 300 mm is supposed to be processed, and the ceiling members 4A, 4B have a circumferential length (along the circumferential direction from one side to the other side of the ceiling member 4) of, for example, about 146 mm along an interfacial position with respect to the protrusion portion 5 at a distance 140 mm from the rotation center of the turntable 2, and a circumferential length of, for example, about 502 mm along an arc corresponding to the widest portion of the concave portion 24 of the turntable 2 in this embodiment. In addition, a circumferential length from one side wall of the protrusion portion 5 through the nearest inner wall of the groove portion 43 along the arc is about 246 mm.

The height h of the lower surface of the ceiling members 4A, 4B, namely, the low ceiling surfaces 44 from the upper surface of the turntable 2 may be 0.5 mm through 10 mm, for example, and is preferably about 4 mm. In this case, the rotation speed of the turntable 2 may be set as, for example, 1 rpm through 500 rpm. In order to allow the separation area D to demonstrate the separation effect, a size of the ceiling members 4A, 4B and the height h of the lower surface of the ceiling members 4A, 4B (the first ceiling surface 44) from the turntable 2 may be determined depending on the rotation speed of the turntable 2 and the like, through experimentation.

In this embodiment, the separation gas nozzles 41, 42 have plural ejection holes 40 having an inner diameter of, for example, 0.5 mm arranged in longitudinal directions at predetermined intervals of, for example, 10 mm. The ejection holes 40 are directed downward. In addition, the reaction gas nozzles 31, 32 have plural ejection holes 33 that have an inner diameter of, for example, 0.5 mm, are arranged in longitudinal directions at predetermined intervals of, for example, 10 mm, and directed downward. The separation gas is $N_2$ in this embodiment but may be an inert gas such as Ar, $H_2$ or any other gas in other embodiments, as long as the separation gas does not affect the deposition.

Next, operations of the above film deposition apparatus (film deposition method) are explained.

(A Step of Mounting the Gas Nozzles and the Ceiling Member)

First, the first and the second reaction gas nozzles 31, 32 and the first and the second separation gas nozzles 41, 42 are attached to the vacuum chamber 1 via the corresponding mounting holes P8, P2, P6, P10 selected in accordance with a process to be carried out. Then, the first ceiling member 4A is attached to the ceiling plate 11 so that the first separation gas nozzle 41 is housed in the groove portion 43 of the first ceiling member 4A, and the second ceiling member 4B is attached to the ceiling plate 11 so that the second separation gas nozzle 42 is housed in the groove portion 43 of the second ceiling member 4B. In this case, plural of the ceiling members 4 (4A, 4B) having different shapes have been prepared and a ceiling member suited for a process to be carried out may be selected and attached to the ceiling plate 11. Here, "different shapes" may include sector shapes having different sizes, and shapes other than the sector shapes, such as a triangular top-view shape, a rectangular top-view shape, and the like. Next, the evacuation ports 61, 62 are selected from the three evacuation ports 61 through 63. Namely, the on-off valves V61, V62 for the evacuation ports 61, 62, respectively, are opened and the on-off valve V63 for the evacuation port 63 is closed.

The mounting holes (P1 through P12) for the reaction gas nozzles 31, 32 and the evacuation holes (61 through 63) have been selected so that the reaction gas nozzles 31, 32 are positioned upstream relative to the rotation direction of the turntable 2 with respect to the evacuation ports 61, 62, respectively. In the illustrated example, because the first reaction gas nozzle 31 is attached to the vacuum chamber 1 via the mounting hole P8 in the first process area S1, the evacuation port 62 located downstream relative to the rotation direction of the turntable 2 with respect to the reaction gas nozzle 31 is selected. In addition, because the second reaction gas nozzle 32 is attached to the vacuum chamber 1 via the mounting hole P2 in the second process area S2, the evacuation port 61 located downstream relative to the rotation direction of the turntable 2 with respect to the reaction gas nozzle 32 is selected.

(A Step of Loading Wafers)

The turntable 2 is rotated and stopped so that the concave portion 24 is in alignment with the transfer opening 15 and the gate valve (not shown) is opened. Next, the wafer W is transferred into the vacuum chamber 1 through the transfer opening 15 by the transfer arm 10 (FIG. 8). Then, the elevation pins 16 are moved upward through the corresponding through holes formed in the bottom of the concave portion 24 and receive the wafer W from the transfer arm 10; the transfer arm 10 exits from the vacuum chamber 1; and the elevation pins 16 are moved downward to place the wafer W in the concave portion 24. Such operations are repeated five times so that the five wafers W are placed in the corresponding five concave portions 24.

(A Step of Film Deposition)

Next, the vacuum chamber 1 is evacuated to a predetermined reduced pressure by the vacuum pump 65 and the wafers W are heated by the heating unit 7 while the turntable 2 is being rotated clockwise in this embodiment. Specifically, the turntable 2 is heated in advance to a predetermined temperature, for example, 300° C. by the heating unit 7, and the wafers W are heated when being placed on the turntable 2 (the concave portions 24). After the temperature of the wafers W is confirmed to be the predetermined temperature by a temperature sensor (not shown), the BTBAS gas is supplied from the first reaction gas nozzle 31, the $O_3$ gas is supplied from the second reaction gas nozzle 32, and the $N_2$ gas is supplied from the first and the second separation gas nozzles 41, 42.

Because the wafers W move alternately through the first process area P1 where the first reaction gas nozzle 31 is arranged and the second process area P2 where the second reaction gas nozzle 32 is arranged by the rotation of the turntable 2, the BTBAS gas is adsorbed on the surfaces of the wafers W and then the $O_3$ gas is adsorbed on the surfaces of the wafers W, thereby oxidizing the BTBAS molecules to form a mono-layer or plural layers of silicon oxide. In such a manner, molecular layers of silicon oxide are accumulatively deposited, and thus the silicon oxide film having a predetermined thickness is formed on the wafers W after predetermined rotations of the turntable 2.

A gas flow pattern in the vacuum chamber 1 during film deposition is explained later.

During the film deposition, the $N_2$ gas as the separation gas is supplied from the separation gas supplying pipe 51 (FIG. 1) and ejected along the upper surface of the turntable 2 from the center area C, namely, the gap 50 between the protrusion portion 5 and the turntable 2. In the illustrated example, the inner circumferential surface of the chamber body 12 is dented in the evacuation areas 6, leaving a larger space above the evacuation ports 61, 62. Therefore, the pressure in the spaces below the second ceiling surfaces 45 is lower than the pressure in the thin space below the first ceiling surface 44 and the center area C.

(A Step of Unloading Wafers)

After the turntable 2 is rotated predetermined times, the reaction gases are stopped, and thus the film deposition is terminated. Then, the vacuum chamber 1 is purged with $N_2$ gas and the like, and then the wafers W are transferred out from the vacuum chamber 1 in an opposite manner to that described above.

An example of process parameters preferable in the film deposition apparatus according to this embodiment is listed below.

rotational speed of the turntable 2: 1-500 rpm (in the case of the wafer W having a diameter of 300 mm)

pressure in the chamber 1: 1067 Pa (8 Torr)

wafer temperature: 350° C.

flow rate of BTBAS gas: 100 sccm flow rate of $O_3$ gas: 10000 sccm flow rate of $N_2$ gas from the separation gas nozzles 41, 42: 20000 sccm flow rate of $N_2$ gas from the separation gas supplying pipe 51: 5000 sccm the number of rotations of the turntable 2: 600 rotations (depending on the film thickness required)

According to the film deposition apparatus of this embodiment, the ALD (MLD) mode film deposition is realized by placing the plural wafers W on the turntable 2 along the rotation direction of the turntable 2 to alternatively pass through the first process area S1 and the second process area S2 by the rotation of the turntable 2, thereby providing a high throughput film deposition. In addition, because the separation area D including the lower ceiling surface 44 is provided between the first process area S1 and the second process area S2, the BTBAS gas in the first process area S1 and the $O_3$ gas in the second process area S2 are impeded from being mixed through the separation area D. Moreover, the separation gas from the separation gas nozzle 41 (42) arranged in the separation area D1 (D2) can assuredly impede the BTBAS gas and the $O_3$ gas from being mixed with each other. Furthermore, the separation gas is ejected from the center area C defined by the rotation center portion of the turntable 2 and the vacuum chamber 1 to the circumference of the turntable 2. Because the reaction gases are evacuated through the gap between the turntable 2 and the inner circumferential surface of the vacuum chamber 1 along with the separation gas ejected from the center area C and the separation gas that spreads on both sides of the separation area D1 (D2) from the separation gas nozzle 41 (42), the reaction gases are impeded from being mixed. As a result, the appropriate film deposition is enabled. In addition, the film deposition does not or rarely occurs on the upper surface of the turntable 2, thereby substantially avoiding generation of particles. In other embodiments, only one wafer W may be placed on the turntable 2.

Figure 9A:
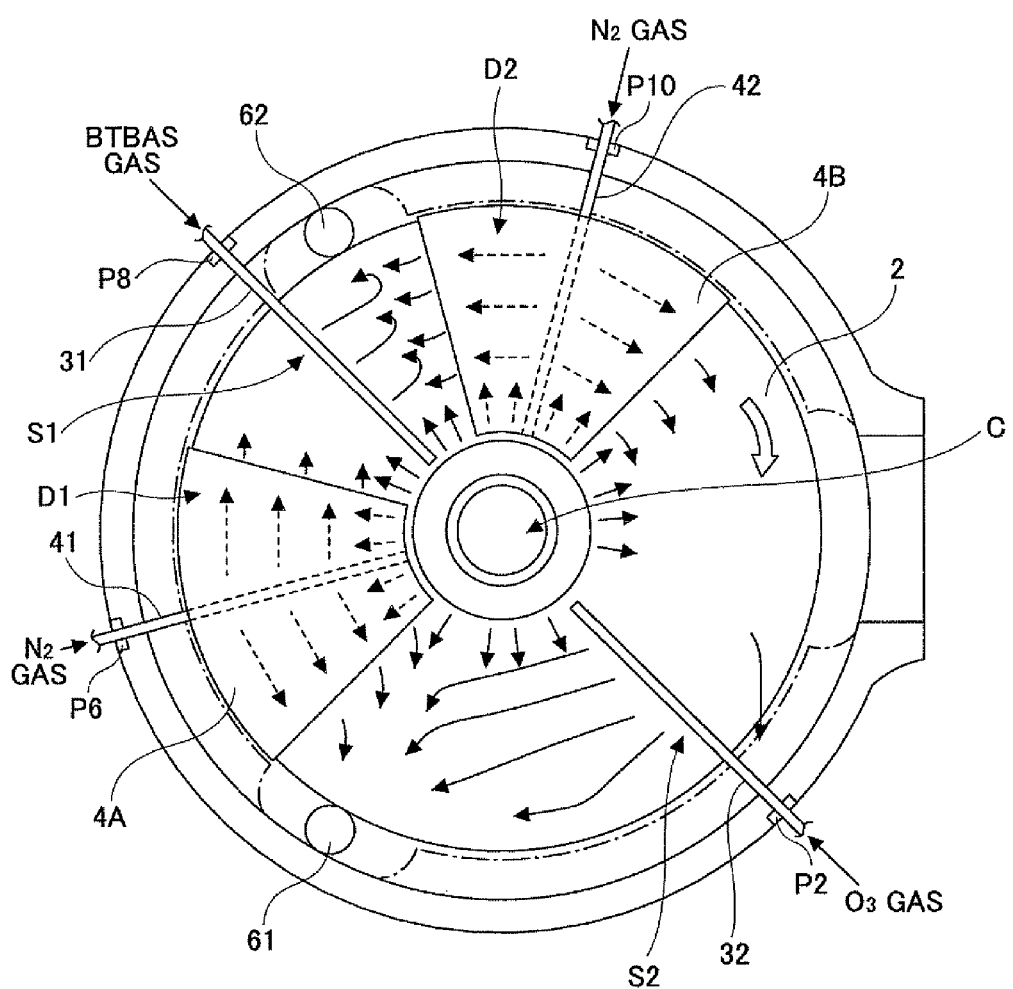
FIG. 9A is an explanatory view showing an example of reaction gas nozzle arrangement and a flow pattern of reaction gases and separation gas.

In addition, because the ceiling member 4 is removably attached on the ceiling plate 11, a particular ceiling member 4 having a shape suited for a process to be carried out can be attached on the ceiling plate 11, thereby controlling the size of the first and the second process areas S (S1, S2). Referring to FIG. 9A, the first process area S1 extends between the first ceiling member 4A located upstream relative to the rotation direction of the turntable 2 with respect to the reaction gas nozzle 31 and the second ceiling member 4B adjacently located downstream relative to the rotation direction of the turntable 2 with respect to the reaction gas nozzle 31. In the process area S1, the BTBAS gas from the first reaction gas nozzle 31 spreads downstream relative to the rotation direction of the turntable 2 toward the second ceiling member 4B, and is evacuated along with the $N_2$ gas from the separation areas D1, D2 and the center area C from the evacuation port 62. Therefore, while the wafer W moves into the first process area S1 from the separation area D1 formed by the first ceiling member 4A and reaches the separation area D2 formed by the second ceiling member 4B, the wafer W is exposed to the BTBAS. Specifically, the BTBAS gas molecules are adsorbed on the wafer W mainly when the wafer W moves from a position below the first reaction gas nozzle 31 to the separation area D2 in the first process area S1.

Even when the first and the second reaction gas nozzles 31, 32 and the first and the second separation gas nozzles 41, 42 are attached respectively in the same positions as above, if the ceiling members 4A, 4B are enlarged, the first and the second process areas S1, S2 are made relatively narrow, and if the ceiling members 4A, 4B are made small, the first and the second process areas S1, S2 are relatively enlarged. Because different reaction gases have different adsorbabilities onto the wafer surface and thus different appropriate adsorption times, the ceiling member 4 is preferably designed taking account of process conditions such as the rotation speed of the turntable 2, a flow rate of the reaction gas, a process temperature (wafer temperature), a process pressure, and the like, so that the size and/or shape of the process areas S1, S2 suited for realizing an appropriate adsorption time (exposure time) may be obtained by the designed ceiling member 4.

In addition, because the reaction gas nozzles 31, 32 are removably attached, the adsorption time of the reaction gases onto the wafer surface may be controlled by attaching the reaction gas nozzles 31, 32 in appropriate positions. Namely, even when the ceiling member 4 has the same shape and is arranged in the same position, (the separation gas nozzle 41 (42) is arranged in identical corresponding positions), a gas exposure time during which the upper surface of the wafer W is exposed to the reaction gas can vary by changing the positions of the reaction gas nozzles 31 (32) in the first (second) process area S1 (S2). For example, when the reaction gas nozzle is arranged closer to the ceiling member located upstream relative to the rotation direction of the turntable with respect to the reaction gas nozzle in the process area, because the wafer W can be exposed to the BTBAS gas immediately after the wafer W moves into the process area, the wafer W is exposed for a longer time before reaching the other ceiling member located downstream relative to the rotation direction with respect to the reaction gas nozzle. On the other hand, when the reaction gas nozzle is arranged closer to the ceiling member located downstream relative to the rotation direction of the turntable with respect to the reaction gas nozzle in the process area, because the wafer W may be exposed to the reaction gas from a position below the reaction gas nozzle to the other ceiling member located downstream relative to the rotation direction with respect to the reaction gas nozzle although the reaction gas spreads around the process area, a sufficient amount of the reaction gas is not supplied to the wafer surface.

As stated, because the appropriate adsorption time and the appropriate oxidization time vary depending on the reaction gases, the mounting positions of the reaction gas nozzles should be determined taking account of the process conditions such as the rotation speed of the turntable 2, a flow rate of the reaction gas, a process temperature (wafer temperature), a process pressure, and the like, so that sufficient adsorption and oxidation can be realized in the process areas S1, S2.

Moreover, because the separation gas nozzles 41, 42 are removably attached, a size of the process areas (separation areas) may be controlled by attaching the separation gas nozzles 41, 42 in appropriate positions selected in accordance with the process, and attaching the ceiling members 4A, 4B accordingly, without changing the size and/or shape of the ceiling members 4A, 4B. For example, when the separation gas nozzles 41, 42 are arranged opposite with (180° away from) each other and when the ceiling members 4 having the same shape, the two process areas S1, S2 have the same size. In addition, when the separation gas nozzles 41, 42 are arranged closer to (less than 180° away from) each other, one of the process areas S1, S2 can be larger than the other.

Therefore, the process areas S1, S2 required to obtain an appropriate adsorption time (oxidization time) in accordance with the reaction gases are determined, and the separation gas nozzles 41, 42 are arranged in appropriate positions accordingly, thereby realizing sufficient adsorption and/or oxidation.

In addition, because the reaction gas nozzles and the separation gas nozzles are removably attached, the process areas and the separation areas can be arbitrarily provided in accordance with the process by arranging the reaction gas nozzles and the separation gas nozzles in appropriate positions selected in accordance with the process, and accordingly arranging the ceiling members, or changing the shape of the ceiling members, if needed, even when three or more reaction gases are used, thereby improving a degree of designing freedom in response to process changes.

Moreover, when the reaction gas nozzles and the evacuation ports are selected so that the reaction gas nozzles are located upstream relative to the rotation direction of the turntable 2 with respect to the evacuation ports in the process areas, the reaction gas can spread evenly in the process areas.

Figure 9B:
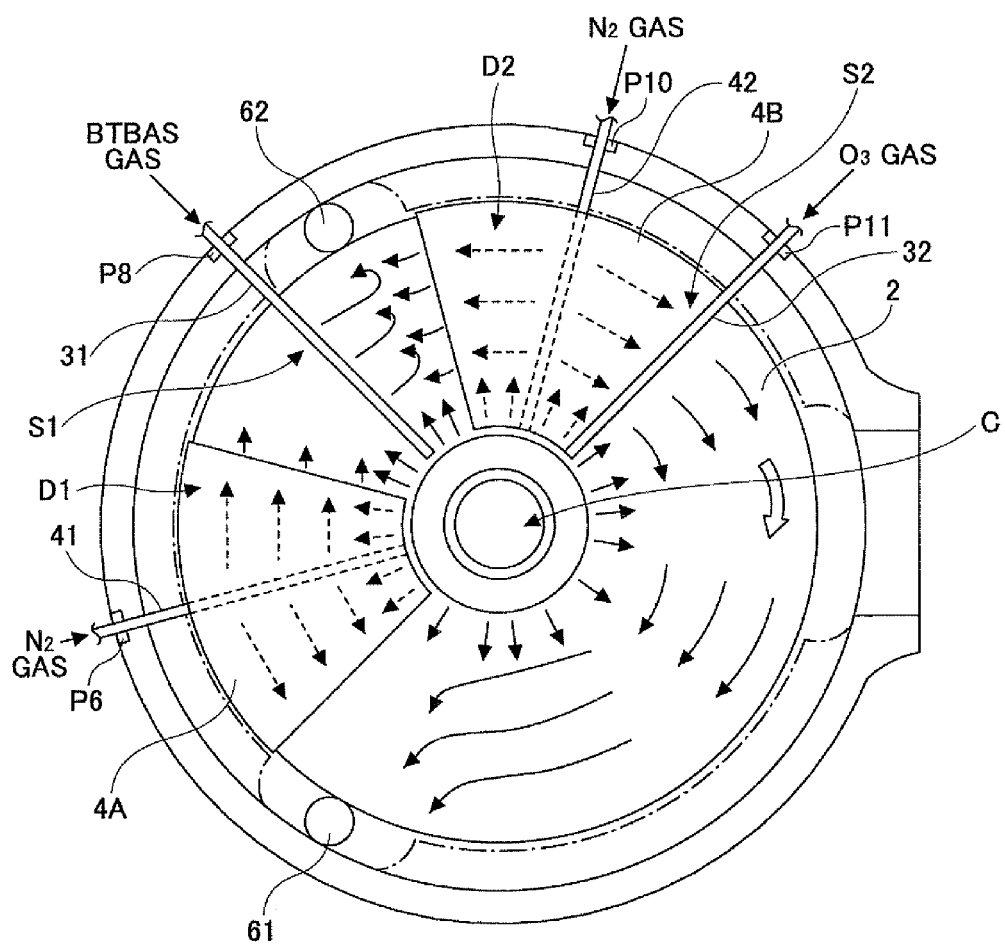
FIG. 9B is another explanatory view showing another example of reaction gas nozzle arrangement and a flow pattern of reaction gases and separation gas.

Next, another configuration as an example is explained. FIG. 9B shows a configuration where the adsorption time of the second reaction gas onto the surface of wafer W can be prolonged. As shown, the first and the second reaction gas nozzles 31, 32 are attached to the vacuum chamber 1 via the mounting holes P8, P11, and the first and the second separation gas nozzles 41, 42 are attached to the vacuum chamber 1 via the mounting holes P6, P10. In addition, the ceiling member 4A provided for the first separation gas nozzle 41 and the ceiling member 4B provided for the second separation gas nozzle 42 have the same shape and size of the ceiling members 4A, 4B in FIG. 4A. Moreover, the evacuation ports 61, 62 are selected by opening the on-off valves V61, V62, and the on-off valve V63 is closed. The BTBAS gas is supplied to the first process area S1 from the first reaction gas nozzle 31; the $O_3$ gas is supplied to the second process area S2 from the second reaction gas nozzle 32; and the $N_2$ gas is supplied from the first and the second separation gas nozzles 41, 42.

The configuration shown in FIG. 9B is the same at the configuration shown in FIG. 9A in terms of the positions of the first reaction gas nozzle 31, the first separation gas nozzle 41, and the second separation gas nozzle 42, and the shape and size of the first and the second ceiling members 4A, 4B. However, the second reaction gas nozzle 32 is arranged adjacent to and on the downstream side of the ceiling member 4B in FIG. 9B. With this configuration, the $O_3$ gas is supplied to the second process area S2 from the most upstream position and evacuated from the most downstream position in the second process area S2 because the evacuation port 61, which is located closer to the ceiling member 4A, is selected. Therefore, the $O_3$ gas can spread substantially in the entire second process area S2, which allows the wafer W to be exposed to the $O_3$ gas for a longer time while moving through the second process area S2. Namely, the configuration of FIG. 9B can prolong the adsorption time (oxidation time) of the $O_3$ gas, compared with the configuration in FIG. 9A. A similar example will be explained later in reference with FIG. 39.

Figure 10:
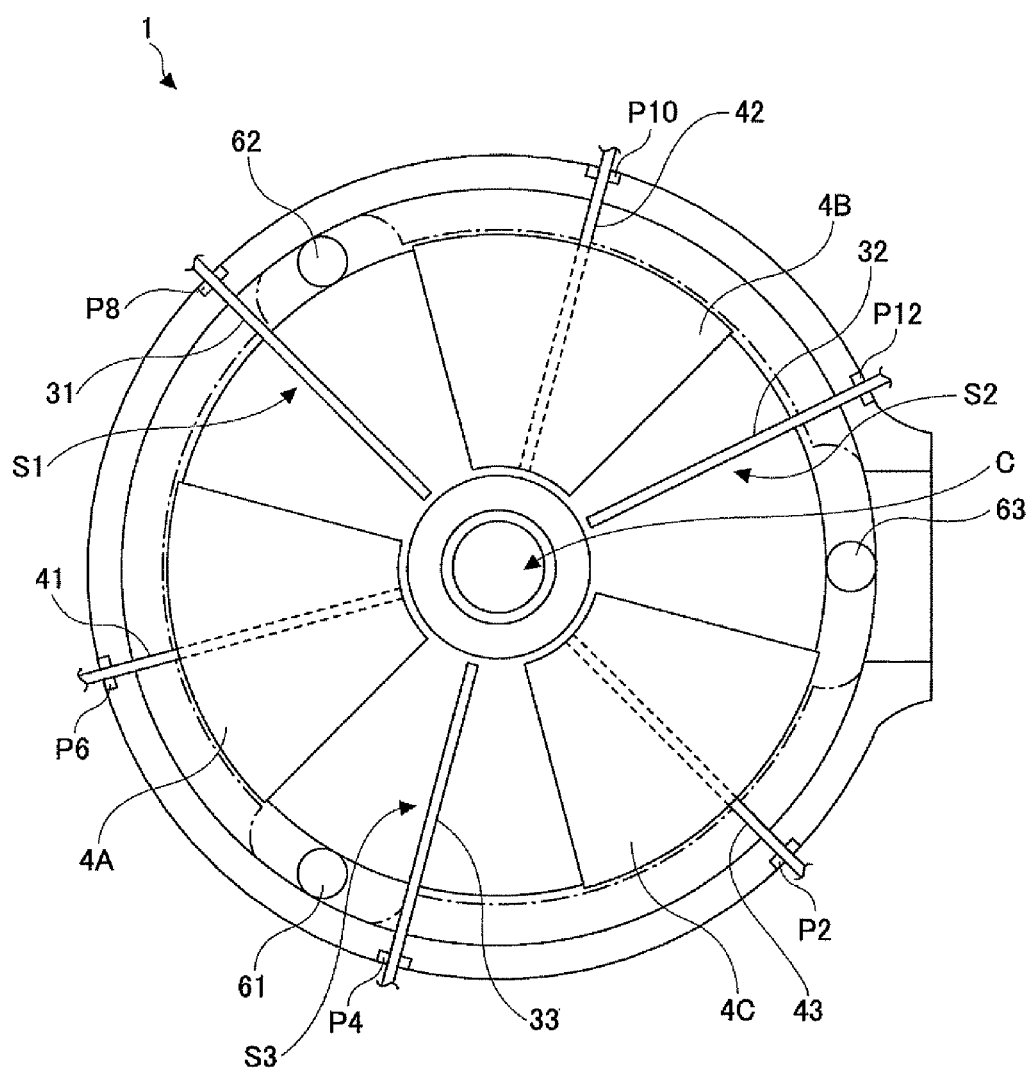
FIG. 10 is an explanatory view an example of arrangement of the reaction gas nozzles and the separation gas nozzles in the film deposition apparatus of FIG. 1.

FIG. 10 shows another configuration where three reaction gases are used. The vacuum chamber 1 shown in FIG. 10 includes first through third reaction gas nozzles 31, 32, 33 and first through third separation gas nozzles 41, 42, 43. The first through the third reaction gas nozzles 31, 32, 33 are attached to the vacuum chamber 1 via the corresponding mounting holes P8, P12, P4, and the first through the third separation gas nozzles 41 through 43 are attached to the vacuum chamber 1 via the corresponding mounting holes P6, P10, P12. In addition, ceiling members 4A through 4C are provided for the first through the third separation gas nozzles 41, 42, 43, respectively. The ceiling members 4A, 4B, 4C have the same shape and size of the ceiling members 4A, 4B shown in FIG. 9A. All the evacuation ports 61, 62, 63 are selected and the on-off valves V61, V62, V63 are opened.

In this configuration, BTBAS gas is supplied as a first reaction gas to the first process area S1 from the first reaction gas nozzle 31; ethanol ($C_2H_5OH$) gas is supplied as a second reaction gas to the second process area S2; and $O_3$ gas is supplied as a third reaction gas to the third process area S3, thereby depositing a silicon oxide film on the upper surface of the wafer W. In this case, the $N_2$ gas is supplied as the separation gas from the first through the third separation gas nozzles 41, 42, 43. In the first process area S1, the first reaction gas flows substantially to the evacuation port 62; in the second process area S2, the second reaction gas flows substantially to the evacuation port 63: and in the third process area S3, the third reaction gas flows substantially to the evacuation port 61.

In any one of the configurations above, the ceiling members 4A, 4B may be made of one sector plate by forming the groove portion 43 in the center of the sector plate, and the separation gas nozzle 41 (42) is housed in the groove portion 43. However, two sector plates may be prepared and attached on both sides of the separation gas nozzle 41 (42) on the lower surface of the ceiling plate 11 with screws. In addition, the groove portion 43 for housing the separation gas nozzle 41 (42) is not necessarily formed in the center of the ceiling member 4. For example, the groove portion 43 may be formed so that the first ceiling surface 44 (lower surface of the ceiling member 4) is wider on the upstream side relative to the rotation direction of the turntable 2 than the downstream side relative to the rotation direction of the turntable 2.

In addition, the ceiling member 4 (the first ceiling surface 44) preferably has a greater width (a longer arc) toward the circumference in the upstream side of the ceiling member 4. This is because the gas flowing downstream along the rotation direction of the turntable 2 has a higher speed in the position closer to the circumference of the turntable 2. In view of this, it is preferable for the ceiling member 4 to have a sector-shaped top view.

Figure 11:
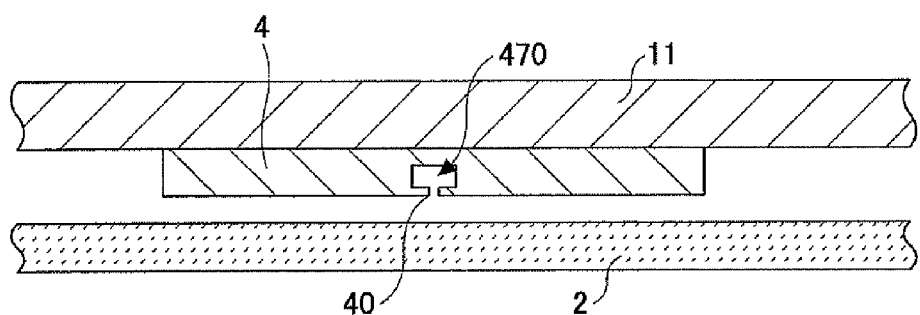
FIG. 11 is a cut-away diagram of another example of a ceiling member.

Moreover, the separation gas nozzle 41 (42) is located in the groove portion 43 formed in the ceiling member 4 and the lower ceiling surfaces 44 are located on both sides of the separation gas nozzle 41 (42) in the above embodiment. However, a conduit 470 extending along the radial direction of the turntable 2 may be made inside the ceiling member 4, and plural holes 40 may be formed along the longitudinal direction of the conduit 470 so that the separation gas ($N_2$ gas) may be ejected from the plural holes 40, as shown in FIG. 11. In this case, the separation gas nozzle is attached to the vacuum chamber 1 via the mounting holes so that the separation gas nozzle is in pressure communication with the conduit 470. The conduit 470 and the plural holes 40 constitute a separation gas supplying path.

Figure 12A:
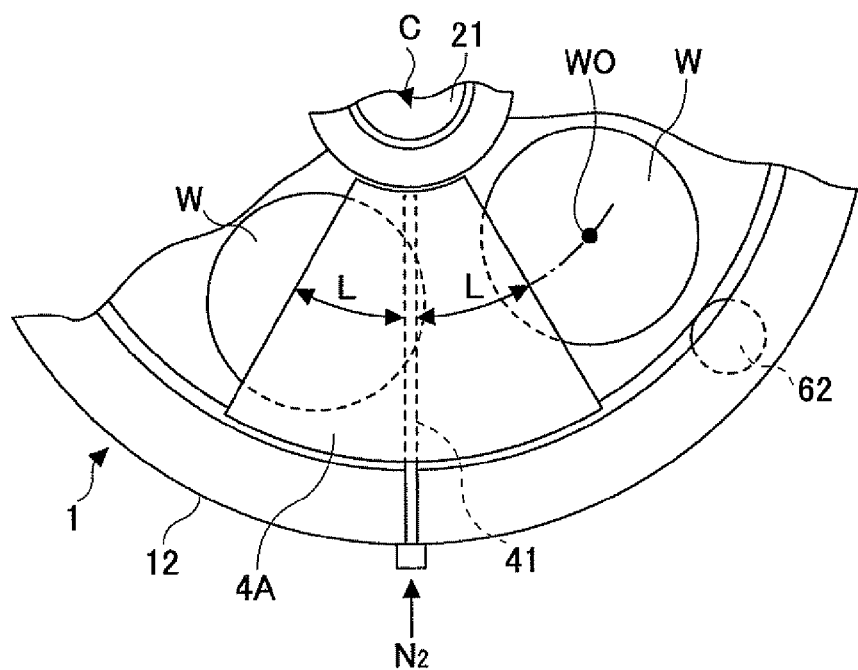
FIG. 12A is an explanatory view of the ceiling member used in a separation area in a vacuum chamber of the film deposition apparatus of FIG. 1.
Figure 12B:
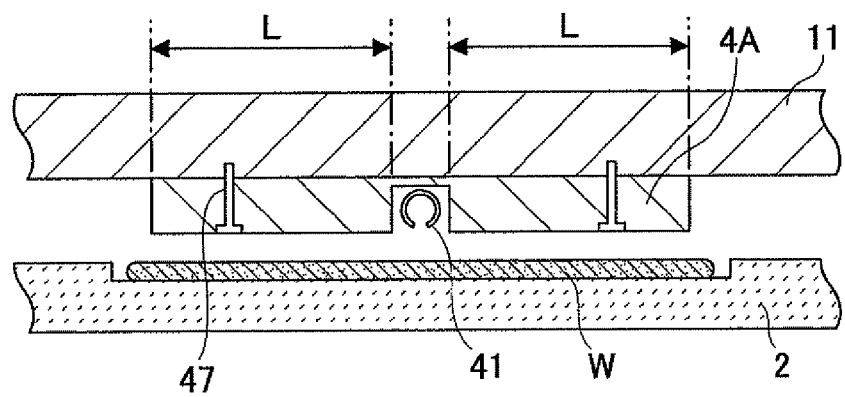
FIG. 12B is another explanatory view of the ceiling member used in a separation area in a vacuum chamber of the film deposition apparatus of FIG. 1.

As shown in FIGS. 12A and 12B, the first ceiling surface 44 that creates the thin space in both sides of the separation gas nozzle 41 (42) may preferably have a length L of about 50 mm or more measured along a route through which a wafer center WO passes when the wafer W having a diameter of 300 mm is to be processed. When the length L is set to be small, the height h of the ceiling surface 44 from the turntable 2 needs to be small accordingly in order to efficiently impede the reaction gases from entering the thin space below the ceiling surface 44 from both sides of the ceiling member 4A (4B). Moreover, when the height h of the ceiling surface 44 from the turntable 2 is set to a certain value, the length L has to be larger in a position closer to the circumference of the turntable 2 in order to efficiently impede the reaction gases from entering the thin space below the ceiling surface 44 because a linear speed of the turntable 2 becomes higher in a position farther away from the rotation center. Being considered from this viewpoint, when the length L measured along the route through which a wafer center WO passes is smaller than 50 mm, the height h of the thin space needs to be significantly small, which may cause the wafer W to hit the ceiling member 4. Therefore, measures to damp vibration of the turntable 2 are required in order to prevent the turntable 2 or the wafer W from hitting the ceiling surface 44 when the turntable 2 is rotated.

Furthermore, when the rotation speed of the turntable 2 is higher, the reaction gas tends to enter the space below the protrusion portion 5 from the upstream side of the ceiling member 4. Therefore, when the length L is smaller than 50 mm, the rotation speed of the turntable 2 needs to be reduced, which is inadvisable in terms of throughput. Therefore, the length L is preferably 50 mm or more, while the length L smaller than 50 mm can demonstrate the effect explained above depending on the situation. The length L is preferably from about one-tenth of a diameter of the wafer W through about a diameter of the wafer W, preferably, about one-sixth or more of the diameter of the wafer W along an arc that corresponds to the route through which a wafer center WO passes.

Second Embodiment

Next, a second embodiment of the present invention is explained in reference to FIGS. 13 through 16. In these drawings, the same reference numerals are given to the same or the corresponding members in the first embodiment.

In this embodiment, the vacuum chamber 1 is provided inside with a process compartment 8 that is made of quartz and has a shape of a flattened cylinder. The process compartment 8 includes a partition member 81 that is open at the top and surrounds the circumferential surface and the lower surface of the turntable 2, and a cover member 82 that covers the top opening of the partition member 81 and faces the upper surface of the turntable 2. In addition, the partition member 81 has an opening at a position in a circumferential wall 80, the position opposing the transfer opening 15 of the vacuum chamber 1 (see FIG. 14). A bottom portion 83 of the partition member 81 is supported by a raised portion 12b of the bottom portion 14 of the chamber body 12, the raised portion being provided substantially in the center of the bottom portion 14. The bottom portion 83 of the partition member 81 has an opening at the center and the inner circumference of this opening is close to the outer circumferential surface of the core portion 21.

Figure 14:
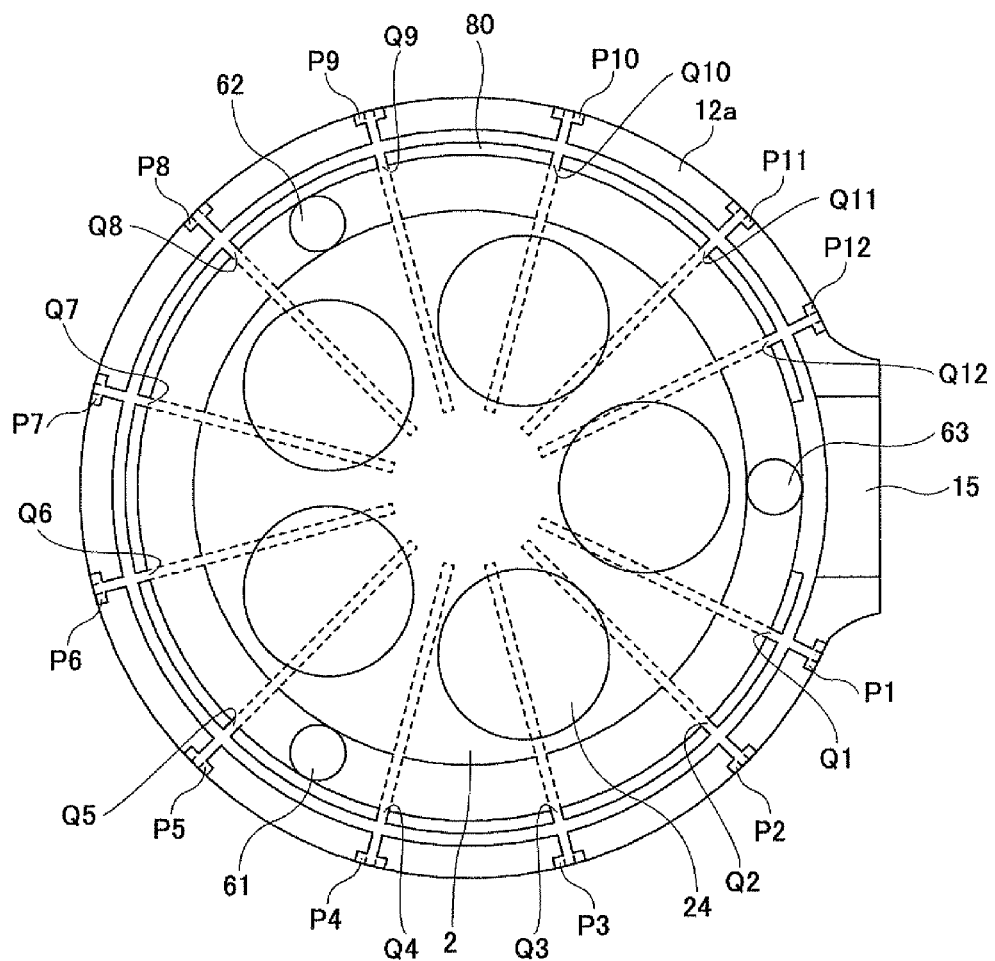
FIG. 14 is a plan view of a film deposition apparatus of FIG. 13.

In addition, the circumferential wall 80 of the partition member 81 has mounting holes Q1 through Q12 through which the reaction gas nozzles 31, 32 and the separation gas nozzles 41, 42 are inserted in positions corresponding to the mounting holes P1 through P12 in the circumferential wall of the chamber body 12. The mounting holes of the chamber body 12 and the corresponding mounting holes of the partition member 81 are selected, and the reaction gas nozzles 31, 32 and the separation gas nozzles 41, 42 are inserted from the outside of the vacuum chamber 1 so that the nozzles 31, 32, 41, 42 penetrate through the selected mounting holes. Moreover, the bottom portion 83 of the partition member 81 has evacuation ports 84a, 84b, 84c in positions corresponding to the evacuation ports 61, 62, 63 formed in the bottom portion 14 of the chamber body 12. In FIG. 14, the valves V1 through V12 for the mounting holes P1 through P12 are omitted; and in FIG. 16, the mounting holes P1 through P12, Q1 through Q12 are omitted.

Figure 13:
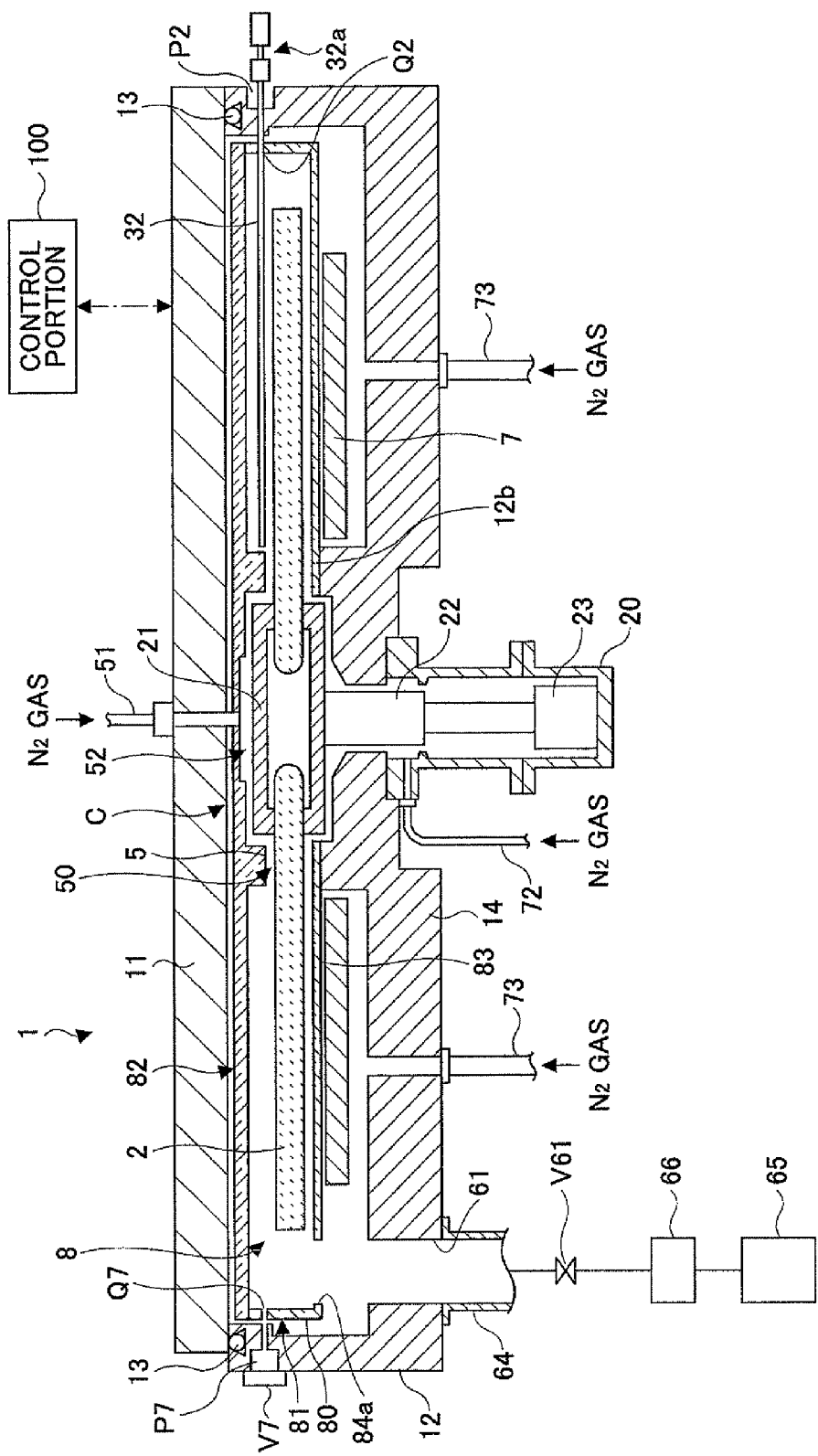
FIG. 13 is a cut-away diagram of a film deposition apparatus according to a second embodiment of the present invention.
Figure 15:
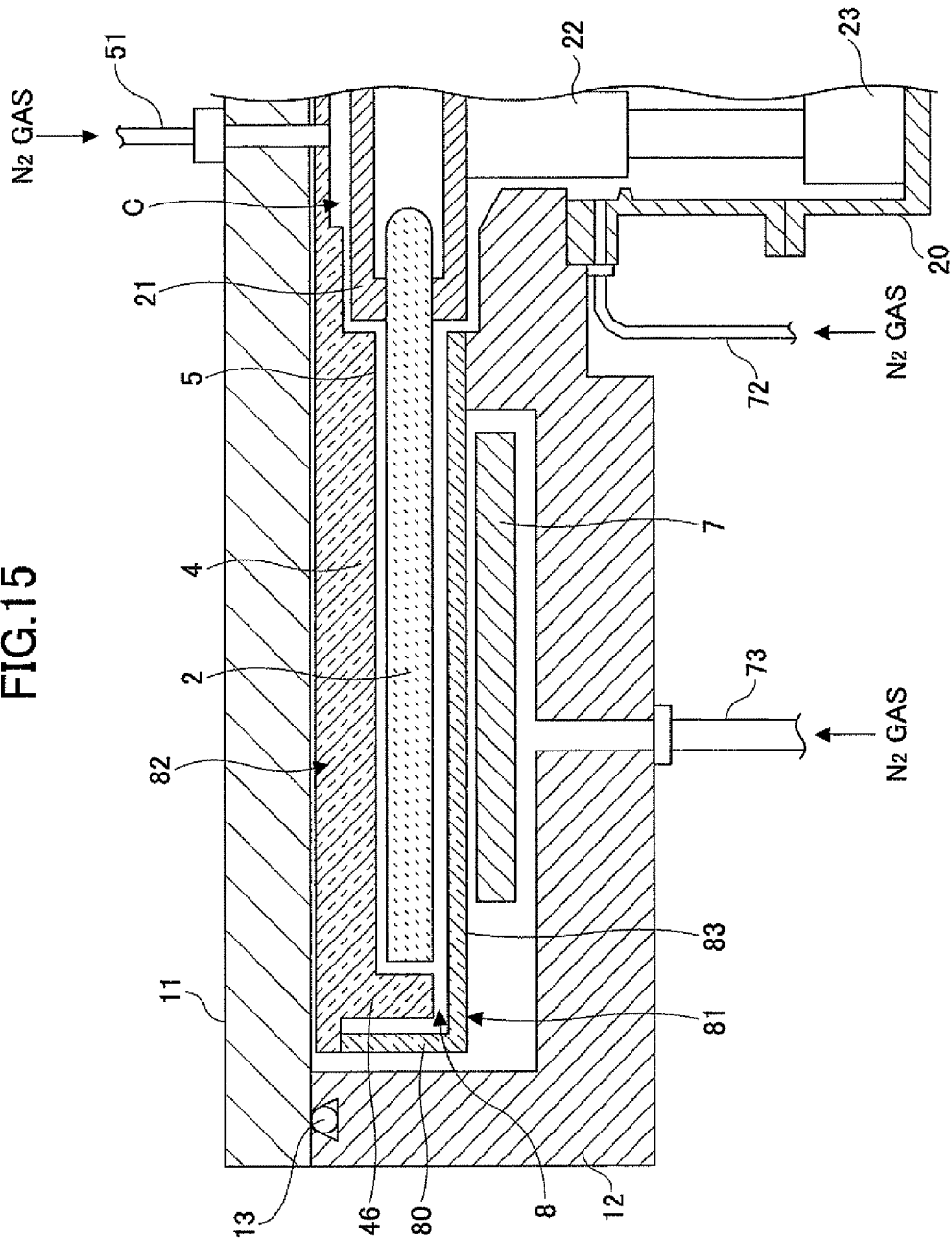
FIG. 15 is a partial cut-away diagram of a film deposition apparatus of FIG. 13.
Figure 16:
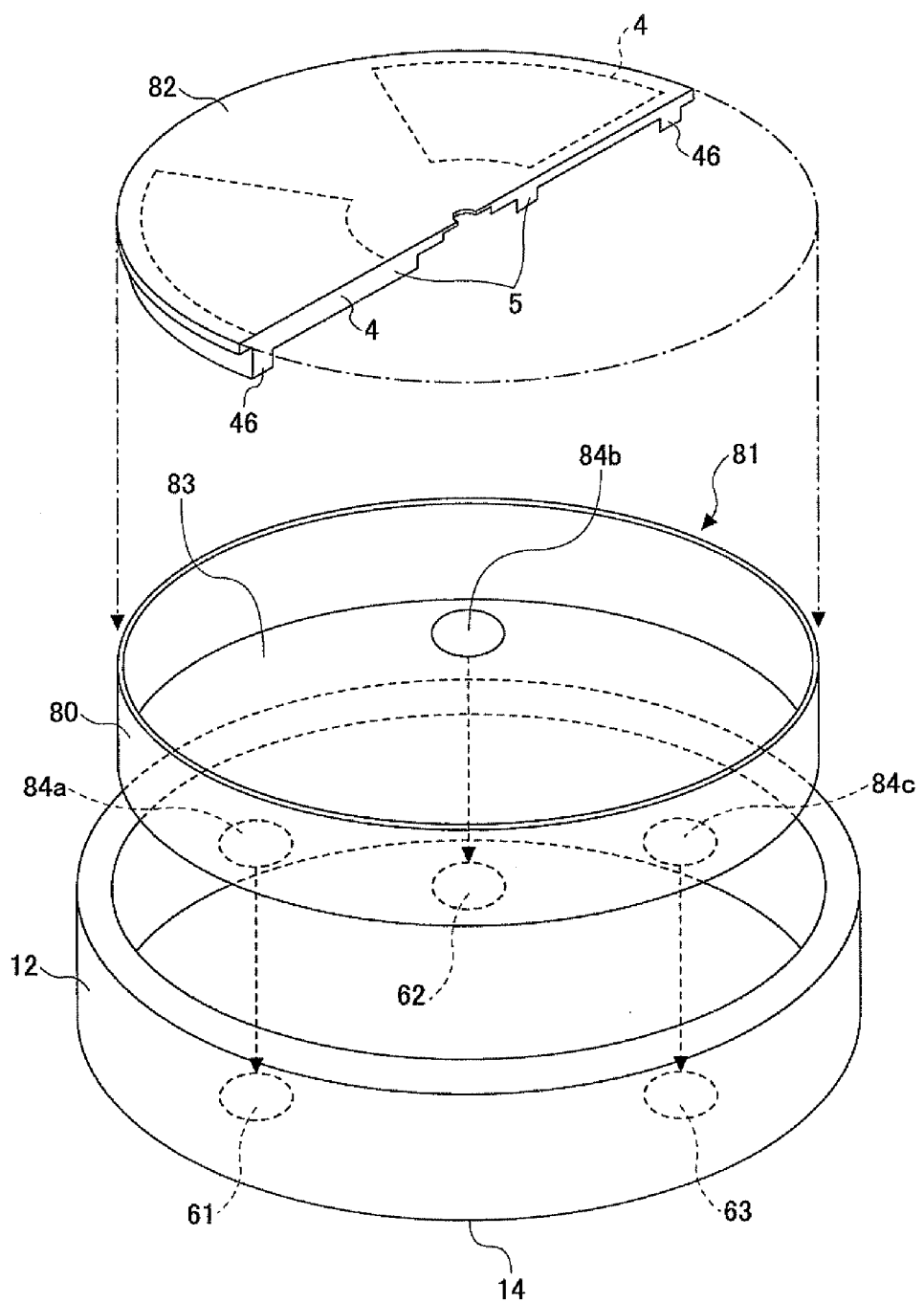
FIG. 16 is a partial perspective view of the film deposition apparatus of FIG. 13.

Moreover, the cover member 82 has a center opening through which the separation gas supplying pipe 51 extends. With this, the separation gas from the separation gas supplying pipe 51 is supplied into the process compartment 8. As shown in FIGS. 13 through 15, the ceiling member 4 and the protrusion portion 5 are integrally formed on the lower surface of the cover member 82. The cover member 82 is supported at the circumferential edge by the circumferential wall 80 of the partition member 81, and thus the quartz-made process compartment 8 is configured so that the turntable 2 is partitioned from the heater unit 7 and the like. In the illustrated examples, the cover member 82 lies on the partition member 81 and is removably provided to the vacuum chamber 1. The vacuum chamber 1 is made of, for example, aluminum, and air-tightness of the vacuum chamber 1 is maintained by the O ring 13 between the chamber body 12 and the ceiling plate 11 also in this embodiment.

Because the ceiling member 4 is formed integrally with the cover member 82, plural cover members 82 having different shapes and positions of the ceiling member 4 may be prepared. With this, one of the plural cover members 82 may be selected in accordance with a process to be carried out, and placed on the partition member 81.

According to such a configuration, the separation gas supplied from the separation gas supplying pipe 51 to the process compartment 8 flows from the center area C toward the circumferential edge of the turntable 12 along the upper surface of the turntable 12, and is evacuated from the evacuation ports 61, 62, 63 through the evacuation ports 84a, 84b, 84c the evacuation area 6. In addition, the purge gas supplied to the case body 20 flows toward the circumferential edge of the turntable 2 along the lower surface of the turntable 2 through the gap between the chamber body 12 and the rotational shaft 22 and the gap between the lower surface of the core portion 21 and the bottom portion 83 of the partition member 81, and is evacuated from the evacuation ports 61, 62, 63 through the evacuation ports 84a, 84b, 84c and the evacuation area 6. Because the reaction gas nozzles 31, 32 and the separation gas nozzles 41, 42 are attached in the same manner as explained in the first embodiment and the evacuation ports 61, 62, 63 are selected in the same manner as explained in the first embodiment, the flow pattern of the reaction gases and the separation gas is the same as that in the vacuum chamber 1 in the first embodiment.

In this embodiment, the turntable 2 is substantially enclosed by the process compartment 8; the reaction gases are supplied to the process compartment 8 from the reaction gas nozzles 31, 32; the separation gas is supplied to the process compartment 8 from the separation gas nozzles 41, 42 and the separation gas supplying pipe 51; and the purge gas is supplied to the process compartment 8 from the purge gas supplying pipes 72, 73. Because the evacuation ports 84a, 84b, 84c are formed in the positions corresponding to the evacuation ports 61, 62, 63, the gases in the process compartment 8 may not spread into the vacuum chamber 1 and can be immediately evacuated through the evacuation ports 84a, 84b, 84c, 61, 62, 63.

Because the evacuation ports 84a, 84b, 84c, 61, 62, 63 are located near the circumferential inner wall of the vacuum chamber 1, while the separation gas is supplied from above the core portion 21 and the purge gas is supplied to the case body 20, the gases generally flow from the core portion 21 toward the circumferential edge of the turntable 2. With this, the reaction gases are impeded from flowing into the core portion 21 and the case body 20. In addition, because the evacuation ports 61, 62, 63 are formed on the outer side of the purge gas supplying pipe 73, the purge gas or the separation gas near the heater unit 7 flows outward.

Because such a gas flow pattern is created, the reaction gases may remain in the process compartment 8 and a residual deposit may be caused in the process compartment 8. However, the reaction gases cannot remain in an area outside of the process compartment 8, thereby avoiding deposition on the heater unit 7 and the inner wall of the vacuum chamber 1.

Because the deposits may be caused from the reaction gases inside the process compartment 8, periodic cleaning is required. The process compartment 8 is made of quartz and has corrosion resistance, and therefore such deposits can be removed by introducing a cleaning gas including chlorine, fluorine, and the like, in such a manner that the process compartment 8 is hardly corroded.

When cleaning the process compartment 8, the cleaning gas passes through the vacuum chamber 1 when the cleaning gas is evacuated out through the evacuation ports 84a, 84b, 84c, 61, 62, 63. However, because the gas is not likely to spread in the vacuum chamber 1 as described above, the inner surface of the vacuum chamber 1, the heater unit 7, and the like are least likely to be corroded.

Figure 17:
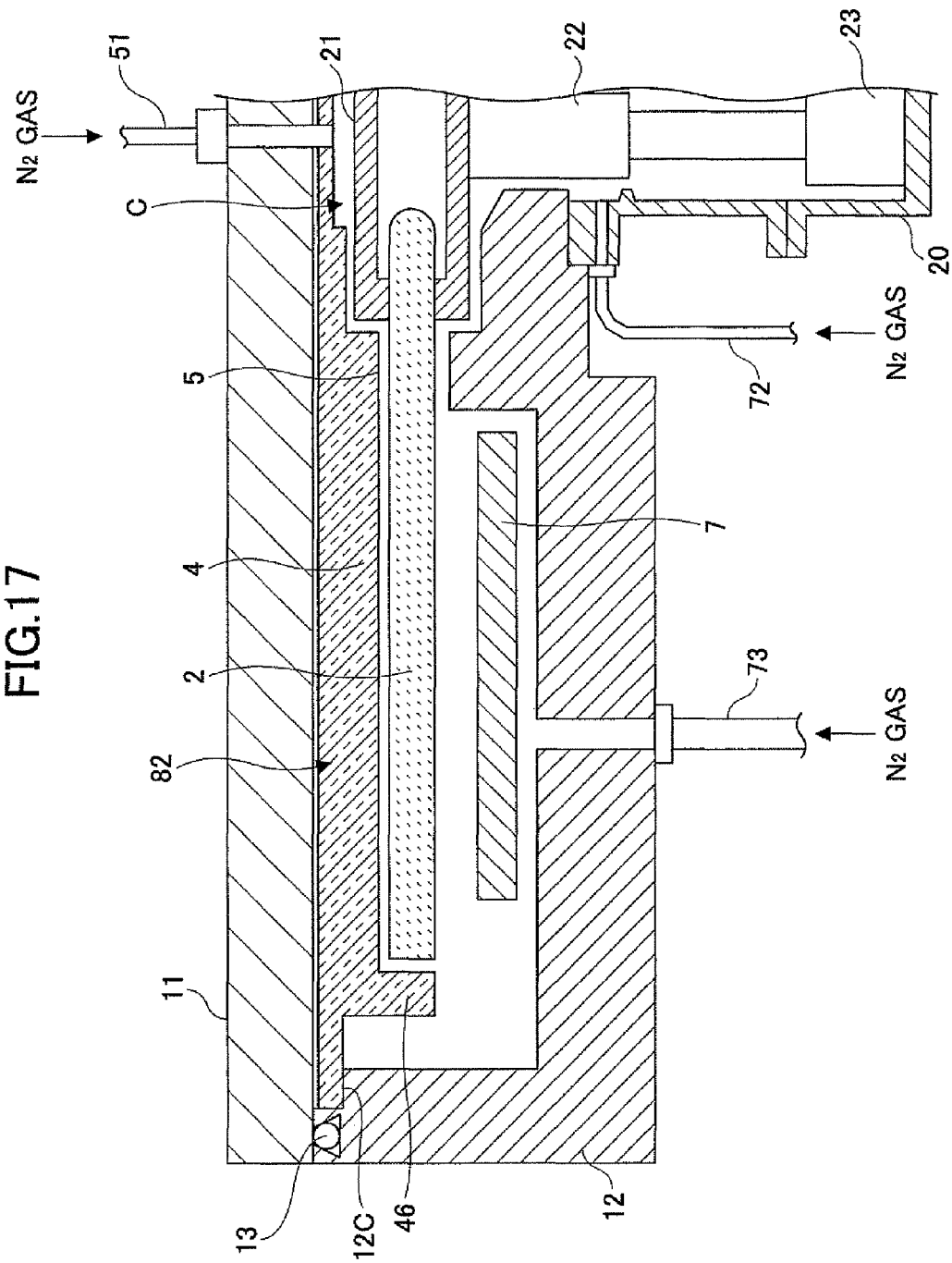
FIG. 17 is a partial cut-away diagram of the film deposition apparatus of FIG. 13.

In addition, the circumferential portion of the cover member 82 may be placed on a step portion 12c formed in the circumferential wall of the chamber body 12, as shown in FIG. 17, instead of placing the cover member 82 on the circumferential wall 80 of the partition member 81.

Moreover, while the cover member 82 is made of quartz in this embodiment, the cover member 82 may be made of aluminum and the like. In this case, the ceiling member 4 is not necessarily formed integrally with the cover member 82, but may be removably attached on the lower surface of the cover member 82.

Figure 18A:
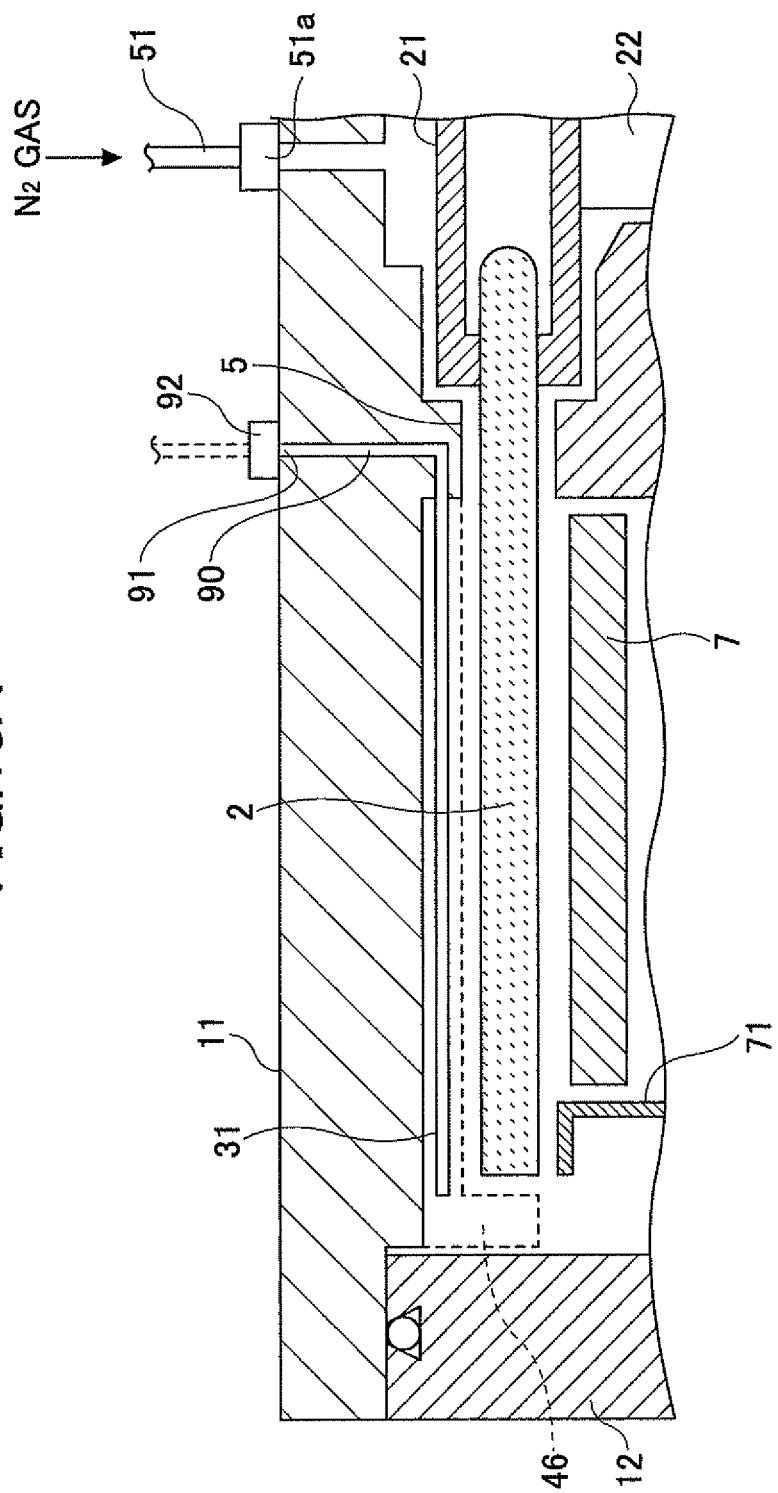
FIG. 18A is a cut-away diagram showing a modification example of the film deposition apparatus of FIG. 13.

In addition, the reaction gas nozzle mounting portion and the separation gas nozzle mounting portion may be provided in an inner portion of the vacuum chamber 1 in relation to the concave portion 24 of the turntable 2 in other embodiments. For example, the plural reaction gas nozzles and separation gas nozzles (or the plural conduits 470) may be arranged in order to extend above the turntable 2 from the inner to the outer in the radial direction of the vacuum chamber 1. FIG. 18A illustrates the first reaction gas nozzle 31 attached to the ceiling plate 11 of the vacuum chamber 1 via the protrusion portion 5.

Figure 18B:
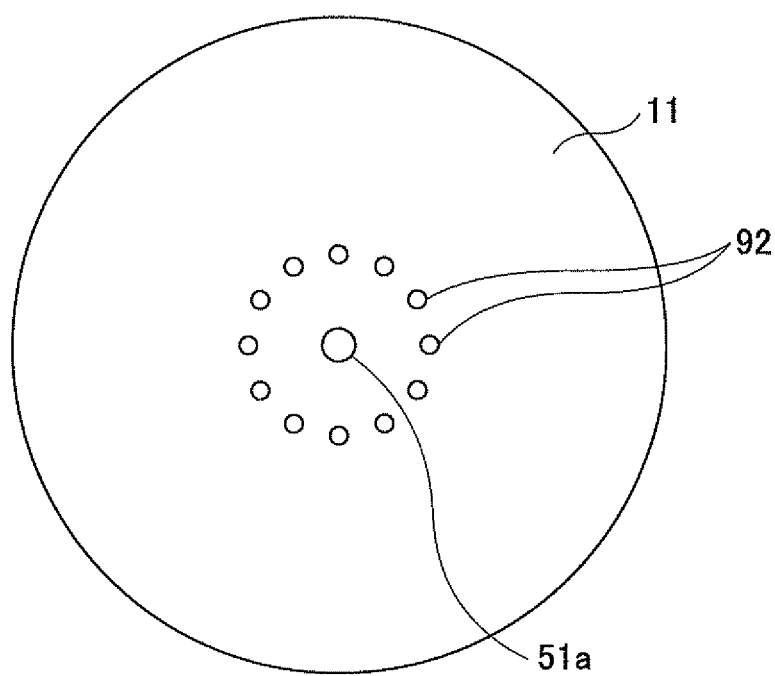
FIG. 18B is a top view showing another modification example of the film deposition apparatus of FIG. 13.

On the other hand, a gas supplying conduit 90 to be in pressure communication with the first reaction gas nozzle 31 is formed inside the ceiling plate 11 and the protrusion portion 5 in order to supply the first reaction gas (BTBAS gas) to the vacuum chamber 1 through the first reaction gas nozzle 31. In an opening 91 of the gas supplying conduit 90, a pipe mounting portion 92 is provided and a gas supplying pipe is connected to the pipe mounting portion 92 in order to connect the gas supplying conduit 90 to the gas supplying source. Plural gas supplying conduits 90 and corresponding pipe mounting portions 92 (FIG. 18B) may be formed in the ceiling plate 11, and the nozzles 31, 32, 41, 42 (or more) may be connected inside the vacuum chamber 1 to the corresponding gas supplying conduits 90 selected from the plural gas supplying conduits 90. In such a manner, the nozzle mounting portions are provided in the inner portion of the vacuum chamber 1 in relation to the concave portion 24 of the turntable 2.

In the above embodiments of the present invention, while the positions of all the reaction gas nozzles 31, 32 and separation gas nozzles 41, 42 may be changed, only the ceiling members 4 may be replaced with other ceiling members 4 having different shapes without changing the positions of the reaction gas nozzles 31, 32 and separation gas nozzles 41, 42. Specifically, the ceiling members 4 having different shapes may be screwed to the ceiling plate 11 in the first embodiment, or the cover member 82 to which the ceiling members 4 having different shapes are integrally coupled may be replaced.

Moreover, only the positions of the reaction gas nozzles 31, 32 may be changed without changing the positions of the separation gas nozzles 41, 42 and the shapes and/or the positions of the ceiling members 4, in accordance with a process to be carried out. Furthermore, the positions of the reaction gas nozzles 31, 32 and the shapes of the ceiling members 4 may be changed without changing the positions of separation gas nozzles 41, 42.

While the ceiling members 4 may be screwed to the ceiling plate 11 as described above, the ceiling member 4 may be configured so that the ceiling member can be attached to the ceiling plate 11 by pressing the ceiling members 4 onto the ceiling plate 11. The number of the mounting holes P1 through P12 for the reaction gas nozzles 31, 32 and the separation gas nozzles 41, 42 is not limited to those described above.

Figure 19:
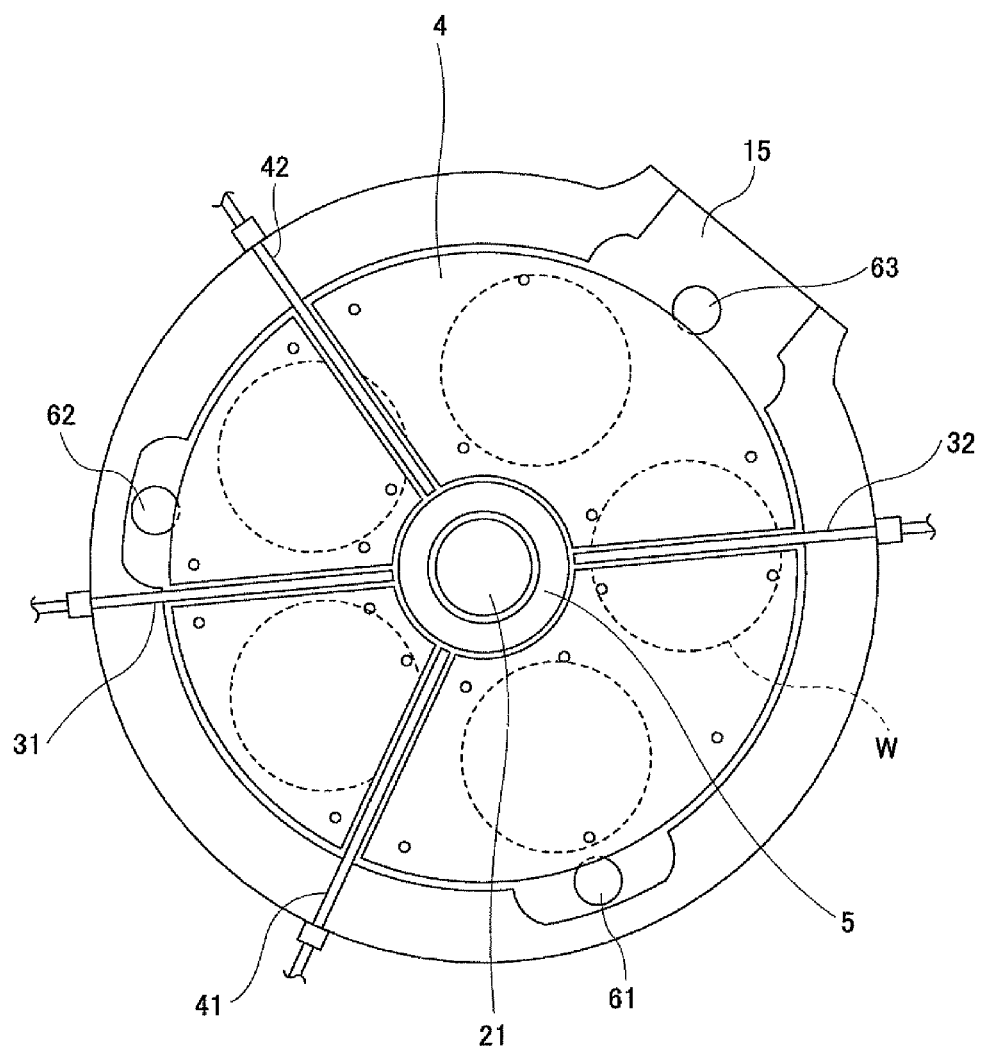
FIG. 19 is a top view showing yet another modification example of the film deposition apparatus of FIG. 13.

While the low ceiling surfaces (first ceiling surfaces) 44 are provided in order to create the thin space on both sides of the separation gas nozzle 41 (42) in the above embodiments, low ceiling surfaces may be provided on both sides of the reaction gas nozzle 31 (32) so that these ceiling surfaces are extended to reach the first ceiling surfaces 44, as shown in FIG. 19. In other words, the ceiling member 4 may be extended substantially entirely to oppose the turntable 2 except for positions where the separation gas nozzles 41 (42) and the reaction gas nozzles 31 (32) are arranged. Even in such a configuration, the same separation effect can be demonstrated. When this type of ceiling member 4 is used, plural ceiling members 4 having different shapes are prepared; one of the ceiling members 4 is selected in accordance with the positions of the reaction gas nozzles 31, 32 and the size of the process areas S1, S2; the separation gas nozzles 41, 42 are attached via the corresponding mounting holes; and the selected ceiling member 4 is attached to the ceiling plate 11. Alternatively, when the cover member 82 is used, plural cover members 82 with the ceiling members 4 having different shapes are prepared; one of the cover members 82 is selected in accordance with the positions of the reaction gas nozzles 31, 32 and the size of the process areas S1, S2; the separation gas nozzles 41, 42 are mounted via the corresponding mounting holes; and the selected cover member 82 is placed on the partition member 81.

In other words, according to such a type of the ceiling member, the first ceiling surface 44 located on both sides of the separation gas nozzle 41 (42) is extended to the reaction gas nozzle 31 (32). In this case, the separation gas spreads on both sides of the separation gas nozzle 41 (42) and the reaction gas spreads on both sides of the reaction gas nozzle 31 (32). Then, the separation gas and the reaction gas flow into each other below the ceiling member 4 (in the thin space) and are evacuated through the evacuation port 61 (62) located between the separation gas nozzle 31 (32) and the reaction gas nozzle 42 (41).

Third Embodiment

Figure 21:
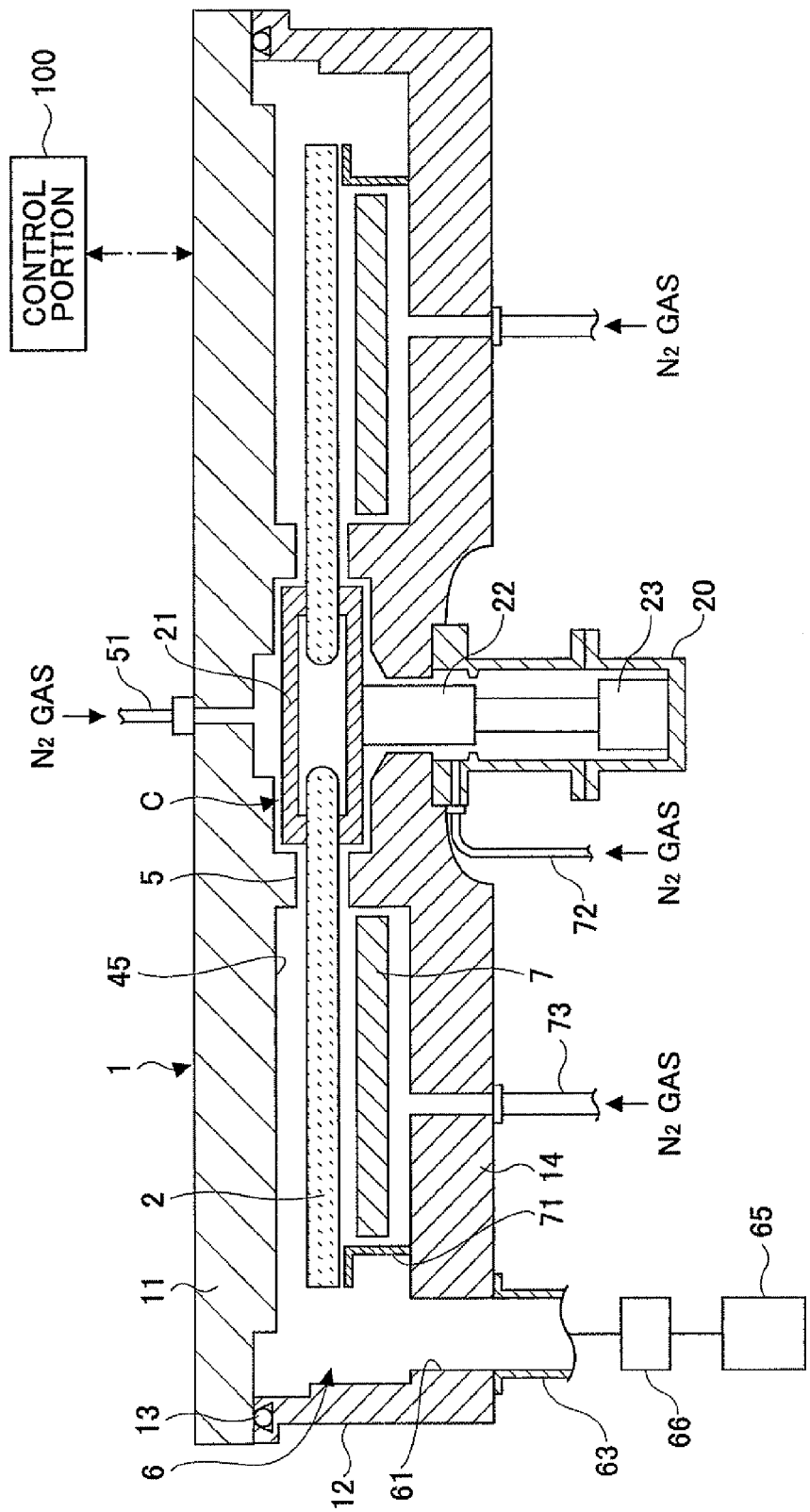
FIG. 21 is a cut-away diagram taken along I-I' line in FIG. 23, showing a film deposition apparatus according to an embodiment of the present invention.
Figure 22:
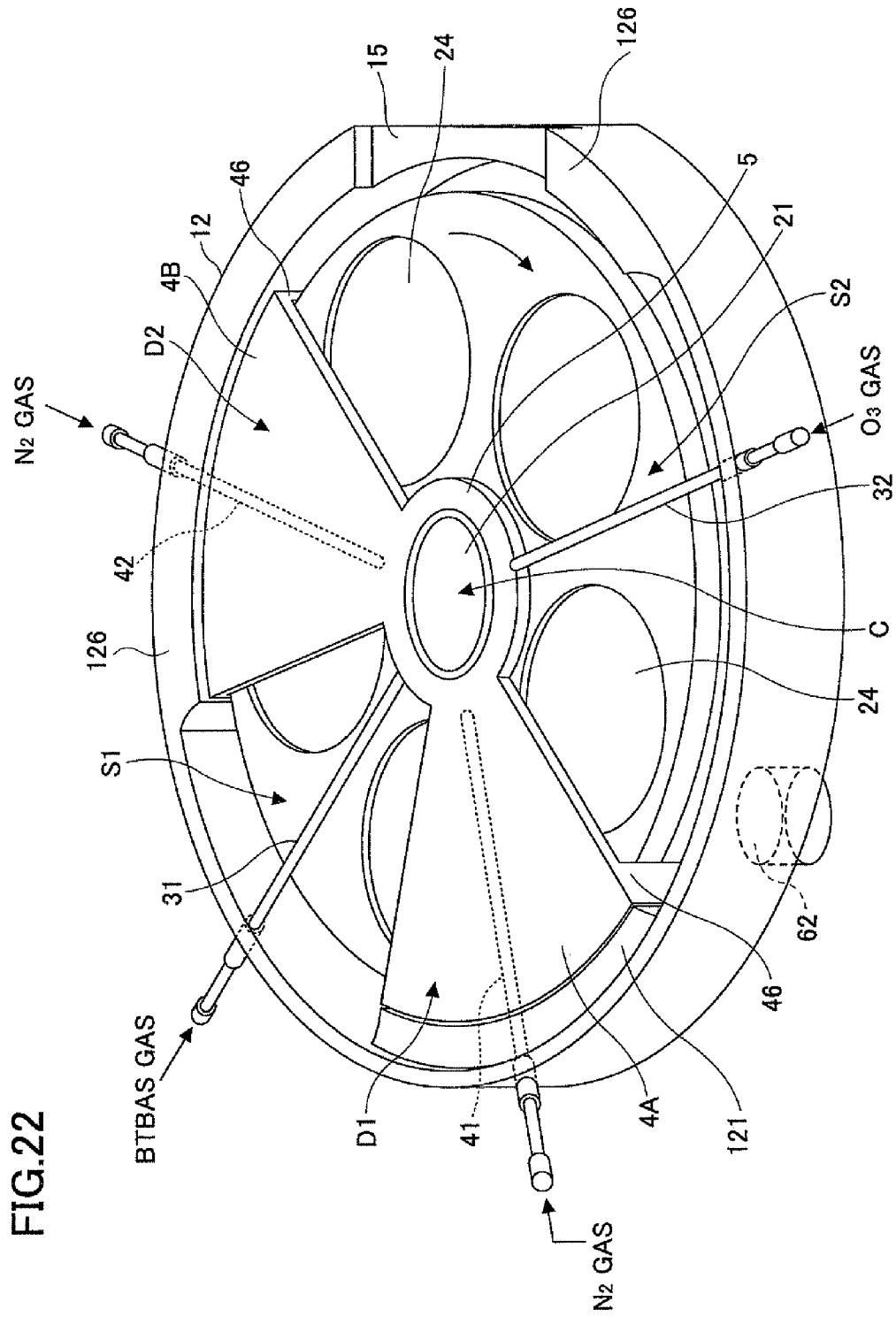
FIG. 22 is a perspective view of the film deposition apparatus of FIG. 21.

A third embodiment of the present invention is explained in reference to FIGS. 21 through 40. Referring to FIGS. 21 and 22, the plural mounting holes P1 through P12 for attaching the reaction gas nozzles 31, 32 and the separation gas nozzles 41, 42 to the chamber body 12 are not shown and the reaction gas nozzle 31, the separation gas nozzle 42, the reaction gas nozzle 32, and the separation gas nozzle 41 are attached in positions corresponding to the mounting holes P8, P10, P3, and P6, respectively. The following explanation mainly focuses on differences between a film deposition apparatus according to the third embodiment and the film deposition apparatuses according to the first and the second embodiments.

Figure 23:
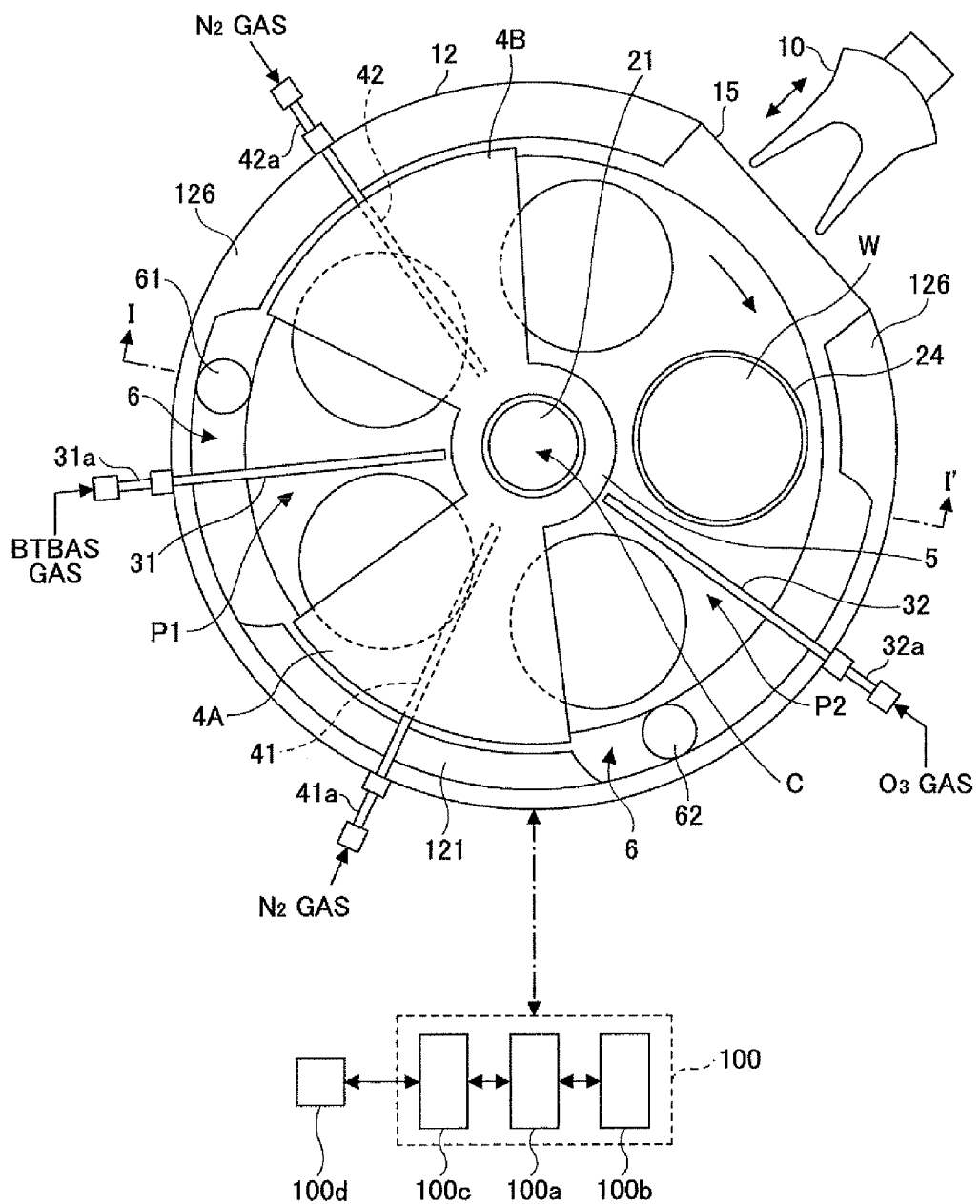
FIG. 23 is a plan view of the film deposition apparatus of FIG. 21.
Figure 24:
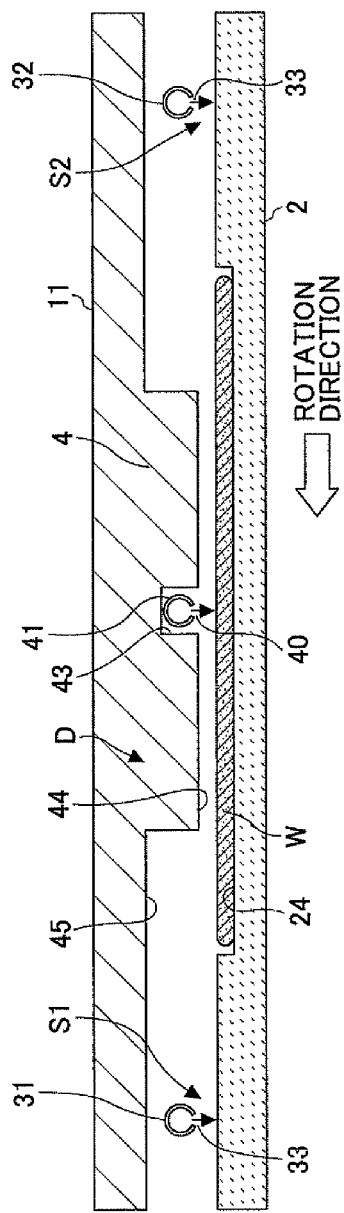
FIG. 24A is a developed cross-sectional view showing a separation area and process areas in the film deposition apparatus of FIG. 21.
FIG. 24B is another developed cross-sectional view showing a separation area and process areas in the film deposition apparatus of FIG. 21.
Figure 25:
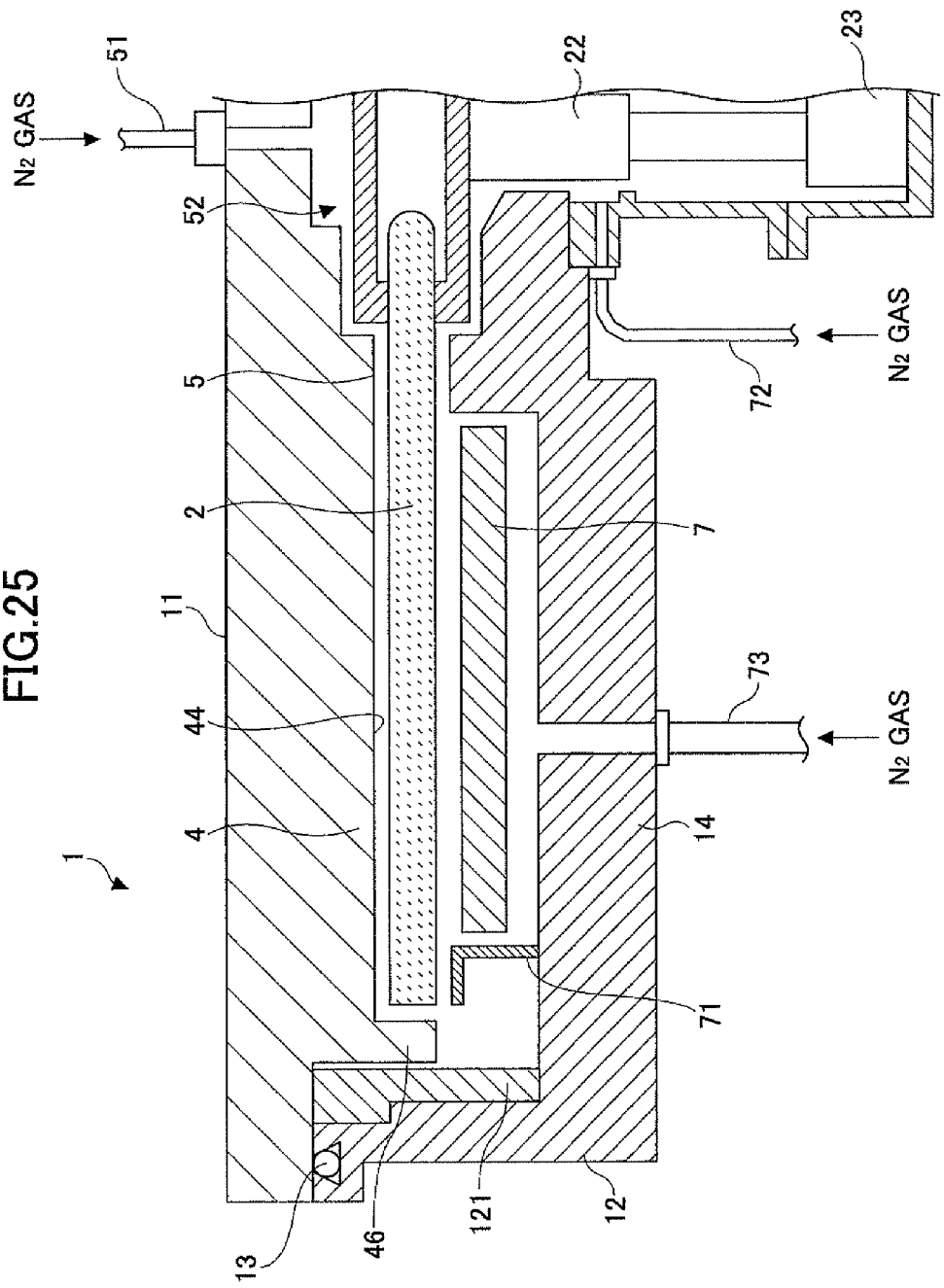
FIG. 25 is a cut-away diagram showing a separation area in the film deposition apparatus of FIG. 21.

Referring to FIG. 23, the chamber body 12 is provided with protrusion wall portions 121, 126 along the inner circumferential surface of the chamber body 12. With this, a thickness of the circumferential wall of the chamber body 12 is apparently thick in areas corresponding to the protrusion wall portions 121, 126 and thin in other areas. In this embodiment, the protrusion wall portions 121, 126 are provided in areas corresponding to the outer circumferential surface of the ceiling member 4 and on both sides of the transfer opening 15. The protrusion wall portions 121, 126 provided opposing the ceiling member 4 (specifically, the bent portion 46 (FIG. 22)) in order to impede the first (second) reaction gas from entering the second (first) process area S2 (S1) through the gap between the outer circumferential surface of the turntable 2 and the inner circumferential surface of the chamber body 12 and thus from being mixed with the second (first) reaction gas. The narrow gap between the outer circumferential surface of the bent portion 46 and the inner circumferential surface of the protrusion wall portions 121, 126 may be set to be the same as the height h of the ceiling member 4 from the turntable 2. A positional relationship between the protrusion wall portion 121 and the bent portion 46 is better illustrated in FIGS. 25 and 26.

In this embodiment, at least one of the protrusion wall portions 121, 126 is removably attached to the chamber body 12. Therefore, plural wall portions 121, 126 having different arc lengths and/or thicknesses (along the radial direction of the chamber body 12) may be prepared; one of the plural protrusion wall portions 121, 126 may be selected depending on the reaction gases or process conditions; and the selected protrusion wall portion 121 (126) may be attached to the chamber body 12. In addition, positions of the protrusion wall portions 121, 126 in the chamber body 12 may be changed in accordance with the reaction gases and/or process conditions.

While the protrusion wall portions 121, 126 are arranged in the separation areas D along the inner circumferential surface of the chamber body 12, there is a relatively large space between the outer circumferential surface of the turntable 2 and the inner circumferential surface of the chamber body 12 in areas except for the separation areas D. Namely, the evacuation areas 6 are created in the same manner as the first and the second embodiments. Along with the inner circumferential surface of the chamber body 12, the outer circumferential surface of the turntable 2, the cover member 7, and the like, the protrusion wall portions 121, 126 define (the size and/or shape of) the evacuation areas 6. Below the evacuation areas 6, the evacuation ports 61, 62 are formed as shown in FIGS. 22 and 23. As shown in FIG. 21, the evacuation ports 61, 62 are connected to the vacuum pump 65 provided in common as an evacuation unit via corresponding evacuation pipes 63. Reference numeral "66" in FIG. 21 is a pressure control unit provided in a predetermined position of the evacuation pipe 63. Plural pressure control units 66 may be provided to the corresponding evacuation ports 61, 62. Alternatively, one pressure control unit 66 may be used in common for the three evacuation ports 61, 62. In addition, four or more evacuation ports may be provided.

The evacuation ports 61, 62 are arranged downstream relative to the rotation direction of the turntable 2 with respect to the reaction gas nozzles 31, 32, respectively, in order to assure the separation effect for impeding the reaction gases from being mixed. Due to such arrangement, the BTBAS gas is substantially exclusively evacuated along with the separation gases from the separation area D and the center area C through the evacuation port 61; and the $O_3$ gas is substantially exclusively evacuated along with the separation gases from the separation area D and the center area C through the evacuation port 62. In the illustrated example, the evacuation port 61 corresponds to a first evacuation port provided between the first reaction nozzle 31 and the separation area D located downstream relative to the rotation direction with respect to the first reaction nozzle 31; and the evacuation port 62 corresponds to a second evacuation port provided between the second reaction nozzle 32 and the separation area D located downstream relative to the rotation direction with respect to the second reaction nozzle 32.

Although the two evacuation ports 61, 62 are made in the bottom portion 14 of the chamber body 12 in this embodiment, three evacuation ports may be provided in other embodiments. For example, an additional evacuation port may be made in an area between the second reaction gas nozzle 32 and the separation area D located upstream relative to the clockwise rotation of the turntable 2 with respect to the second reaction gas nozzle 32. In addition, a further additional evacuation port (four ports in total, for example) may be made in a predetermined position of the chamber body 12.

In addition, the evacuation ports 61, 62 may be formed in the circumferential wall of the chamber body 12, as described above.

In addition, the ceiling member 4 may be formed integrally with the ceiling plate 11 in this embodiment as shown in FIGS. 24A and 24B. In this case, the height h of the first ceiling surface 44 from the turntable 2 may be the same as explained in reference to FIGS. 12A and 12B, thereby demonstrating the same effect as described.

Figure 27:
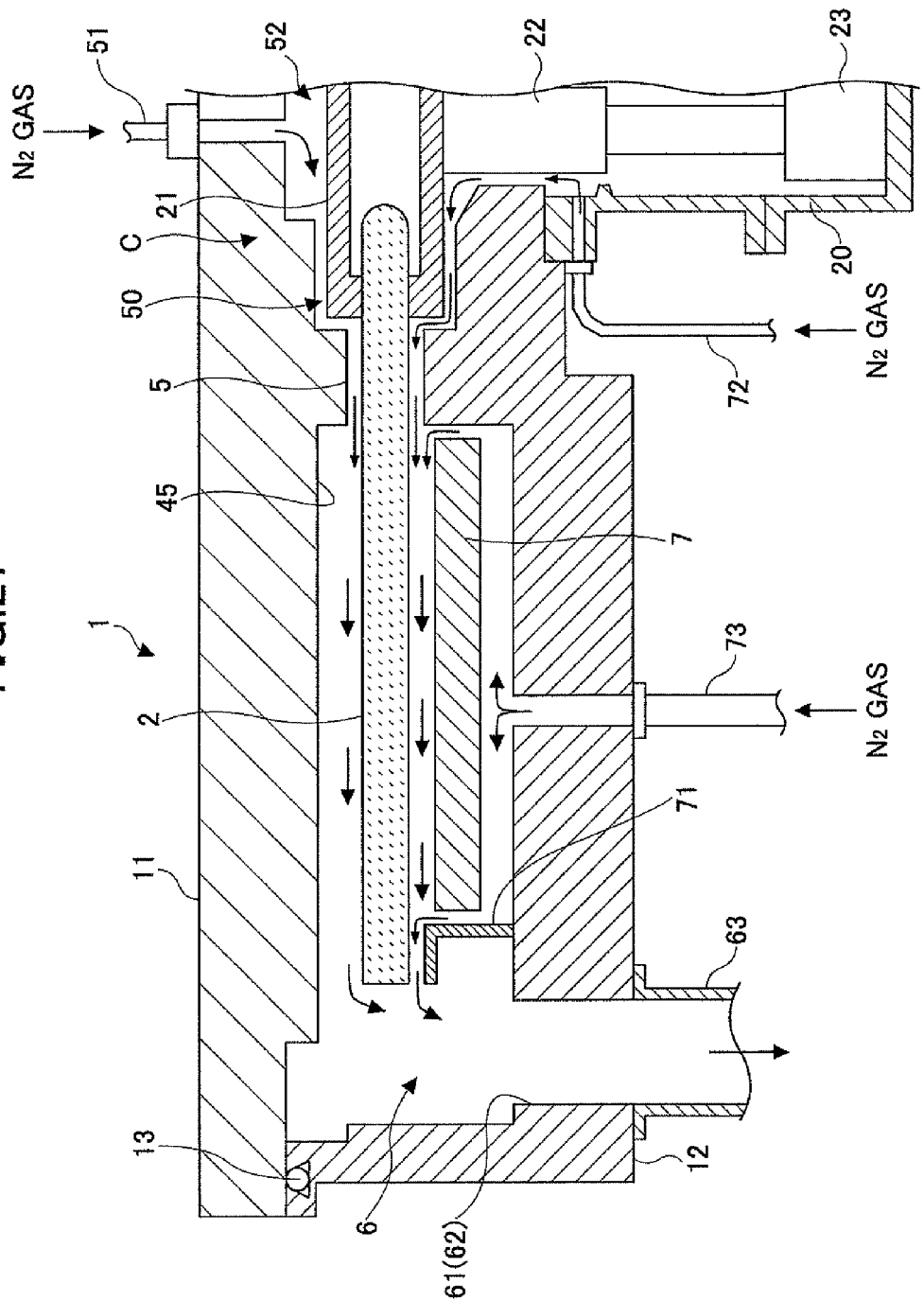
FIG. 27 is an explanatory view for explaining gas flow patterns of separation gas and purge gas.

Referring to FIG. 27, a space from the case body 20 through the heater unit housing space for housing the heater unit 7 is purged with $N_2$ gas from the purge gas supplying pipes 72, 73, and the purge gas is evacuated from the evacuation ports 61, 62 through the gap between the turntable 2 and the cover member 7, and the evacuation areas 6. With this, the first (second) reaction gas is impeded from entering the second (first) process area S2 (S1) through the gap between the outer circumferential surface of the turntable 2 and the inner circumferential surface of the chamber body 12 through the space below the turntable 2, and thus from being mixed with the second (first) reaction gas. In other words, the purge gas from the purge gas supplying pipes 72, 73 serve as the separation gas. In FIG. 27, a gas flow pattern of the $N_2$ gas supplied from the separation gas supplying pipe 51 is also illustrated. As shown, the $N_2$ gas from the separation gas supplying pipe 51 flows into the thin gap 50 from the space 52, and along the upper surface of the turntable 2 into the evacuation area 6, thereby impeding the reaction gases from flowing into the space 52.

Operations of the film deposition apparatus (film deposition method) according to the third embodiment includes the wafer loading step, the film deposition step, and the wafer unloading step in the first embodiment, and repetitive explanations are omitted.

Figure 28:
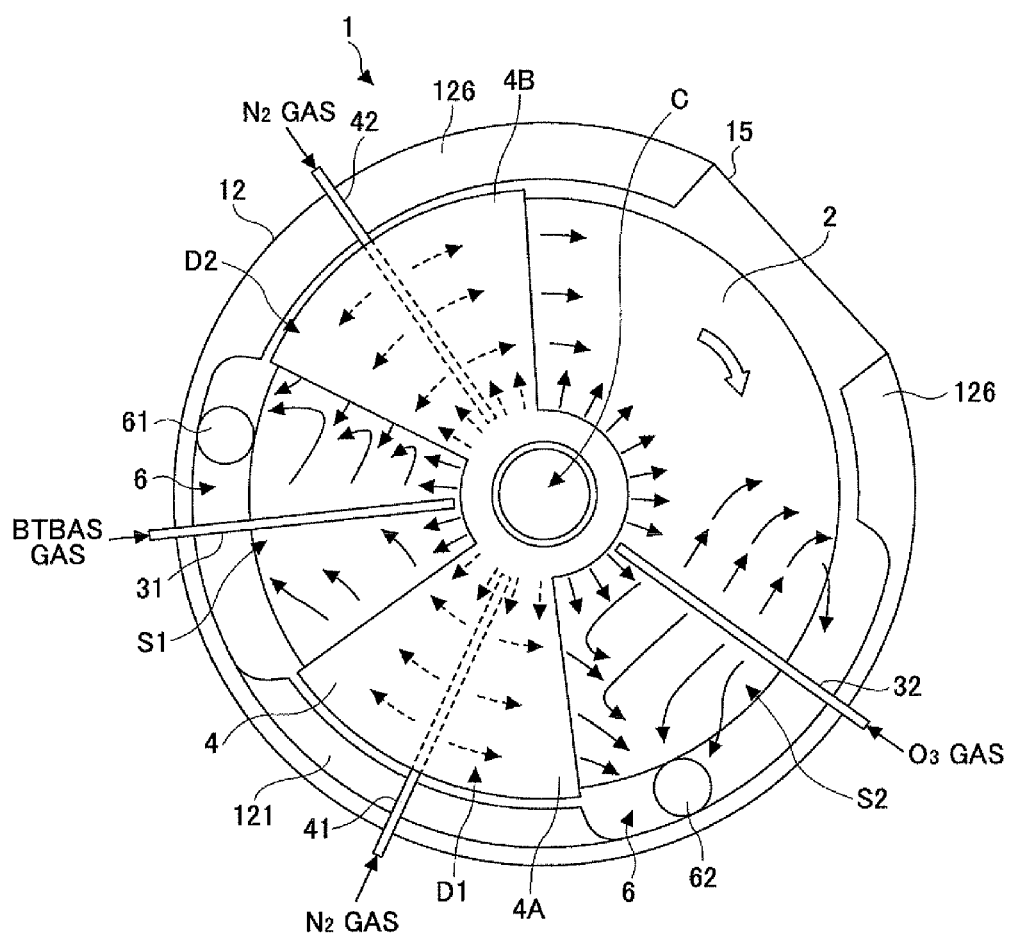
FIG. 28 is an explanatory view for explaining gas flow patterns of a first and a second reaction gases.

Next, a gas flow pattern in the vacuum chamber 1 during the film deposition step is explained in reference to FIG. 28. Part of the $O_3$ gas ejected downward from the second reaction gas nozzle 32 hits and flows along the upper surface of the turntable 2 (and the surface of the wafer W) in a direction opposite to the rotation direction of the turntable 2. Then, the $O_3$ gas is pushed back by the $N_2$ gas flowing along the rotation direction, and changes the flow direction toward the edge of the turntable 2 and the inner circumferential surface of the chamber body 12. Finally, this part of the $O_3$ gas flows into the evacuation area 6 and is evacuated from the vacuum chamber 1 through the evacuation port 62.

Another part of the $O_3$ gas ejected downward from the second reaction gas nozzle 32 hits and flows along the upper surface of the turntable 2 (and the surface of the wafers W) in the same direction as the rotation direction of the turntable 2. This part of the $O_3$ gas mainly flows toward the evacuation area 6 due to the $N_2$ gas flowing from the center portion C and suction force through the evacuation port 62. On the other hand, a small portion of this part of the $O_3$ gas flows toward the separation area D1 located downstream of the rotation direction of the turntable 2 in relation to the second reaction gas nozzle 32 and may enter the gap between the ceiling member 4A and the turntable 2. However, because the height h and the circumferential length of the gap are designed so that the $O_3$ gas is impeded from flowing into the gap under the film deposition conditions intended, the small portion of the $O_3$ gas cannot flow into the gap below the ceiling member 4A. Even when a small fraction of the $O_3$ gas flows into the gap, the fraction of the $O_3$ gas cannot flow farther into the separation area D1, because the fraction of the $O_3$ gas is pushed backward by the $N_2$ gas ejected from the separation gas nozzle 41. Then, substantially all the part of the $O_3$ gas flowing along the upper surface of the turntable 2 in the rotation direction flows into the evacuation area 6 through between the outer circumferential surface of the turntable 2 and the inner circumferential surface of the chamber body 12, and is evacuated through the evacuation port 62 along with the $N_2$ gas ejected from the center area C, as shown in FIG. 28.

Similarly, the BTBAS gas ejected from the first reaction gas nozzle 31 to flow along the top surface of the turntable 2 (and the surface of the wafers W) in the rotation direction of the turntable 2 and the opposite direction cannot flow into the gaps below the ceiling members 4B, 4A located upstream and downstream of the rotation direction, respectively. Alternatively, even when a fraction of the BTBAS gas enters the gaps, the fraction of the BTBAS gas is pushed backward to the process areas P1, P2. Then, the BTBAS gas flows into the evacuation area 6 between the outer circumferential surface of the turntable 2 and the inner circumferential surface of the chamber body 1, and is evacuated through the evacuation port 61 along with the $N_2$ gas ejected from the center area C.

As described above, the BTBAS gas and the $O_3$ gas are impeded from entering the separation areas D1, D2, respectively. However, the BTBAS molecules and the $O_3$ molecules adsorbed on the wafer W are allowed to go through the separation areas D1, D2 (below the lower ceiling surfaces 44), contributing to the film deposition.

Additionally, the BTBAS gas in the first process area S1 (the $O_3$ gas in the second process area S2) is impeded from flowing into the center area C, because the separation gas is ejected toward the outer circumferential edge of the turntable 2 from the center area C, as shown in FIGS. 27 and 28. Even if a fraction of the BTBAS gas in the first process area S1 (the $O_3$ gas in the second process area S2) flows into the center area C, the BTBAS gas (the $O_3$ gas) is pushed backward, so that the BTBAS gas in the first process area S1 (the $O_3$ gas in the second process area S2) is impeded from flowing into the second process area S2 (the first process area S1) through the center area C.

Moreover, because the bent portions 46 are formed downward from the ceiling members 4 so that the gaps between the bent portion 46 and the turntable 2 and between the bent portion 46 and the inner circumferential surface of the chamber body 12 are made narrow to substantially avoid pressure communication between the two process areas S1, S2, the BTBAS gas in the first process area P1 (the $O_3$ gas in the second process area P2) is impeded from flowing into the second process area P2 (the first process area P1) through the two gaps. Therefore, the two separation areas D separate the first process area P1 and the second process area P2, and the BTBAS gas flows into the evacuation port 61, and the $O_3$ gas flows into the evacuation port 62. As a result, the BTBAS gas and the $O_3$ gas cannot be mixed in a gas phase. Moreover, the BTBAS gas ($O_3$ gas) flowing into the evacuation area 6 cannot flow into the second (first) process area S2 (S1) through the space below the turntable 2, because the space is purged with the $N_2$ gas from the purge gas supplying pipes 72, 73.

Regarding the process parameters, those listed in the first embodiment are also used in the third embodiment.

In the film deposition apparatus according to the third embodiment, the size of the process areas S1, S2 and the separation areas D as well as the positions of the reaction gas nozzles 31, 32 may be changed in accordance with the film to be deposited, the reaction gases to be used, and the process conditions. In order to complement such flexibility, the protrusion wall portion 121 is removably attached to the chamber body 12, or replaceable in this embodiment. Namely, the length, thickness, and position of the protrusion wall portion 121 can be changed by replacing the protrusion wall portions 121.

Figure 29:
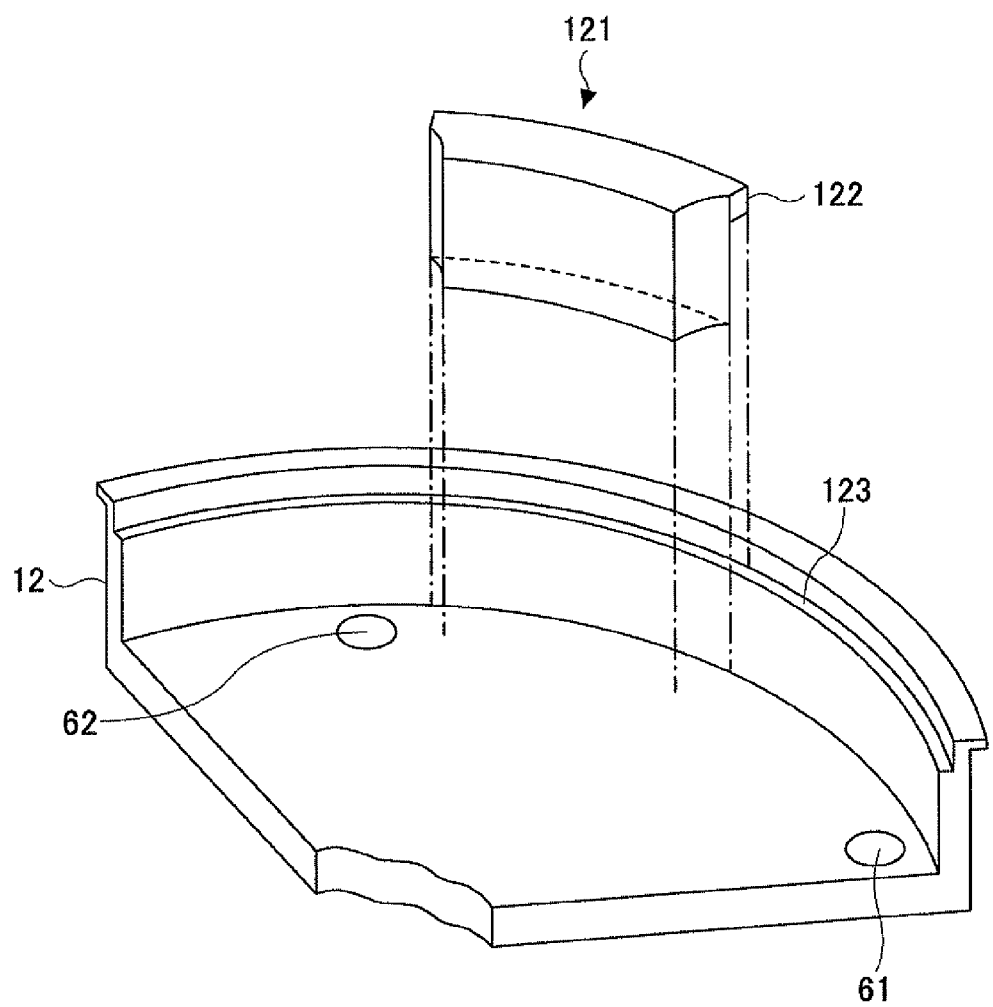
FIG. 29 is a perspective view of a detachable protrusion wall portion in the film deposition apparatus of FIG. 21.

Referring to FIG. 29, the replaceable protrusion wall portion 121 is explained. This protrusion wall portion 121 is arranged in a position corresponding to the ceiling member 4A located downstream relative to the rotation direction of the turntable 2 with respect to the second reaction gas nozzle 32 as shown in FIG. 28 in this embodiment. The protrusion wall portion 121 is an independent member separable from the chamber body 12, as shown in FIG. 29, and can be inserted between the bent portion 46 (not shown in FIG. 29) of the ceiling member 4A and the inner circumferential surface of the chamber body 12.

The protrusion wall portion 121 has a top-view shape of a truncated sector having a curved inner surface opposite to the outer curved surface of the sector. In other words, the protrusion wall portion 121 has a shape obtained by cutting a circumferential wall of a cylinder along the radial direction. The outer curved surface of the protrusion wall portion 121 has the same curvature as the inner circumferential surface of the chamber body 12 so that the outer curved surface entirely contacts the inner circumferential surface of the chamber body 12. The inner curved surface of the protrusion wall portion 121 has the same curvature as the outer circumferential surface of the turntable 2. The protrusion wall portion 121 has a thickness (length measured along the radial direction of the chamber body 12) so that the inner curved surface faces the outer circumferential surface of the bent portion 46, leaving a narrow gap, which may be the same as the height h of the ceiling member 4, with respect to the outer circumferential surface of the bent portion 46.

The two side walls of the protrusion wall portion 121 are concavely curved and an arc length of the protrusion wall portion 121 (along the circumferential direction) becomes longer in positions closer to the outer curved surface of the protrusion wall portion 121. The protrusion wall portion 12 sits on the upper surface of the bottom portion 14 of the chamber body 12 and may have a height comparable to the height from the upper surface of the bottom portion 14 of the chamber body 12 to the upper surface of the ceiling member 4.

Figure 30:
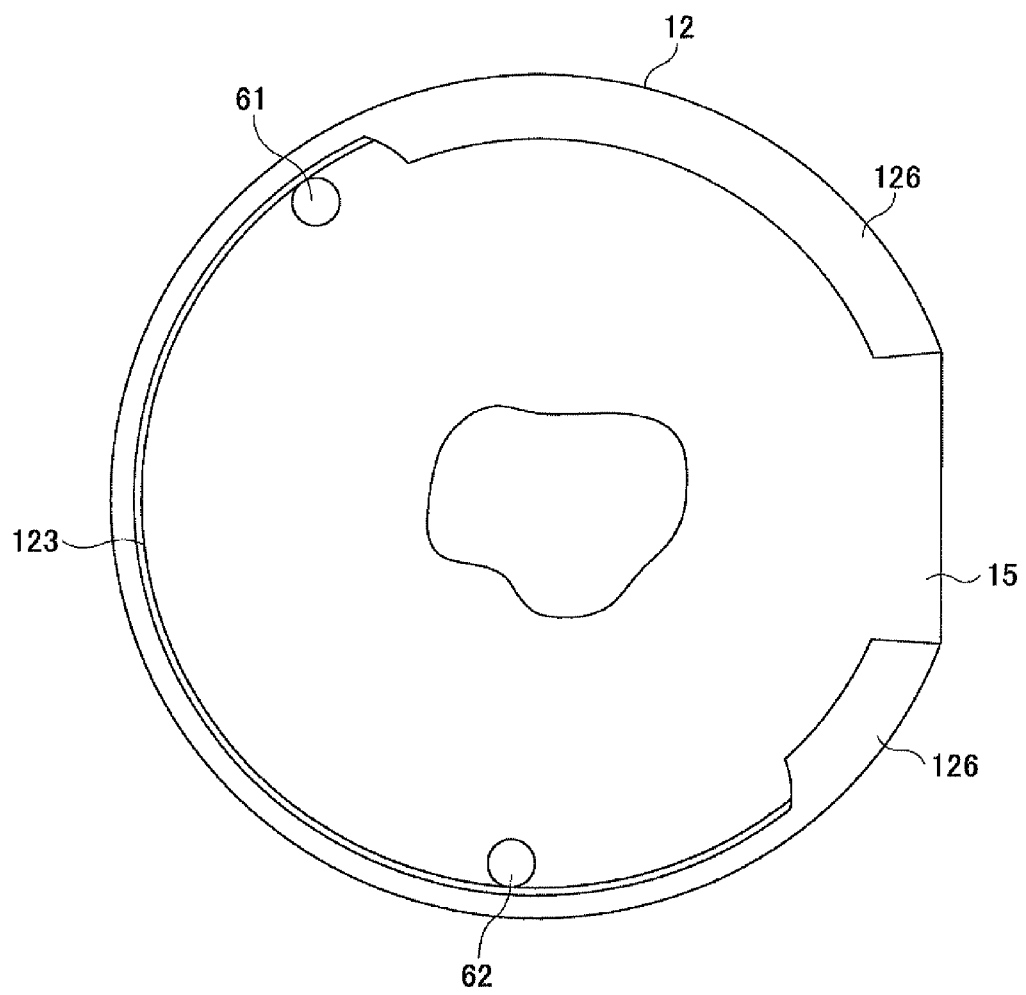
FIG. 30 is a plan view of a vacuum chamber of the film deposition apparatus of FIG. 21.

Referring to FIG. 29, the protrusion wall portion 121 is provided at the top with a flange portion 122 extended outward, and the circumferential wall of the chamber body 12 is provided with a step portion 123. The step portion 123 has a shape that allows the flange portion 122 of the protrusion wall portion 121 to sit on the step portion 123. The step portion 123 extends along the inner circumferential surface of the chamber body 12 from one of the fixed protrusion wall portions 126 to the other protrusion wall portion 126, as shown in FIG. 30. The step portion 123 is omitted in FIG. 23 and the like.

Figure 31:
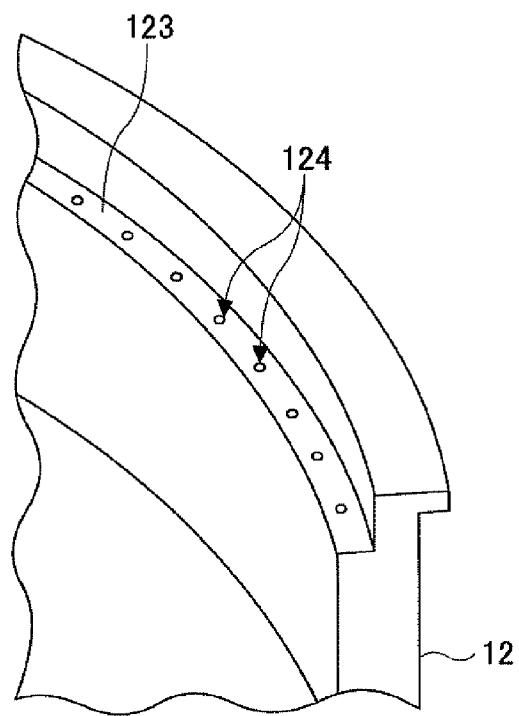
FIG. 31 is an enlarged perspective view of the vacuum chamber of the film deposition apparatus of FIG. 21.
Figure 32:
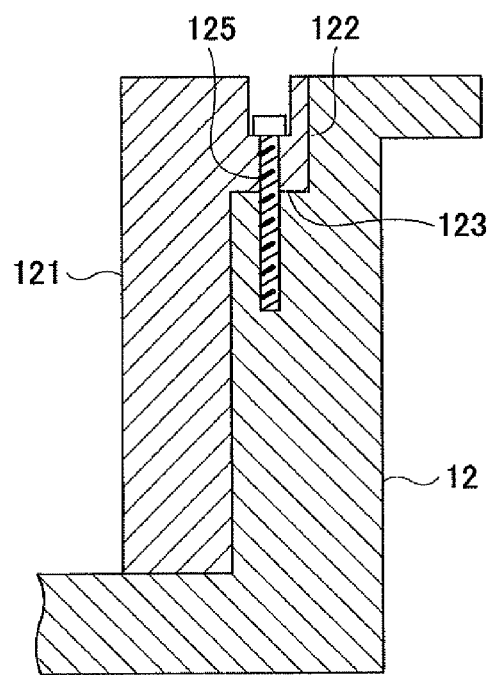
FIG. 32 is a cut-away diagram of the protrusion wall portion attached on an inner circumferential surface of the vacuum chamber of the film deposition apparatus of FIG. 21.

Referring to FIG. 31, the step portion 123 has plural threaded holes 124 arranged along the circumferential direction on the upper surface of the step portion 123. The holes 124 serve as a mounting portion for attaching the protrusion wall portion 121 to the chamber body 12. On the other hand, the flange portion 122 of the protrusion wall portion 121 has plural holes corresponding to the plural threaded holes 124 of the step portion 123. With such a configuration, the flange portion 122 is fixed on the step portion 123 by a screw 125, as shown in FIG. 32, so that the protrusion wall portion 121 is attached to the chamber body 12.

As stated, the protrusion wall portion 121 is inserted between the bent portion 46 of the ceiling member 4 and the inner circumferential surface of the chamber body 12 and fixed without touching the turntable 2, and can be removed. In addition, because the plural threaded holes 124 are provided in the step portion 123 and the corresponding holes are provided in the flange portion of the protrusion wall portion 121, the protrusion wall portion 121 may be attached at an arbitrary position in the chamber body 12, in accordance with the position of the ceiling member 4.

Figure 35A:
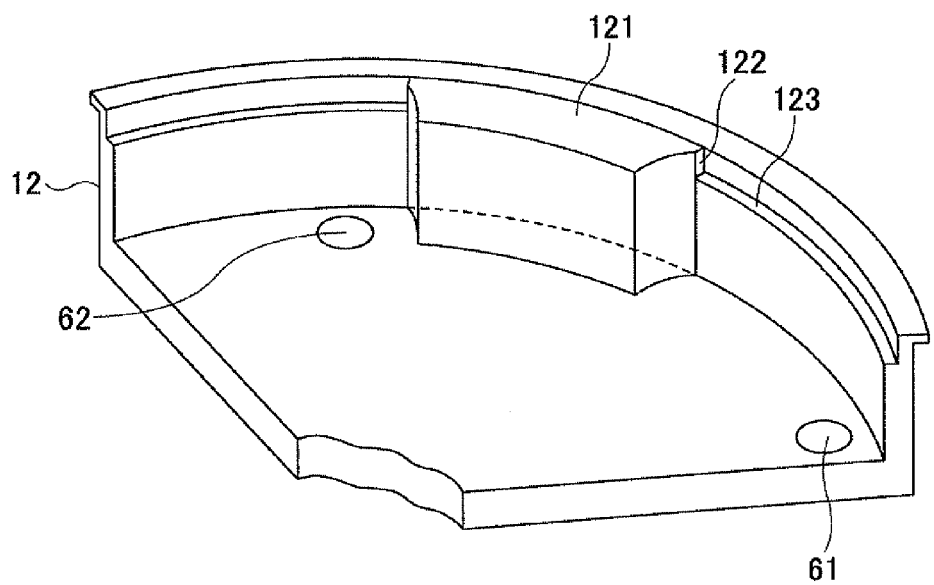
FIGS. 35A through 35C are partial perspective views of various protrusion wall portions.

Next, an advantage of the replaceable protrusion wall portion 121 is explained. As shown in FIGS. 23 and 35A, the protrusion wall portion 121 is arranged so that the width of the inner circumferential surface of the protrusion wall portion 121 (or length measured along the circumferential direction) is substantially equal to the width of the outer circumferential surface of the ceiling member 4A (specifically, the bent portion 46). When the ceiling member 4A needs to be replaced with a narrow ceiling member 4a as shown in FIG. 33, in accordance with, for example, a film to be deposited, reaction gases to be used, and process conditions, which widens the process areas S1, S2, the protrusion wall portion 121 can also be replaced with a narrow protrusion wall portion 127.

Figure 33:
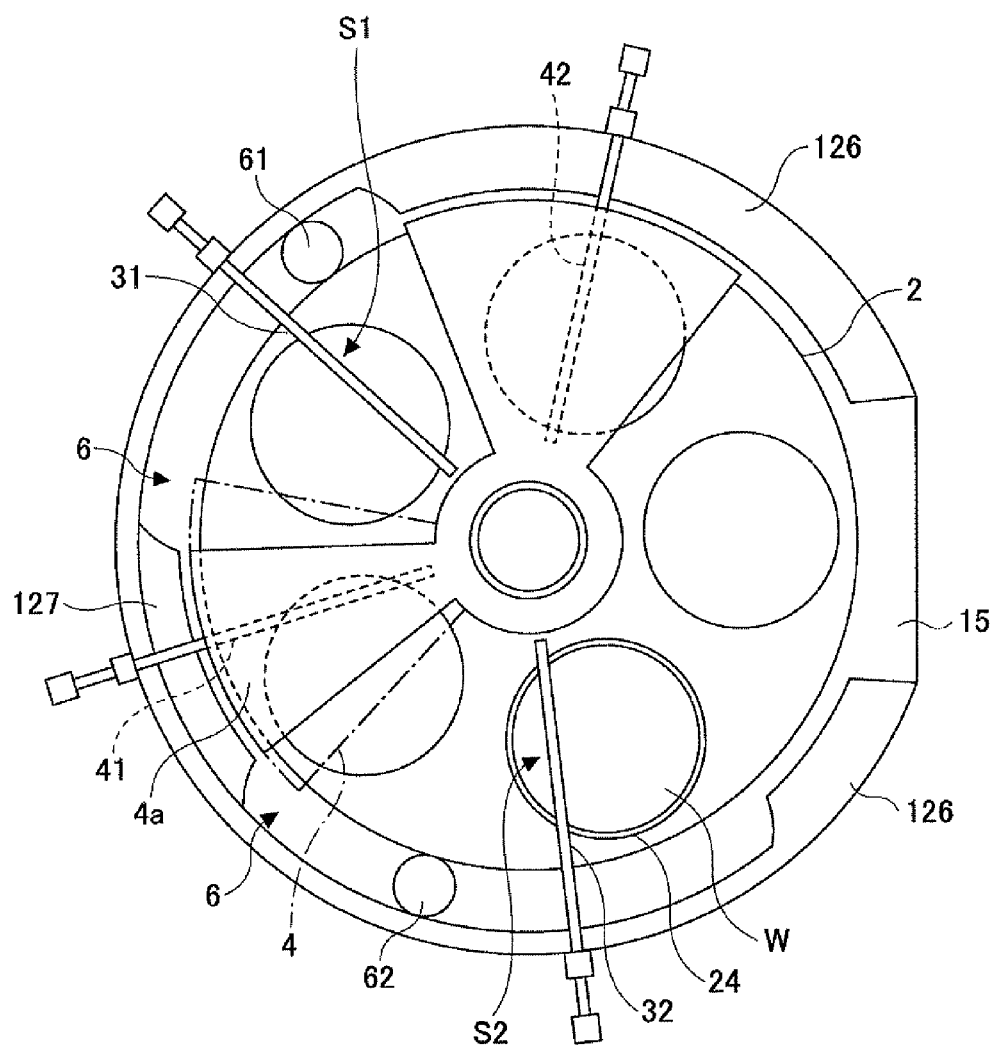
FIG. 33 is a top view of the vacuum chamber where the protrusion wall portion is attached.
Figure 34:
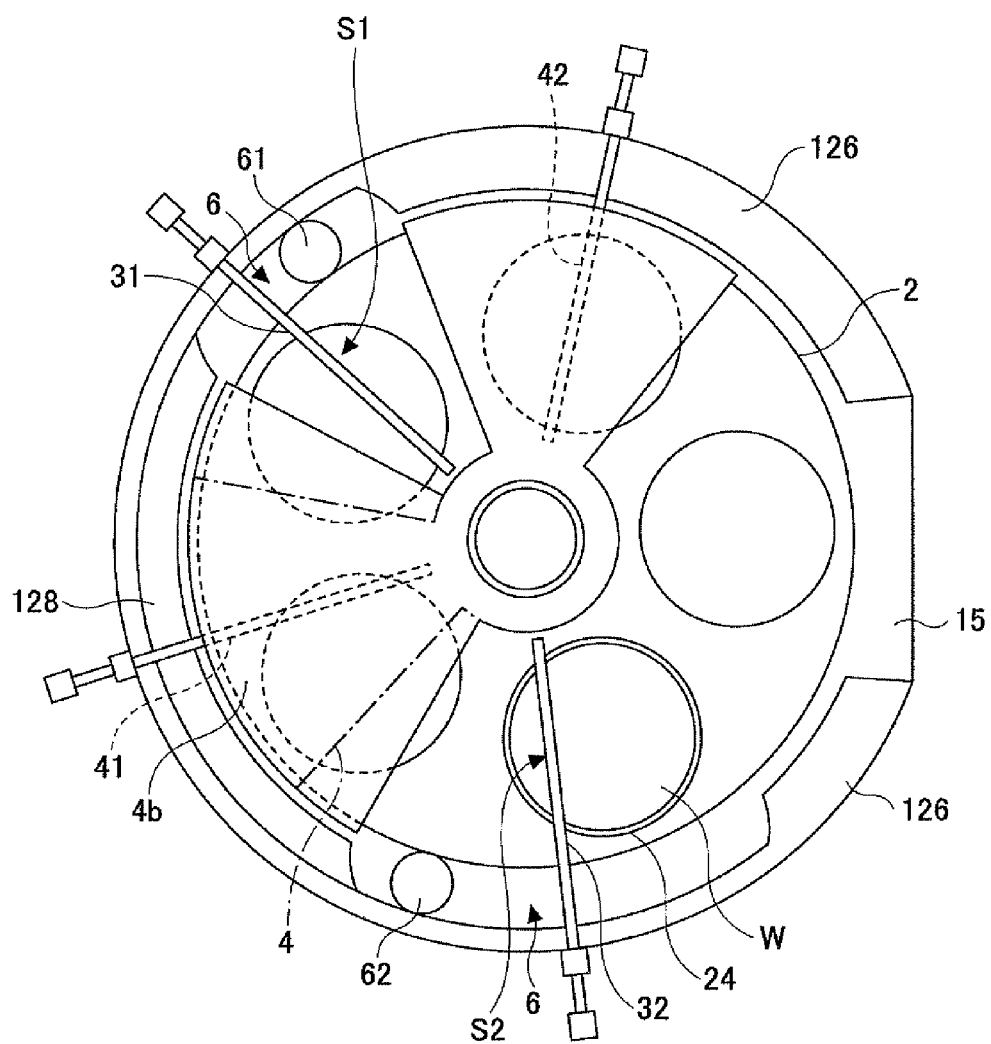
FIG. 34 is another top view of the vacuum chamber where the protrusion wall portion is attached.
Figure 35B:
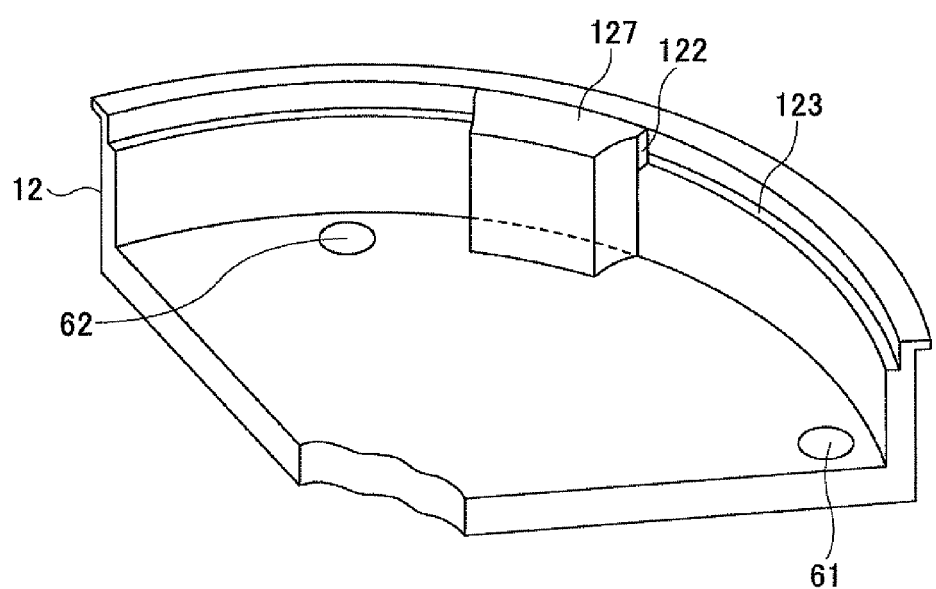

In this case, because the protrusion wall portion 127 is attached as shown in FIG. 35B and has a width (an arc length of the inner circumferential surface of the protrusion wall portion 127) corresponding to the ceiling member 4A as shown in FIG. 33, the size of the evacuation area 6 can be enlarged.

Figure 35C:
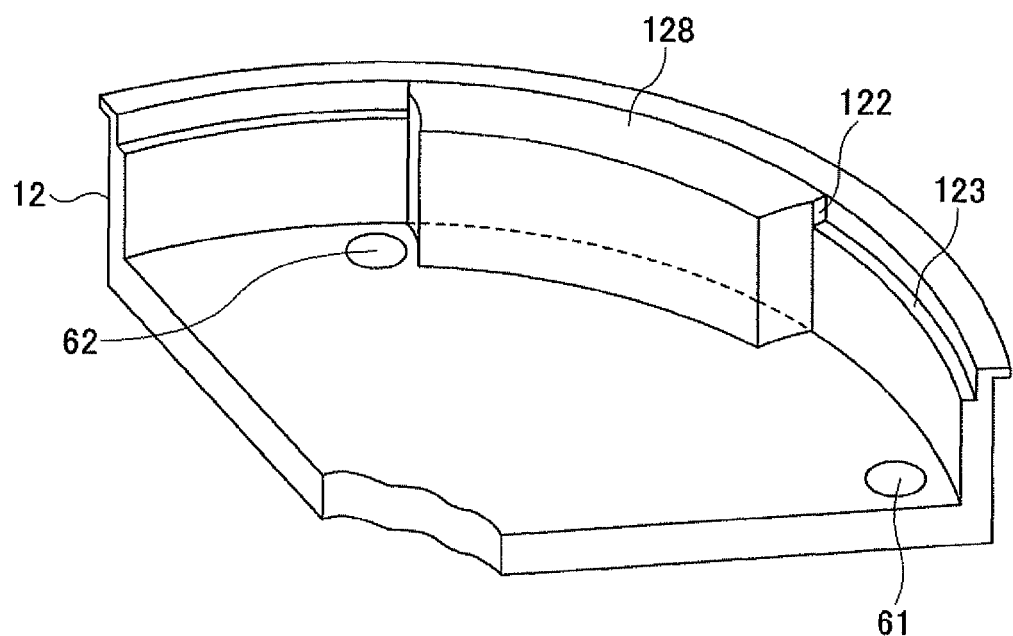

In addition, when a wider ceiling member 4b is used instead of the ceiling member 4A shown by a dashed line in FIG. 35, a wider protrusion wall portion 128 may be used instead of the protrusion wall portions 127, 121, so that the width (arc length) of the protrusion wall portion 128 is equal to the width (arc length) of the outer circumferential surface of the ceiling member 4b (bent portion 46).

Even in this embodiment, the ceiling members 4 (4A, 4B, 4a, 4b) have the sector shape portion, and the bent portion 46 that is integrally coupled to the sector shape portion, as explained in the first embodiment in reference to FIGS. 4 and 6, and are attached to the lower surface of the ceiling plate 11 with the screws 47. Namely, the ceiling members 4 (4A, 4B, 4a, 4b) are removably attached to the ceiling plate 11. Therefore, the size of the separation area D can be changed by selecting the ceiling member 4 from plural ceiling members 4 having different sizes/shapes prepared in advance and attaching the selected ceiling member 4 to the ceiling plate 11, in accordance with the processes.

Figure 36:
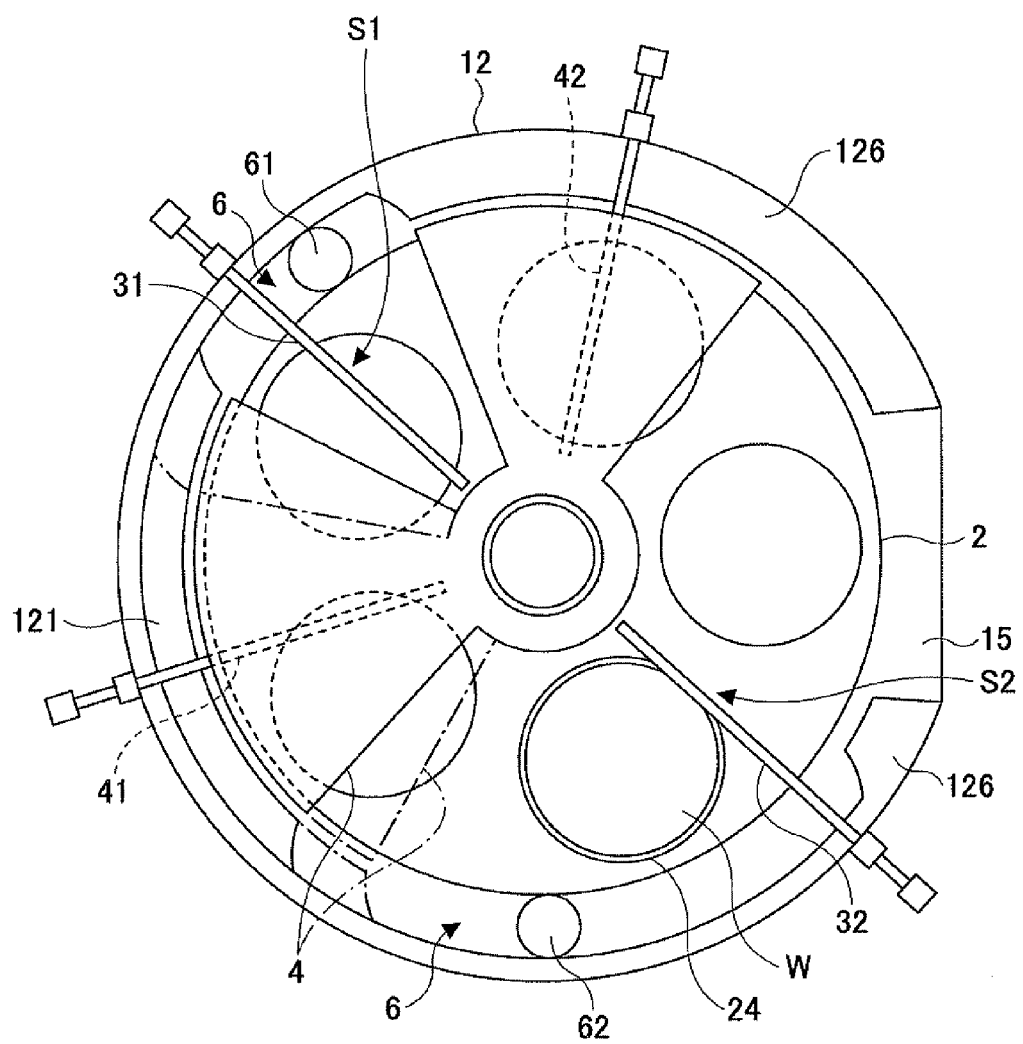
FIG. 36 is a top view of the vacuum chamber where another protrusion wall portion is attached.

In addition, the position of the ceiling member 4 may be changed without changing the size of the ceiling member 4, as shown in FIG. 36. Even in this case, the protrusion wall portion 121 can also be shifted in accordance with the position of the ceiling member 4. In FIG. 36, the original positions of the ceiling member 4 and the protrusion wall portions 121 (before changing positions) are shown by a dashed line.

The film deposition apparatus according to the third embodiment has the following advantages, in addition to the same advantages of the film deposition apparatuses according to the first and the second embodiments of the present invention. Because at least one protrusion wall portion that protrudes inward from the inner circumferential surface of the chamber body 12 is replaceably arranged in the chamber body 12 of the vacuum chamber 1, the position and the size (width, thickness) of the protrusion wall portion can be changed in accordance with, for example, the process conditions. Therefore, the size of the process areas S1, S2 and the evacuation areas 6 can be controlled without changing the vacuum chamber 1 as a whole, thereby flexibly, inexpensively modifying the film deposition apparatus.

Figure 37:
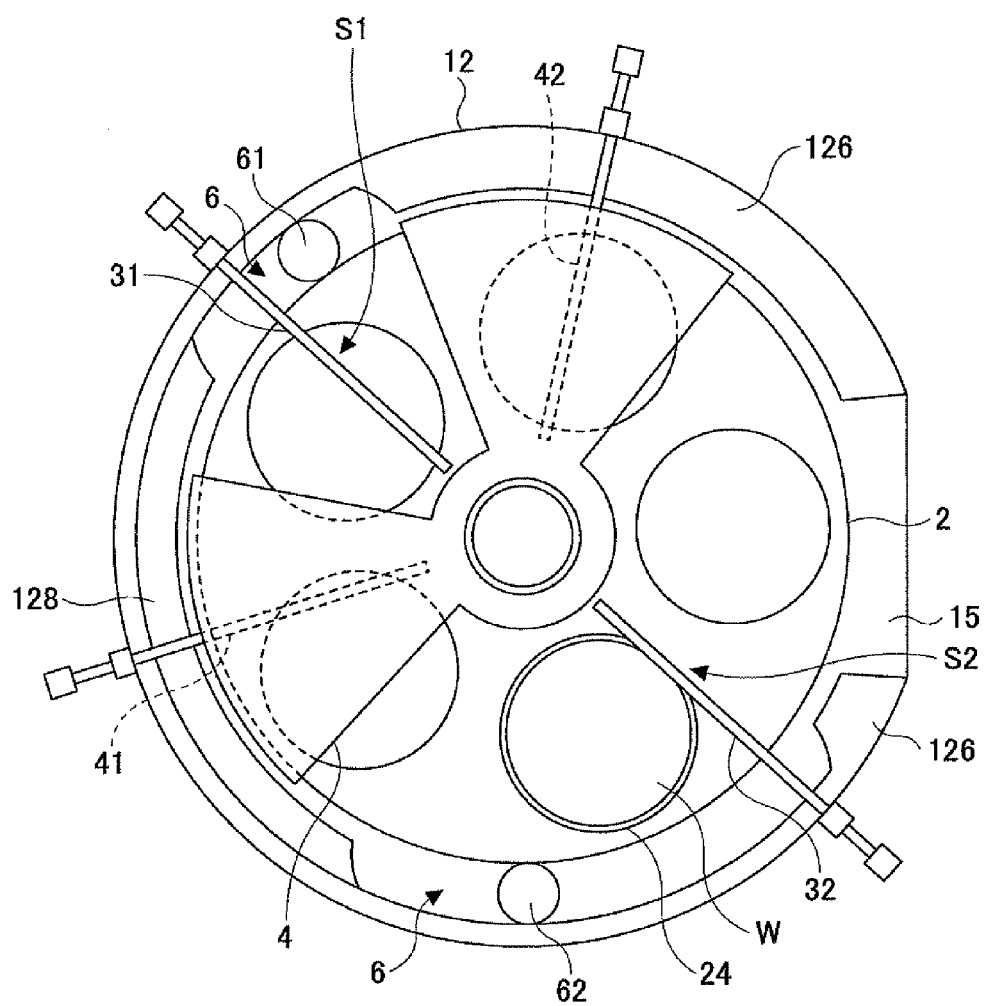
FIG. 37 is a top view of a modification example of the film deposition apparatus of FIG. 21.

The width (arc length) of the protrusion wall portion 121 is not always equal to the length of the outer circumference of the ceiling member 4. For example, the protrusion wall portion 128 may extend wider than the ceiling member 4 in order to independently change the size of the evacuation areas 6, as shown in FIG. 37.

Figure 38:
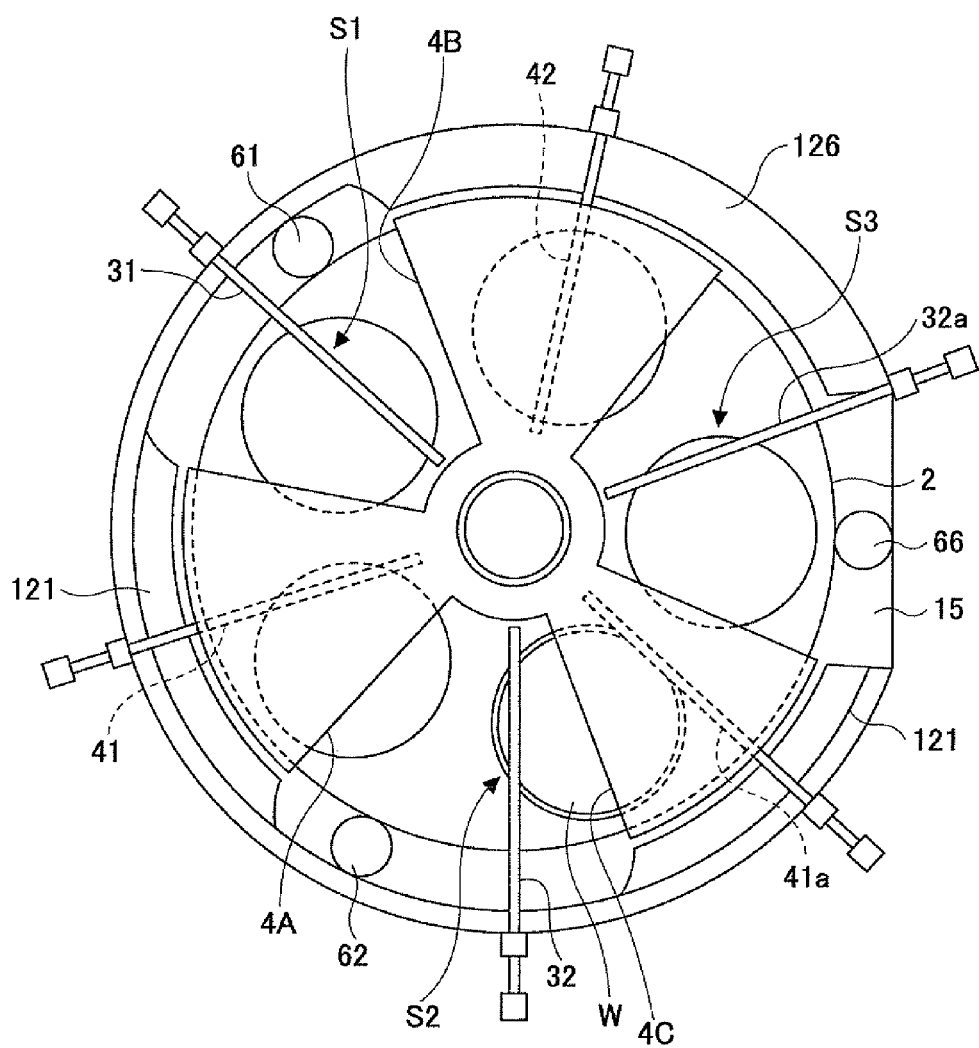
FIG. 38 is a top view of another modification example of the film deposition apparatus of FIG. 21.

While only one replaceable protrusion wall portion 121 (127, 128) is provided in the chamber body 12 in this embodiment, two or more replaceable protrusion wall portions may be provided in other embodiments. For example, when a third ceiling member 4C is provided in order to separate a third process area S3 where a third reaction gas is supplied from a third reaction gas nozzle 32a and the second process area S2, an additional replaceable protrusion wall portion 121 may be provided corresponding to the third ceiling member 4C, as shown in FIG. 38. This additional protrusion wall portion 121 may be replaced with other protrusion wall portions having different sizes/shapes depending on the process conditions and the like. Reference numerals "41a" and "66" indicate a third separation gas nozzle and an additional evacuation port, respectively. Moreover, the protrusion wall portion 126 may also be configured as replaceable.

In this embodiment, replaceable (detachable) members are not limited to the protrusion wall portion 121 (127, 128) and the ceiling members 4 (4A, 4B, 4C), but the reaction gas nozzles 31, 32 and the separation gas nozzles 41, 42 may also be replaceable (detachable), in the same manner as the first and the second embodiments of the present invention. In addition, a flow pattern control plate may be removably arranged to the chamber body 12 in order to evenly spread the reaction gases by controlling the gas flow pattern in the vacuum chamber 1.

Figure 39:
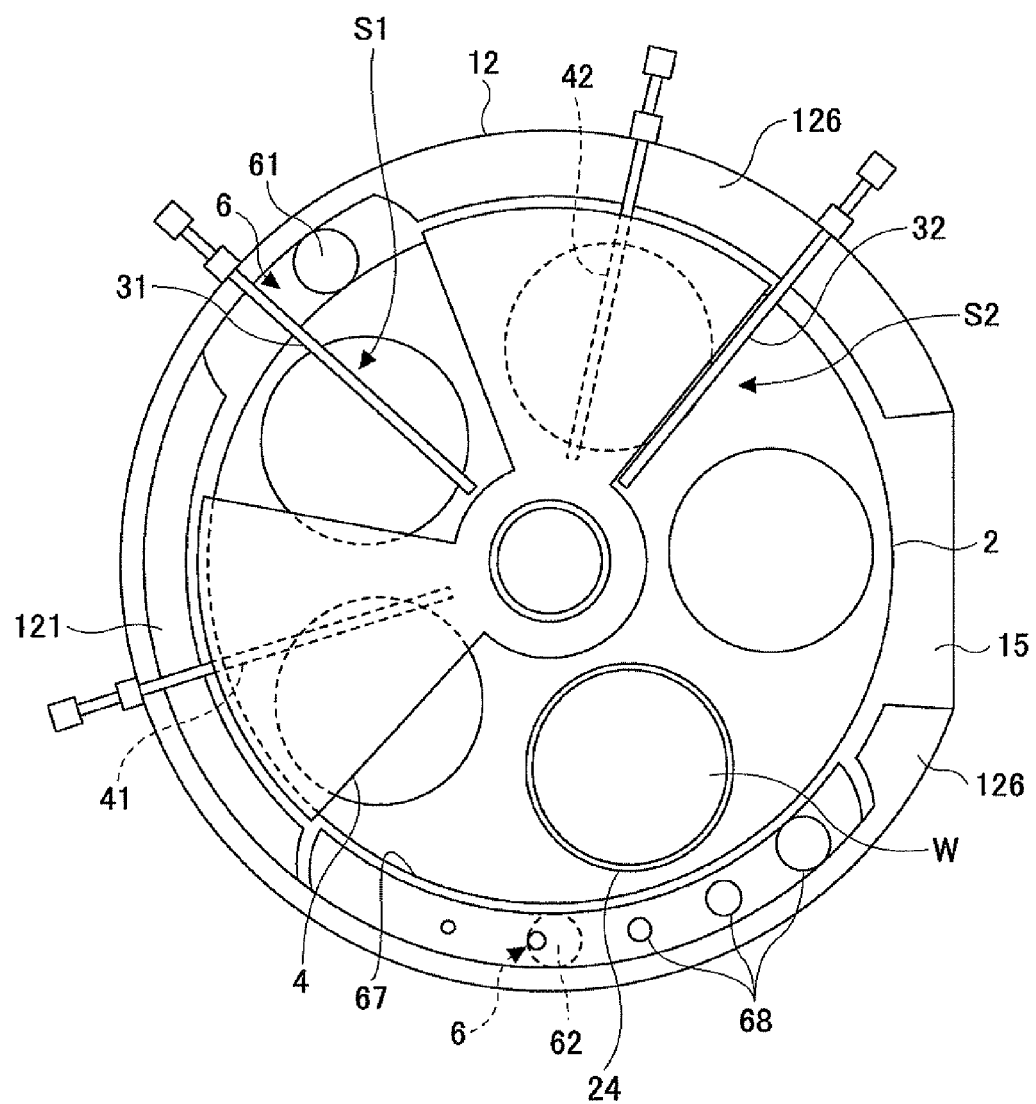
FIG. 39 is a top view of yet another modification example of the film deposition apparatus of FIG. 21.

For example, when the second reaction gas nozzle 32 is arranged at the most upstream position in the second process area S2 relative to the rotation direction of the turntable 2 as shown in FIG. 39, the second reaction gas ejected from the second reaction gas nozzle 32 is likely to flow directly toward the evacuation port 62. In this case, the wafer W may be not sufficiently exposed to the second reaction gas, which may adversely influence thickness uniformity of the film deposited on the wafer W. However, the vacuum chamber 1 shown in FIG. 39 is provided with a baffle plate 67 over the evacuation area 6 in order to make the second reaction gas be distributed relatively uniformly. The baffle plate 67 has plural holes 68. The sizes of the plural holes 68 of the baffle plate 67 become smaller closer to the evacuation port 62 along the rotation direction of the turntable 2. With the baffle plate 67 so configured, a larger part of the second reaction gas flows toward the largest hole 68 rather than directly toward the evacuation port 62, because of greater suction force through the largest hole 68. Therefore, the second reaction gas can spread more uniformly in the second process area S2 than for a case where the baffle plate 67 is not provided, and thus the thickness uniformity can be improved.

Fourth Embodiment

Figure 40:
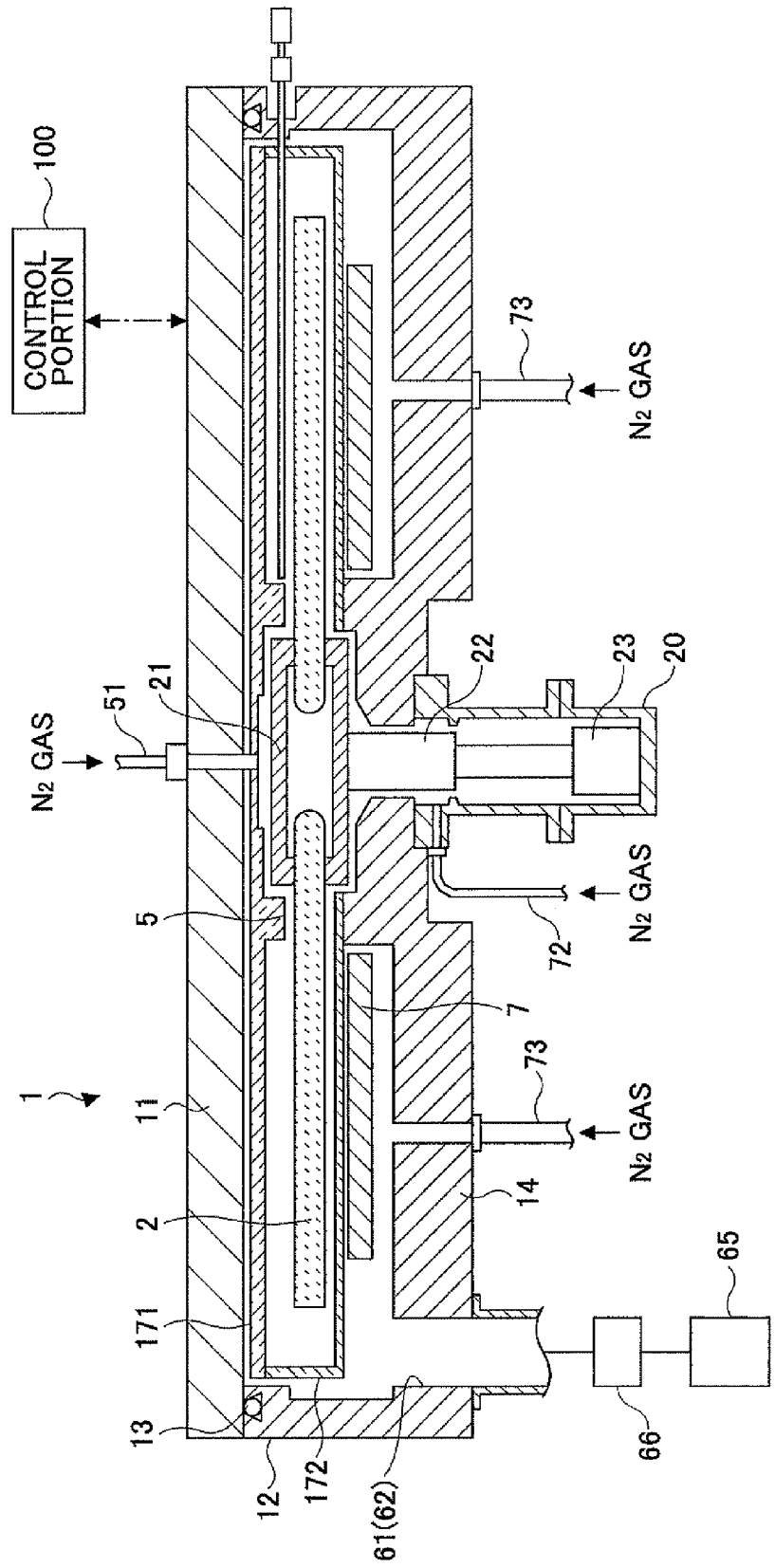
FIG. 40 is a cut-away diagram of a film deposition apparatus according to a fourth embodiment of the present invention.
Figure 41:
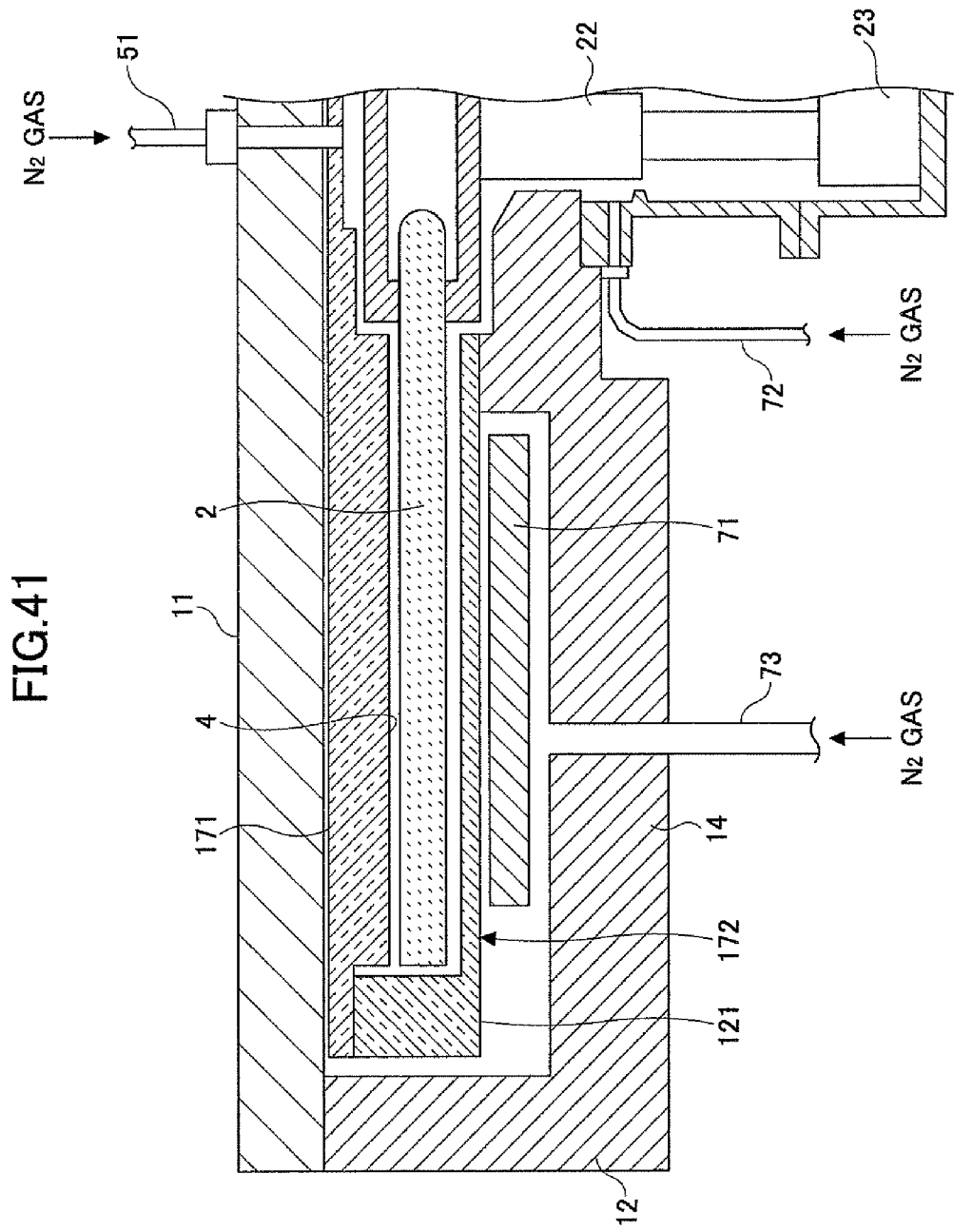
FIG. 41 is a cut-away diagram showing a separation area of the film deposition apparatus according to the fourth embodiment.
Figure 42:
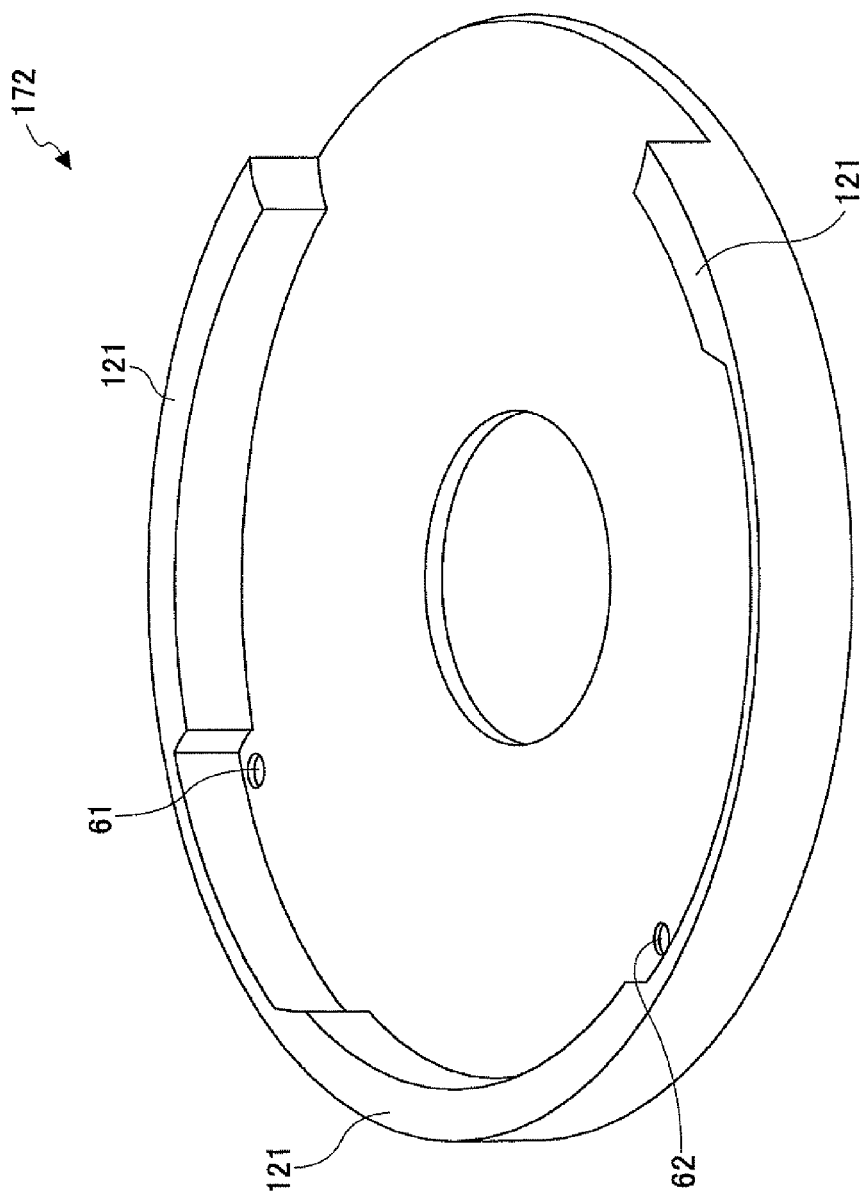
FIG. 42 is a perspective view of a quartz tray provided in the film deposition apparatus according to the fourth embodiment.

Next, referring mainly to FIGS. 40 through 42, a film deposition apparatus according to a fourth embodiment is explained. The film deposition apparatus according to the fourth embodiment is different from the film deposition apparatus according to the third embodiment in that the turntable 2 is surrounded by a quartz member so that a corrosive gas such as a chlorine gas and the like as a cleaning gas for cleaning the inside of the vacuum chamber 1 and as a reaction gas can be used. In FIGS. 40 through 42, the same reference numerals used in FIGS. 21 through 39 are given to the same or corresponding members.

As shown in FIGS. 40 and 41, the quartz member includes a flattened cylindrical tray portion 17 that has an opening opened upward and is arranged below the turntable 2 in order to surround the turntable 21, and a cover portion 171 that closes the opening of the tray portion 171. The cover portion 171 has the protrusion portion 5 surrounding the core portion 21 and the ceiling members 4 for creating the separation areas, so that the process areas and the separation areas are formed above the turntable 2 in order to impede the reaction gases from entering the other process areas, in substantially the same manner as the third embodiment.

On the other hand, the tray portion 172 has a protrusion wall portion 121 that protrudes inward from the inner circumferential surface of the tray portion 172 as shown in FIGS. 41 and 42, so that the reaction gases are impeded from entering the other process areas through a gap between the outer circumferential surface of the turntable 2 (bent portion) and the inner circumferential surface of the tray portion 172, and thus impeded from being mixed with each other.

In the film deposition apparatus according to the fourth embodiment, plural cover portions 171 having the ceiling members 4 with different shapes and positions and the plural tray portions 172 having the protrusion wall portions 121 with different shapes and positions are replaceably prepared in order to change the arc lengths and positions of the ceiling member 4 and the protrusion wall portion 121 in accordance with the processes and the like. In this embodiment, the cover portion 171 and the tray portion 172 made of quartz substantially constitute a vacuum chamber.

Figure 44:
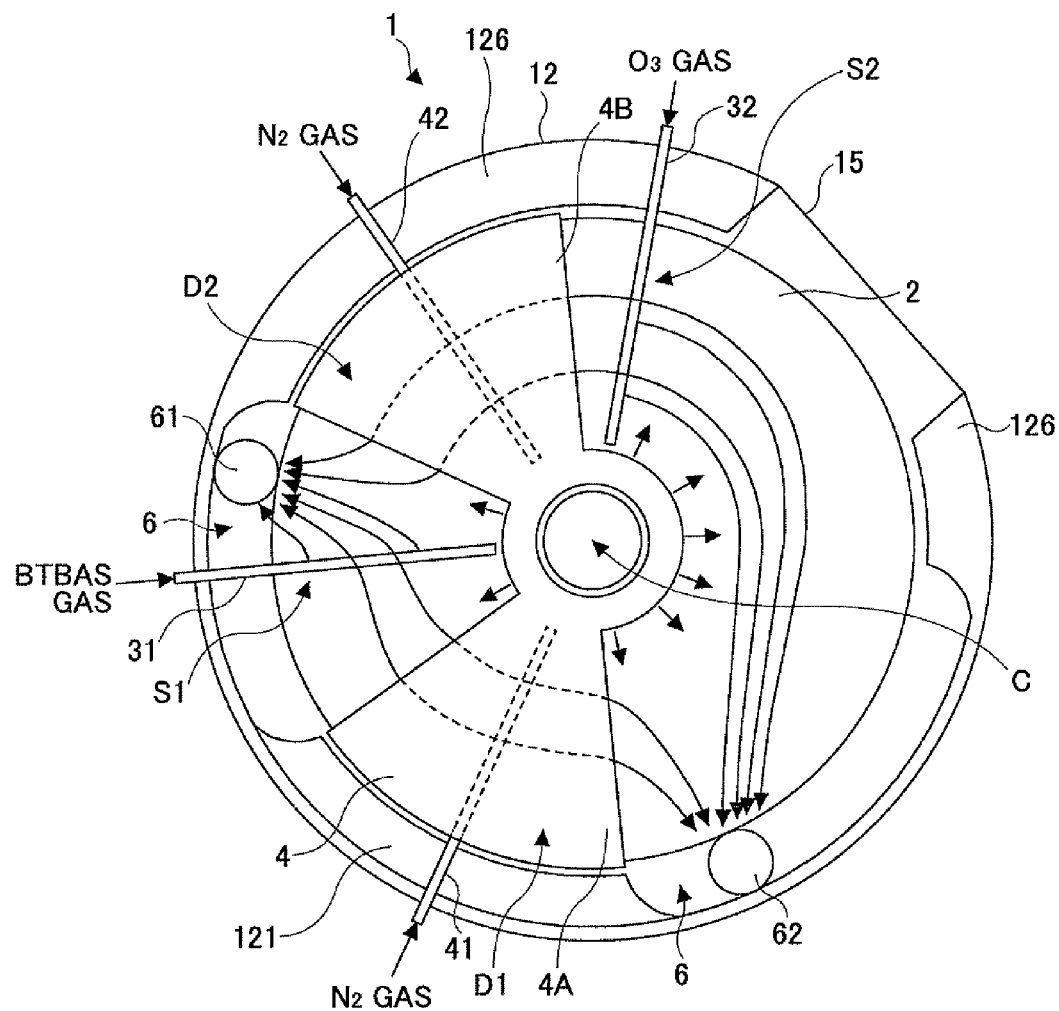
FIG. 44 is a top view of a film deposition apparatus according to another embodiment.

Examples of layouts of the process areas S1, S2 and the separation area D are explained. Referring to FIG. 44, the second reaction gas nozzle 32 is located upstream relative to the rotation direction of the turntable 2 with respect to the transfer opening 15. Even in such a layout, the same effect as explained in the preceding embodiments is demonstrated.

Figure 45:
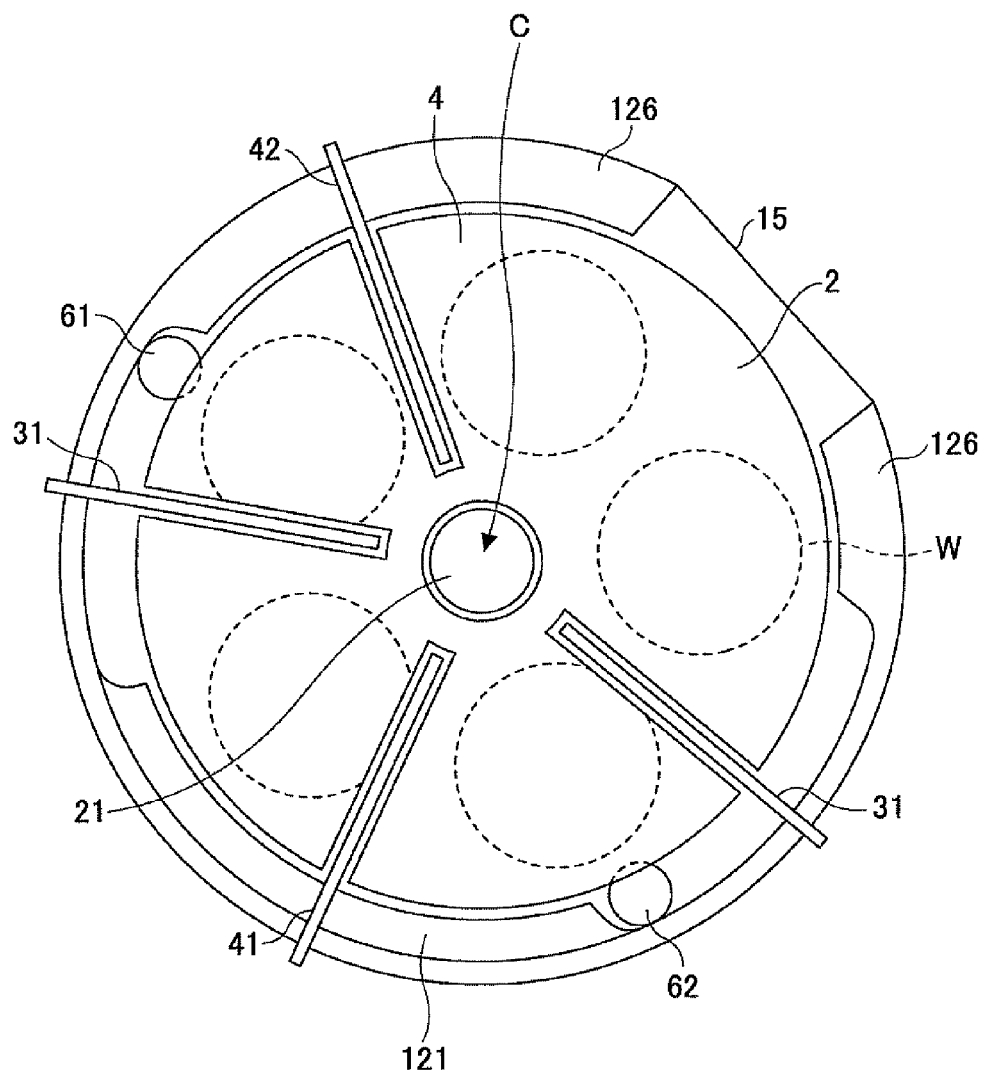
FIG. 45 is a top view of a film deposition apparatus according to another embodiment.

While the low ceiling surfaces (first ceiling surfaces) 44 are provided in order to create the thin space on both sides of the separation gas nozzle 41 (42) in this embodiment, these low ceiling surfaces may be provided on both sides of the reaction gas nozzle 31 (32) so that these ceiling surfaces are extended to reach the first ceiling surfaces 44, as shown in FIG. 45. When compared with FIG. 19, the configuration of FIG. 19 is different from that of FIG. 45 in that three evacuation ports 61, 62, 62 are made and the ceiling member 4 is formed separately from the protrusion portion 5 in FIG. 15. However, these two configurations are the same in that the ceiling member 4 faces substantially the entire upper surface of the turntable 2 except for the groove portions for the gas nozzles 31, 32, 41, 42. Even with the configuration of FIG. 45, the same separation effect can be demonstrated. In this case, the reaction gas ejected from the reaction gas nozzle 31 (32) spreads on both sides of the reaction gas nozzle 31 (32) below the ceiling member 4 (or in the thin space) and the separation gas ejected from the separation gas nozzle 41 (42) spreads on both sides of the separation gas nozzle 41 (42). The reaction gas and the separation gas flow into each other in the thin space and are evacuated through the evacuation port 61 (62).

Although the gas nozzles 31, 32, 41, 42 are introduced into the vacuum chamber 1 from the side wall of the vacuum chamber 1 in the third embodiment, these nozzles 31, 32, 41, 42 may be introduced from the ring-shaped protrusion portion 5. In this case, an L-shaped conduit may be provided in order to be open on the outer circumferential surface of the protrusion portion 5 and on the outer top surface of the ceiling plate 11. With such an L-shaped conduit, the nozzle 31 (32, 41, 42) can be connected to one opening of the L-shaped conduit inside the vacuum chamber 1 and the gas inlet port 31a (32a, 41a, 42a) can be connected to the other opening of the L-shaped conduit outside the vacuum chamber 1.

Figure 26:
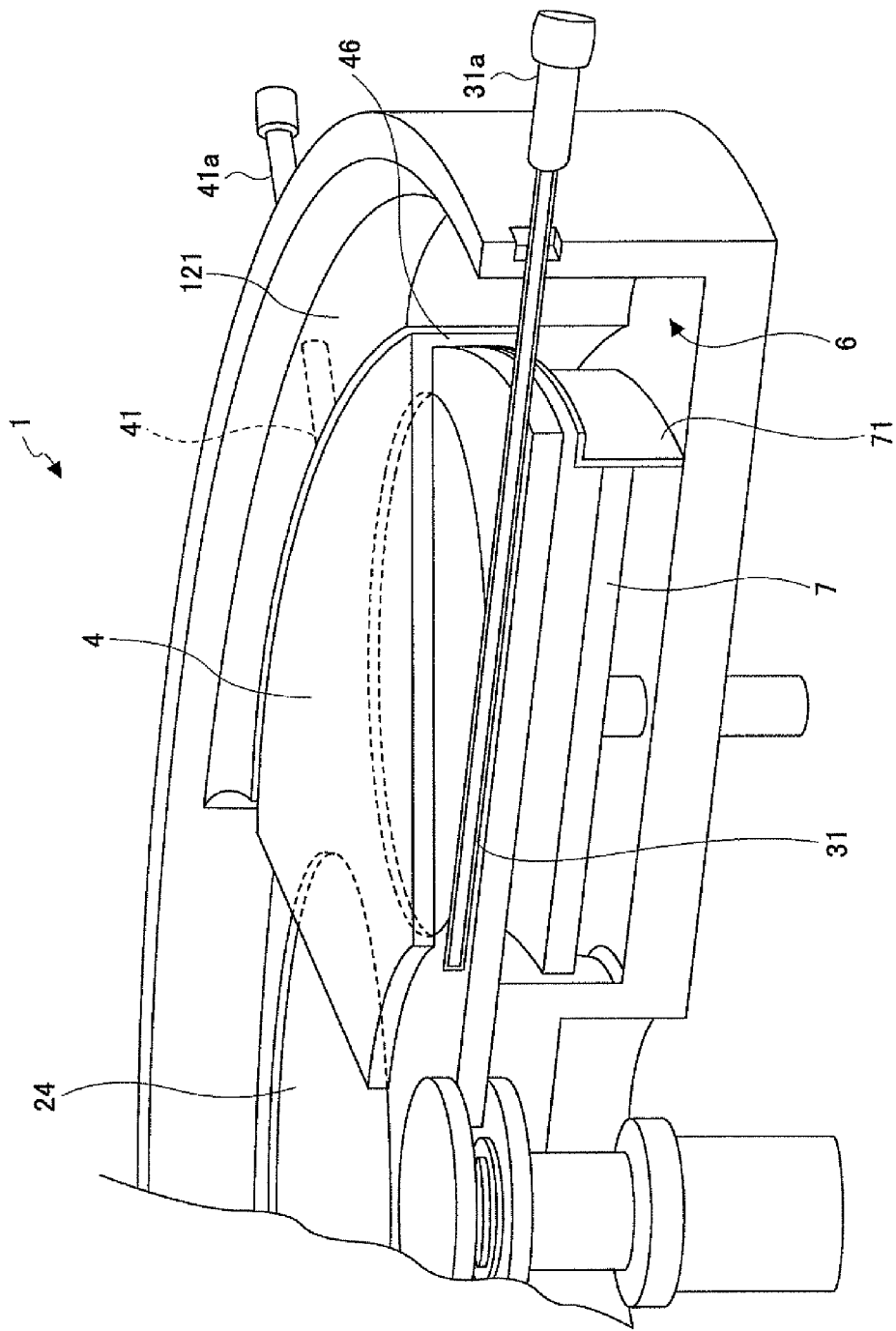
FIG. 26 is a partial perspective view showing the film deposition apparatus of FIG. 1.

In addition, the first through the fourth embodiments may be arbitrarily combined. For example, while the protrusion portion 5 and the ceiling member 4 are integrally formed so that the lower surfaces of the protrusion portion 5 and the ceiling portion 4 form one plane surface in the third and the fourth embodiments as shown in FIG. 26, the ceiling member 4 may be provided separately from the protrusion portion 5 and separately attached to the ceiling plate 11 as explained in the first and the second embodiments.

Figure 43A:
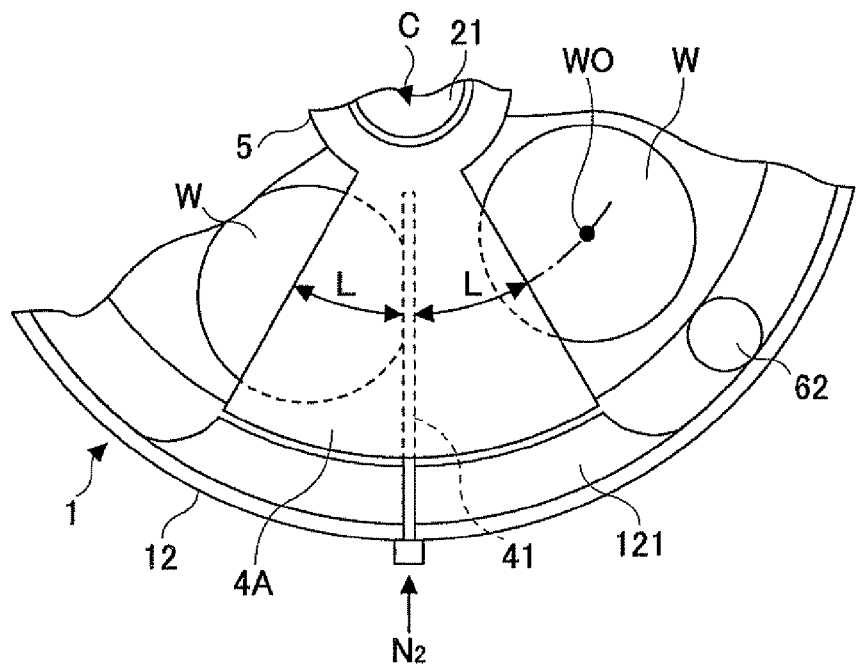
FIG. 43A is an explanatory view for explaining a size of a ceiling member used for the separation area in the film deposition apparatus according to the fourth embodiment.
Figure 43B:
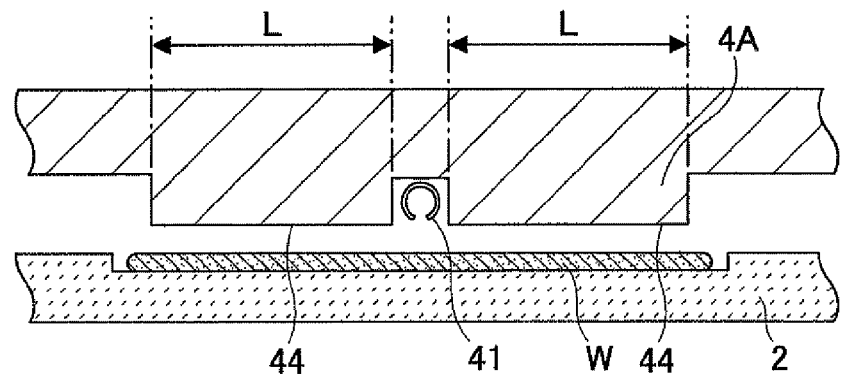
FIG. 43B is another explanatory view for explaining a size of a ceiling member used for the separation area in the film deposition apparatus according to the fourth embodiment.

In addition, the first ceiling surfaces 44 that create the thin space on both sides of the separation gas nozzle 41 (42) preferably have a length L of about 50 mm or more, which is measured along the route a wafer center WO passes through, when the wafer W having a diameter of 300 mm is used as shown in FIGS. 43A and 43B in the third and the fourth embodiments. FIGS. 43A and 43B are different from FIGS. 12A and 12B in that the ceiling member 4 is integrally formed with the protrusion portion 5 in FIGS. 43A and 43B. On the other hand, the length L and the height h of the first ceiling surface 44 may be the same as those explained in reference to FIGS. 12A and 12B.

Figure 46:
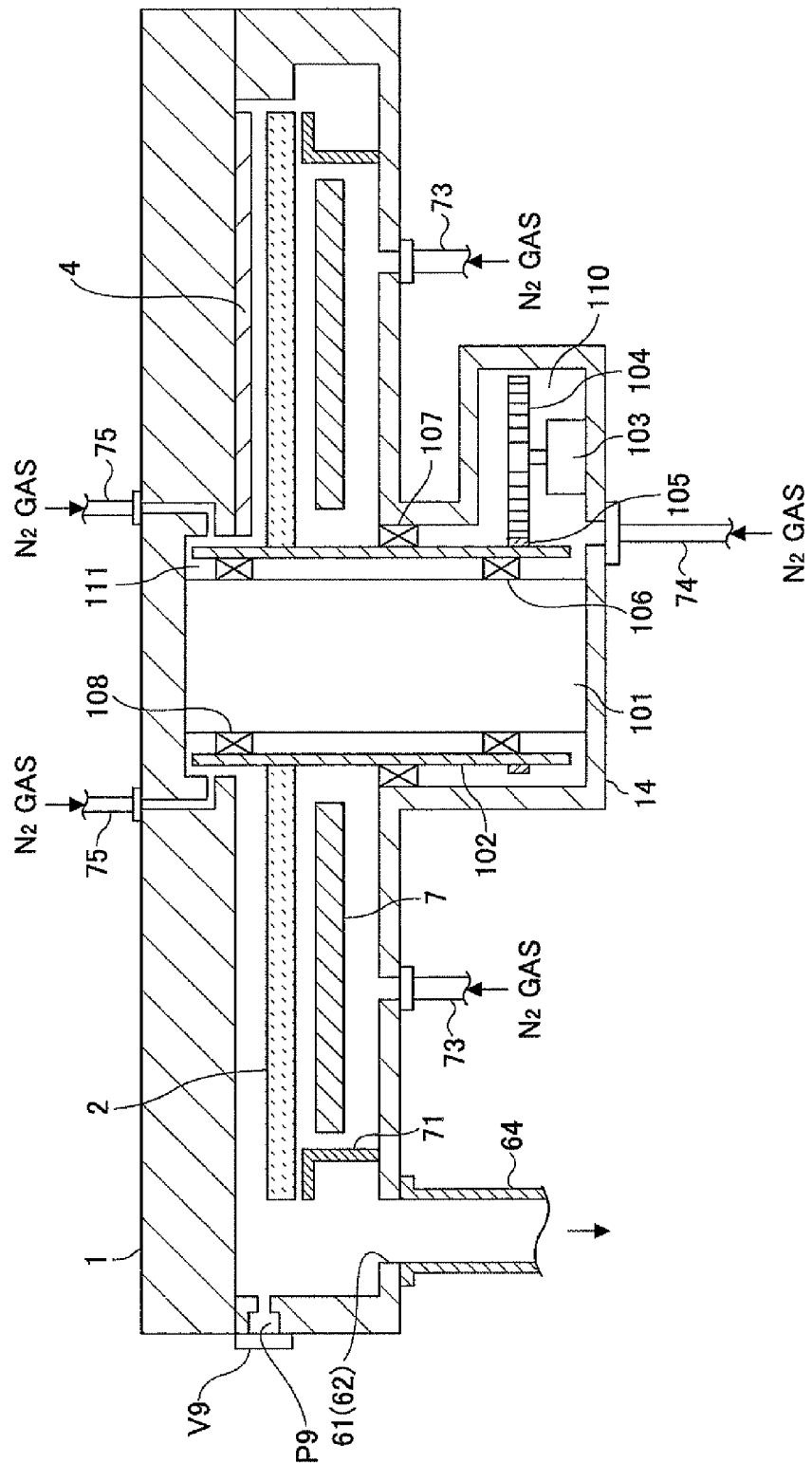
FIG. 46 is a top view of a film deposition apparatus according to another embodiment.

In the third and the fourth embodiments, the rotational shaft 22 for the turntable 2 is located in the center of the vacuum chamber 1 and the space defined by the center portion of the turntable 2 and the ceiling plate 11 is purged with the separation gas. However, the film deposition apparatus according to another embodiment may be configured as shown in FIG. 46. In the film deposition apparatus of FIG. 46, the bottom portion 14 of the chamber body 1 is extended downward at the center and a housing space 110 is formed in the extended area. In addition, an upper inner surface (ceiling surface) of the vacuum chamber 1 is dented upward at the center and a concave portion 111 is formed in the dented area. Moreover, a pillar 91 is provided so that the pillar 91 extends from a bottom surface of the housing space 90 through an upper inner surface of the concave portion 111. This configuration can prevent a gas mixture of the BTBAS gas from the first reaction gas nozzle 31 and the $O_3$ gas from the second reaction gas nozzle 32 from flowing through the center area of the vacuum chamber 1.

A driving mechanism for rotating the turntable 2 is explained in the following. A rotation sleeve 102 is provided so that the rotation sleeve 102 coaxially surrounds the pillar 101. The turntable 2, which has a shape of ring, is attached on the outer circumferential surface of the rotation sleeve 102. In addition, a motor 103 is provided in the housing space 110 and a gear 104 is attached to a driving shaft extending from the motor 103. The gear 104 meshes with a gear 105 formed or attached on an outer circumferential surface of the rotation sleeve 102, and drives the rotation sleeve 102 via the gear 105 when the motor 103 is energized, thereby rotating the turntable 2. Reference numerals "106", "107", and "108" in FIG. 46 indicate bearings.

In addition, the gas purge supplying pipe 74 is connected to the bottom of the housing space 110, and purge gas supplying pipes 75 for supplying purge gas to the space defined by an inner side wall of the concave portion 111 and the upper portion of the rotation sleeve 102 are connected to an upper portion of the vacuum chamber 1. While two purge gas supplying pipes 75 are shown in FIG. 46, three or more purge gas supplying pipes 75 may be provided, in other embodiments, in order to impede the BTBAS gas and the $O_3$ gas from being mixed with each other through the concave portion 111.

In FIG. 46, the space defined by an inner side wall of the concave portion 111 and the upper portion of the rotation sleeve 102 corresponds to the ejection opening that ejects the separation gas toward the top surface of the turntable 2, when seen from the turntable 12. In addition, the center area C located in the center of the vacuum chamber 1 is defined by the ejection opening, the rotation sleeve 102 and the pillar 101.

Even when the driving mechanism for rotating the turntable 2 and the gas purging in the center area C are modified in such a manner, the plural mounting portions (mounting holes P1 through P12) may be formed in the circumferential wall of the vacuum chamber 1 (chamber body 12), the reaction gas nozzles 31, 32 and the separation gas nozzles 41, 42 are attached to the vacuum chamber 1 via the selected mounting holes, and the ceiling member 4 is attached on the lower surface of the ceiling plate 11 accordingly. In addition, even when configured in the above manner, the protrusion wall portion 121 is replaceably attached along the inner circumferential surface of the chamber body 12.

Figure 20A:
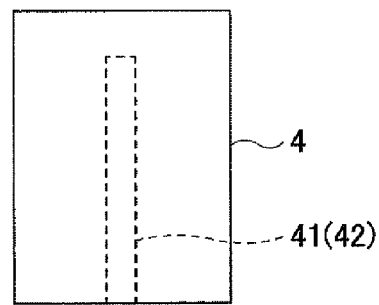
FIGS. 20A through 20D are top views showing modified ceiling member.
Figure 20B:
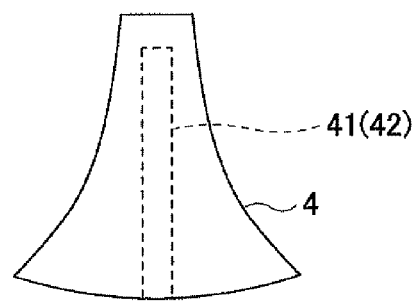
Figure 20C:
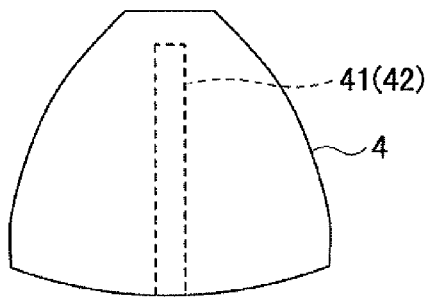
Figure 20D:
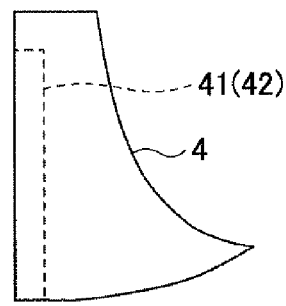

In any one of the embodiments above, the ceiling member 4 may have a rectangular top view shape (FIG. 20A), a horn-like top view shape (FIG. 20B) that expands toward the circumferential wall of the chamber body 12, a trapezoidal top view shape having convexly curved sides (FIG. 20C) where the lower base (longer straight line) faces the inner circumferential surface of the chamber body 12, or a top view shape where an upstream portion of the ceiling member 4 relative to the rotation direction of the turntable 2 (FIG. 1) may be concavely curved and a downstream portion of the ceiling member 4 relative to the rotation direction of the turntable 2 (FIG. 1) may be flat (FIG. 20D).

The reaction gases that may be used in the film deposition apparatus according to an embodiment of the present invention are dichlorosilane (DCS), hexachlorodisilane (HCD), Trimethyl Aluminum (TMA), tris(dimethyl amino) silane (3DMAS), tetrakis-ethyl-methyl-amino-zirconium (TEMAZr), tetrakis-ethyl-methyl-amino-hafnium (TEMHf), bis (tetra methyl heptandionate) strontium $(Sr(THD)_2)$, (methyl-pentadionate) (bis-tetra-methyl-heptandionate) titanium (Ti(MPD)(THD)), monoamino-silane, or the like, in addition to BTBAS and $O_3$.

Figure 47:
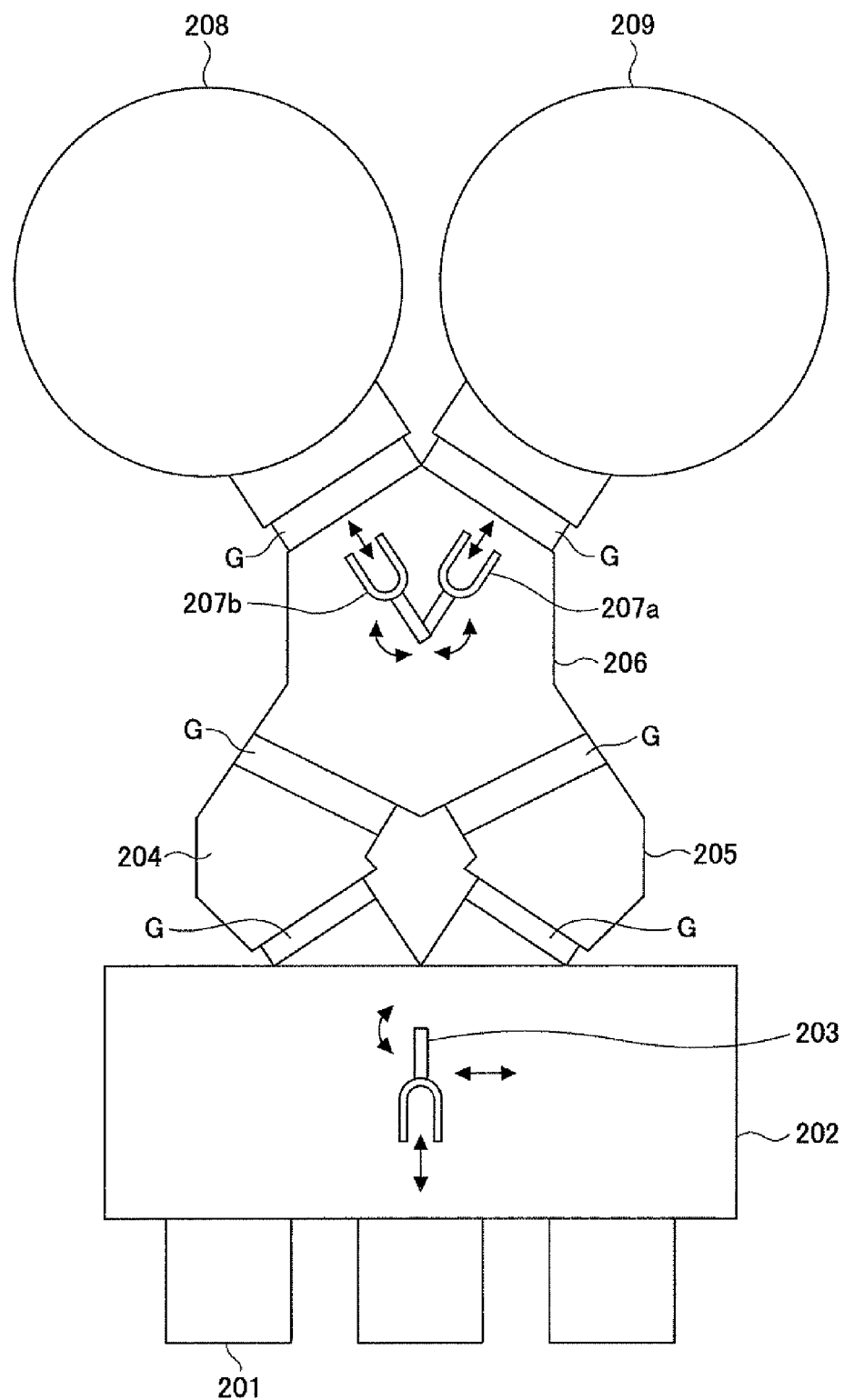
FIG. 47 is a schematic plan view of a substrate process system employing a film deposition apparatus according to embodiments of the present invention.

A wafer process apparatus using the film deposition apparatus according to embodiments of the present invention is illustrated in FIG. 47. In this drawing, reference numeral "201" indicates a closed-type wafer transfer cassette called a Front Opening Unified Pod (FOUP) that houses, for example, 25 wafers; reference numeral "202" indicates an atmospheric transfer chamber where a transfer arm 203 is arranged; reference numerals "204" and "205" indicate load-lock chambers (preparation chambers) whose inner pressure is changeable between vacuum and an atmospheric pressure; reference numeral "206" indicates a vacuum transfer chamber where two transfer arms 207 are provided; reference numerals "208" and "209" indicate film deposition apparatuses according to an embodiment of the present invention.

The wafer transfer cassette 201 is brought into a transfer port including a stage (not shown); a cover of the wafer transfer cassette 201 is opened by an opening/closing mechanism (not shown); and the wafer is taken out from the wafer transfer cassette 201 by the transfer arm 203. Next, the wafer is transferred to the load-lock vacuum chamber 204 (205). After the load-lock vacuum chamber 204 (205) is evacuated to a predetermined reduced pressure, the wafer is transferred further to one of the film deposition apparatuses 208, 209 through the vacuum transfer vacuum chamber 206 by the transfer arm 207. In the film deposition apparatus 208 (209), a film is deposited on the wafer in such a manner as described above. Because the wafer process apparatus has two film deposition apparatuses 208, 209 that can house five wafers at a time, the ALD (or MLD) mode deposition can be performed at high throughput.

While the present invention has been described in reference to the foregoing embodiment, the present invention is not limited to the disclosed embodiment, but may be modified or altered within the scope of the accompanying claims.

What is claimed is:

1. A film deposition apparatus for depositing a film on a substrate by carrying out plural cycles of supplying in turn at least two kinds of reaction gases that react with each other to the substrate to produce a layer of a reaction product in a chamber, the film deposition apparatus comprising:

a turntable provided rotatable on a vertical axis in the chamber and including plural substrate receiving areas, formed on a front surface, in which the plural substrates are placed along a rotation direction of the turntable;

a first reaction gas supplying portion configured to supply a first reaction gas to the front surface of the turntable to form a first process area;

a second reaction gas supplying portion configured to supply a second reaction gas to the front surface of the turntable to form a second process area, the first reaction gas supplying portion and the second reaction gas supplying portion being arranged away from each other in the rotation direction of the turntable in the chamber;

a ceiling member removably provided between the turntable and a ceiling plate of the chamber and between the first process area and the second process area downstream relative to the rotation direction of the turntable with respect to the first reaction gas supplying portion in order to create over the turntable a thin space for impeding the first reaction gas and the second reaction gas from entering the thin space to form a first separation area between the first process area and the second process area such that the distance between the first reaction gas supplying portion and the ceiling member is controlled by the size of the ceiling member in accordance with a process to be carried out in the film deposition apparatus;

a first separation gas supplying portion configured to supply a first separation gas to the front surface of the turntable in the first separation area for separating atmospheres of the first process area and the second process area;

a center area located in substantially a center portion in the chamber and including a gas ejection opening for ejecting a second separation gas to the front surface of the turntable, thereby separating the atmospheres of the first process area and the second process area; and an evacuation port that evacuates the first reaction gas and the second reaction gas along with the first separation gas that spreads on both sides of the first separation area and the second separation gas ejected from the center area, wherein the ceiling member is provided with a groove portion that extends in a radial direction, and the first separation gas supplying portion is housed in the groove portion.

2. The film deposition apparatus of claim 1, wherein the ceiling member is removably attached on the lower surface of the ceiling plate by a screw and a bore which is formed in a lower surface of the ceiling plate of the chamber.

3. The film deposition apparatus of claim 2, wherein a plurality of the bores are formed along a circumferential direction in the lower surface of the ceiling plate, thereby selecting where the ceiling member is attached.

4. The film deposition apparatus of claim 1, further comprising:

a cover member removably provided in order to cover and oppose the turntable between the ceiling member and the turntable in the chamber, the cover member being selectable in accordance with a process to be carried out in the film deposition apparatus from plural cover members having different shapes, wherein the ceiling member is attached on a lower surface of the cover member.

5. The film deposition apparatus of claim 4, further comprising a partition member provided in order to surround a bottom surface and a side surface of the turntable, the partition member being open at the top, wherein the cover member is configured to cover the partition member.

6. The film deposition apparatus of claim 5, wherein the partition member is made of quartz.

7. The film deposition apparatus of claim 4, wherein the cover member is made of quartz.

8. The film deposition apparatus of claim 1, wherein the center area is defined by a rotation center portion of the turntable and a lower inner surface of the chamber and purged with the second purge gas.

9. The film deposition apparatus of claim 1, wherein the center area includes a pillar provided between an inner lower surface and a bottom surface of the chamber in substantially a center portion of the chamber, and a rotation sleeve surrounding the pillar and rotatable on a vertical axis, wherein the rotation sleeve serves as a rotational shaft for the turntable.

10. The film deposition apparatus of claim 1, wherein a width of the ceiling member along the rotation direction of the turntable becomes wider toward a circumference edge of the ceiling member.

11. The film deposition apparatus of claim 1, further comprising:

a second ceiling member removably provided between the turntable and a ceiling plate of the chamber and between the first process area and the second process area upstream relative to the rotation direction of the turntable with respect to the first reaction gas supplying portion in order to create over the turntable a thin space for impeding the first reaction gas and the second reaction gas from entering the thin space to form a second separation area between the first process area and the second process area so that the first process area is defined by the ceiling member and the second ceiling member between the ceiling member and the second ceiling member.

12. The film deposition apparatus of claim 1, wherein the ceiling member has a sector shape such that the distance between the first reaction gas supplying portion and the ceiling member is controlled by the size of the ceiling member along the rotation direction of the turntable in accordance with a process to be carried out in the film deposition apparatus.

13. A substrate process apparatus comprising:

a vacuum transfer chamber inside of which a substrate transfer member is located;

the film deposition apparatus of claim 1; and a preparatory vacuum chamber whose inner pressure is changeable between a reduced pressure and an atmospheric pressure.

14. A film deposition apparatus for depositing a film on a substrate by carrying out plural cycles of supplying in turn at least two kinds of reaction gases that react with each other to the substrate to produce a layer of a reaction product in a chamber, the film deposition apparatus comprising:

a turntable provided rotatable on a vertical axis in the chamber and including plural substrate receiving areas, formed on a front surface, in which the plural substrates are placed along a rotation direction of the turntable;

a first reaction gas supplying portion detachably provided to the chamber and configured to supply a first reaction gas to the front surface of the turntable to form a first process area;

a second reaction gas supplying portion detachably provided to the chamber and configured to supply a second reaction gas to the front surface of the turntable to form a second process area, the first reaction gas supplying portion and the second reaction gas supplying portion being arranged away from each other in the rotation direction of the turntable in the chamber;

a ceiling member provided between the turntable and a ceiling plate of the chamber and between the first process area and the second process area in order to create over the turntable a thin space for impeding the first reaction gas and the second reaction gas from entering the thin space to form a first separation area between the first process area and the second process area;
a separation gas supplying portion configured to supply a first separation gas to the front surface of the turntable in the first separation area for separating atmospheres of the first process area and the second process area;
plural reaction gas nozzle mounting portions provided along a circumferential direction in the first process area in the chamber to each of which the first reaction gas supplying portion is capable of being mounted,
the first reaction gas supplying portion being attached to the chamber via a selected one of the plural reaction gas nozzle mounting portions upstream relative to the rotation direction of the turntable with respect to the ceiling member such that the distance between the first reaction gas supplying portion and the ceiling member is controlled by the position of the selected one of the plural reaction gas nozzle mounting portions in accordance with a process to be carried out in the film deposition apparatus;
a center area located in substantially a center portion in the chamber including a gas ejection opening for ejecting a second separation gas to the front surface of the turntable, thereby separating the atmospheres of the first process area and the second process area; and
an evacuation port that evacuates the first reaction gas and the second reaction gas along with the first separation gas that spreads on both sides of the first separation area and the second separation gas ejected from the center area.

15. The film deposition apparatus of claim 14, wherein the reaction gas nozzle mounting portions are provided in one of an inner area and an outer area along a radial direction of the chamber in relation to the area through which the substrates pass.

16. The film deposition apparatus of claim 14, wherein the reaction gas nozzle mounting portions are mounting holes formed in a circumferential wall of the chamber at predetermined intervals along the circumferential direction of the chamber.

17. The film deposition apparatus of claim 14, wherein the ceiling member is selected in accordance with a process to be carried out in the film deposition apparatus from plural of the ceiling members having different shapes, and the selected ceiling member is removably provided to the chamber.

18. The film deposition apparatus of claim 14, wherein the separation gas supplying portion has a separation gas supplying nozzle removably provided in the chamber,
wherein the film deposition apparatus further comprises:
plural separation gas nozzle mounting portions formed along the circumferential direction of the turntable in order to allow the separation gas to be mounted therein; and
a separation gas housing portion formed in the ceiling member, and
wherein the separation gas nozzle is attached to the chamber via the separation gas mounting portions selected in accordance with a process to be carried out in the film deposition apparatus, and the ceiling member is removably provided in the chamber so that the separation gas nozzle is housed in the separation gas housing portion of the ceiling member.

19. The film deposition apparatus of claim 18, wherein the separation gas nozzle mounting portions are mounting holes formed in a circumferential wall of the chamber at predetermined intervals along the circumferential direction of the chamber.

20. The film deposition apparatus of claim 19, wherein the mounting holes for mounting the separation gas nozzle are capable of being used to mount the first reaction gas supplying portion or the second reaction gas supplying portion.

21. The film deposition apparatus of claim 14, wherein plural evacuation ports are provided in the chamber, and
wherein the evacuation port is selected from the plural evacuation ports and the first reaction gas supplying portion is attached to the chamber via the selected reaction gas nozzle mounting portion so that the evacuation port is located downstream relative to the rotation direction of the turntable with respect to the first reaction gas supplying portion in the corresponding one of the first and the second process areas.

22. The film deposition apparatus of claim 14, further comprising:
a second ceiling member provided between the turntable and a ceiling plate of the chamber and between the first process area and the second process area in order to create over the turntable a thin space for impeding the first reaction gas and the second reaction gas from entering the thin space to form a first separation area between the first process area and the second process area upstream relative to the rotation direction of the turntable with respect to the first reaction gas supplying portion in order to create over the turntable a thin space for impeding the first reaction gas and the second reaction gas from entering the thin space to form a second separation area between the first process area and the second process area so that the first process area is defined by the ceiling member and the second ceiling member between the ceiling member and the second ceiling member.

23. The film deposition apparatus of claim 14,
wherein the ceiling member is provided with a groove portion that extends in a radial direction, and the separation gas supplying portion is housed in the groove portion.

24. The film deposition apparatus of claim 14,
wherein no first reaction gas supplying portion is mounted on the reaction gas nozzle portions other than the selected one.

25. A substrate process apparatus comprising:
a vacuum transfer chamber inside of which a substrate transfer member is located;
the film deposition apparatus of claim 14; and
a preparatory vacuum chamber whose inner pressure is changeable between a reduced pressure and an atmospheric pressure.

* * * * *